US012727330B2

(12) United States Patent
Song et al.

(10) Patent No.: US 12,727,330 B2
(45) Date of Patent: Sep. 1, 2026

(54) DISPLAY DEVICE AND METHOD OF MANUFACTURING THE SAME

(71) Applicant: Samsung Display Co., Ltd., Yongin-si (KR)

(72) Inventors: Heerim Song, Yongin-si (KR); Mukyung Jeon, Yongin-si (KR); Heejean Park, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 666 days.

(21) Appl. No.: 18/170,511

(22) Filed: Feb. 16, 2023

(65) Prior Publication Data

US 2023/0345767 A1 Oct. 26, 2023

(30) Foreign Application Priority Data

Apr. 25, 2022 (KR) ........................ 10-2022-0050631

(51) Int. Cl.

*H10K 59/122* (2023.01)
*H10K 39/34* (2023.01)
*H10K 59/12* (2023.01)
*H10K 59/35* (2023.01)
*H10K 59/00* (2023.01)

(52) U.S. Cl.

CPC ........... *H10K 59/122* (2023.02); *H10K 39/34* (2023.02); *H10K 59/1201* (2023.02); *H10K 59/35* (2023.02); *H10K 59/771* (2023.02)

(58) Field of Classification Search

CPC .. H10K 59/122; H10K 39/34; H10K 59/1201; H10K 59/35; H10K 59/771; H10K 59/38; H10K 59/40; H10K 59/65; H10K 59/80521; H10K 59/12; H10K 50/822; H10K 59/131; H10K 59/60; H10K 71/00; G06V 10/141; G06V 40/13; G06V 40/1359

See application file for complete search history.

(56) References Cited

U.S. PATENT DOCUMENTS 8,883,579 B2 11/2014 Choi et al.
10,026,926 B2 7/2018 Lee et al.
(Continued)

FOREIGN PATENT DOCUMENTS

JP 2020-27875 A 2/2020
JP 2021-012366 A 2/2021
(Continued)

*Primary Examiner* — Kevin Quarterman
(74) *Attorney, Agent, or Firm* — Womble Bond Dickinson (US) LLP

(57) ABSTRACT

A display device includes: a base layer; a circuit layer on the base layer; and an element layer on the circuit layer and comprising a plurality of light emitting elements and a plurality of light receiving elements, the element layer including: a pixel definition layer having a light emitting opening defined therethrough to correspond to the light emitting elements and a light receiving opening defined therethrough to correspond to the light receiving elements; a disconnected spacer layer adjacent to the light receiving opening on the pixel definition layer; and a common layer commonly in the light emitting elements and the light receiving elements and partially disconnected around the light receiving elements due to the disconnected spacer layer.

24 Claims, 38 Drawing Sheets

(56) References Cited

U.S. PATENT DOCUMENTS

| | | | | |
|---|---|---|---|---|
| 10,748,977 | B2 | 8/2020 | Sim et al. | |
| 11,394,014 | B2 | 7/2022 | Kubota et al. | |
| 2020/0144540 | A1 | 5/2020 | Lee et al. | |
| 2021/0005669 | A1 | 1/2021 | Kamada et al. | |
| 2021/0202670 | A1 | 7/2021 | Koh et al. | |
| 2022/0223667 | A1* | 7/2022 | Choi | H10K 59/122 |
| 2022/0346248 | A1* | 10/2022 | Won | H05K 5/0217 |
| 2023/0209902 | A1* | 6/2023 | Jin | H10K 59/122 257/40 |

FOREIGN PATENT DOCUMENTS

| | | | |
|---|---|---|---|
| JP | 2021-039342 | | 3/2021 |
| KR | 10-0714012 | B1 | 5/2007 |
| KR | 10-2012-0061009 | A | 6/2012 |
| KR | 10-2016-0072010 | A | 6/2016 |
| KR | 10-2017-0003768 | A | 1/2017 |
| KR | 10-2017-0056770 | A | 5/2017 |
| KR | 10-2020-0051150 | A | 5/2020 |
| KR | 10-2020-0078091 | A | 7/2020 |
| KR | 10-2021-0086306 | A | 7/2021 |

* cited by examiner

PXR
R_PD
FX
O_SD
FSd
RLd
Vrst
VL5
ST1
ST2
ST3
SLVD
SN1
SN2
RCL
RST
SWLj
SWj
LSU
OPD1
OPD2
VL2
EMLj
EMj
VL1
ELVDD
ET1
T1
ET2
Id
ED_R
ELVSS
Ied
Ibp
T3
T5
VL4
VINT2
Cst
N1
T4
VINT1
VL3
T2
DLi
Di
SWLj
SWj
SCLj
SCj
SILj
SIj
SBLj
SBj NSA
SA
NSA
NPA
NPXA
PXA
NPXA
O_AE1
PDL
S_SPC
O_OP1
R_AE
R_OP1
CNE21
CNE11
CH3
CH6
CH4
CNE20
CNE10
CH5
CH2
CH1
UE
STD1
STG1
STA1
STS1
ST1
CSL
D1
G1
A1
S1
T1
D3
G3
A3
S3
T3
PDL
70
60
50
40
30
20
10
BFL
BRL
BL
DP_ED
DP_CL
DR3
DR2

WM
OCL
CFL
PL
ICL2
IL
ISL
TFE
CMP1
PDL
DP_ED
DP_CL
BL
DP
I_CL
CMP1
CMP2
CML
ICL1
Lg1
Lg2
Lr1
Lr2
US_F
B_EL
B_AE
B_OP1
G1_EL
G1_AE
G1_OP1
S_SPC
CMP2
O_RL1
O_AE1
O_OP4
S_SPC
R_EL
R_AE
R_OP1

P_PL
S_SPC
PDL
DP_CL
BL
P_MS
O_OP1
S_SPC
O_MP
P_MP
B_MP
R_OP1
M_SPC

DISPLAY DEVICE AND METHOD OF MANUFACTURING THE SAME

CROSS-REFERENCE TO RELATED APPLICATION

The present application claims priority to and the benefit of Korean Patent Application No. 10-2022-0050631, filed on Apr. 25, 2022, the entire content of which is incorporated herein by reference.

BACKGROUND

1. Field

Aspects of some embodiments of the present disclosure relate to a display device and a method of manufacturing the same.

2. Description of the Related Art

Display devices provide a variety of functions to communicate organically with a user, such as displaying images to provide information to the user or sensing a user input. In recent years, the display devices include various functions to sense biometric information of the user.

As the biometric information recognition methods, a capacitance method that senses a variation in capacitance between electrodes, an optical method that senses an incident light using an optical sensor, an ultrasonic method that senses a vibration using a piezoelectric material, or the like may be used.

The above information disclosed in this Background section is only for enhancement of understanding of the background and therefore the information discussed in this Background section does not necessarily constitute prior art.

SUMMARY

Aspects of some embodiments of the present disclosure relate to a display device and a method of manufacturing the same. For example, some embodiments of the present disclosure relate to a display device capable of recognizing biometric information and a method of manufacturing the display device.

Aspects of some embodiments of the present disclosure include a display device capable of improving sensing performance of a sensor used to recognize biometric information.

Aspects of some embodiments of the inventive concept include a display device including a base layer, a circuit layer on the base layer, and an element layer on the circuit layer and including a plurality of light emitting elements and a plurality of light receiving elements.

According to some embodiments, the element layer includes a pixel definition layer provided with a light emitting opening defined therethrough to correspond to the light emitting elements and a light receiving opening defined therethrough to correspond to the light receiving elements, a disconnected spacer layer adjacent to the light receiving opening on the pixel definition layer, and a common layer commonly in the light emitting elements and the light receiving elements and partially disconnected around the light receiving elements due to the disconnected spacer layer.

Aspects of some embodiments of the inventive concept include a method of manufacturing a display device.

According to some embodiments, the method includes forming a circuit layer on a base layer and forming an element layer including a plurality of light emitting elements and a plurality of light receiving elements on the circuit layer.

According to some embodiments, the forming of the element layer includes forming a pixel definition layer including a light emitting opening defined to correspond to the light emitting elements and a light receiving opening defined to correspond to the light receiving elements and a disconnected spacer layer adjacent to the light receiving opening on the pixel definition layer and forming a common layer commonly on the light emitting elements and the light receiving elements and partially disconnected by the disconnected spacer layer around the light receiving elements.

According to the above, as the disconnected spacer layer is formed adjacent to the light receiving element on the pixel definition layer, the common layer is partially disconnected around the light receiving element.

Accordingly, even though the light receiving element is electrically connected to the light emitting elements through the common layer, the leakage of current charged to the light receiving element via the common layer is prevented or reduced.

BRIEF DESCRIPTION OF THE DRAWINGS

The above and other characteristics of some embodiments of the present disclosure will become readily apparent by reference to the following detailed description when considered in conjunction with the accompanying drawings wherein:

FIG. 7D is a cross-sectional view of the common layer, the light emitting layer, and the photoelectric conversion layer shown in FIG. 6D;

FIG. 8A is a cross-sectional view of a display panel according to some embodiments of the present disclosure;

FIG. 8B is a cross-sectional view of a pixel definition layer, a main spacer layer, and a disconnected spacer layer according to some embodiments of the present disclosure;

DETAILED DESCRIPTION

Figure 1:
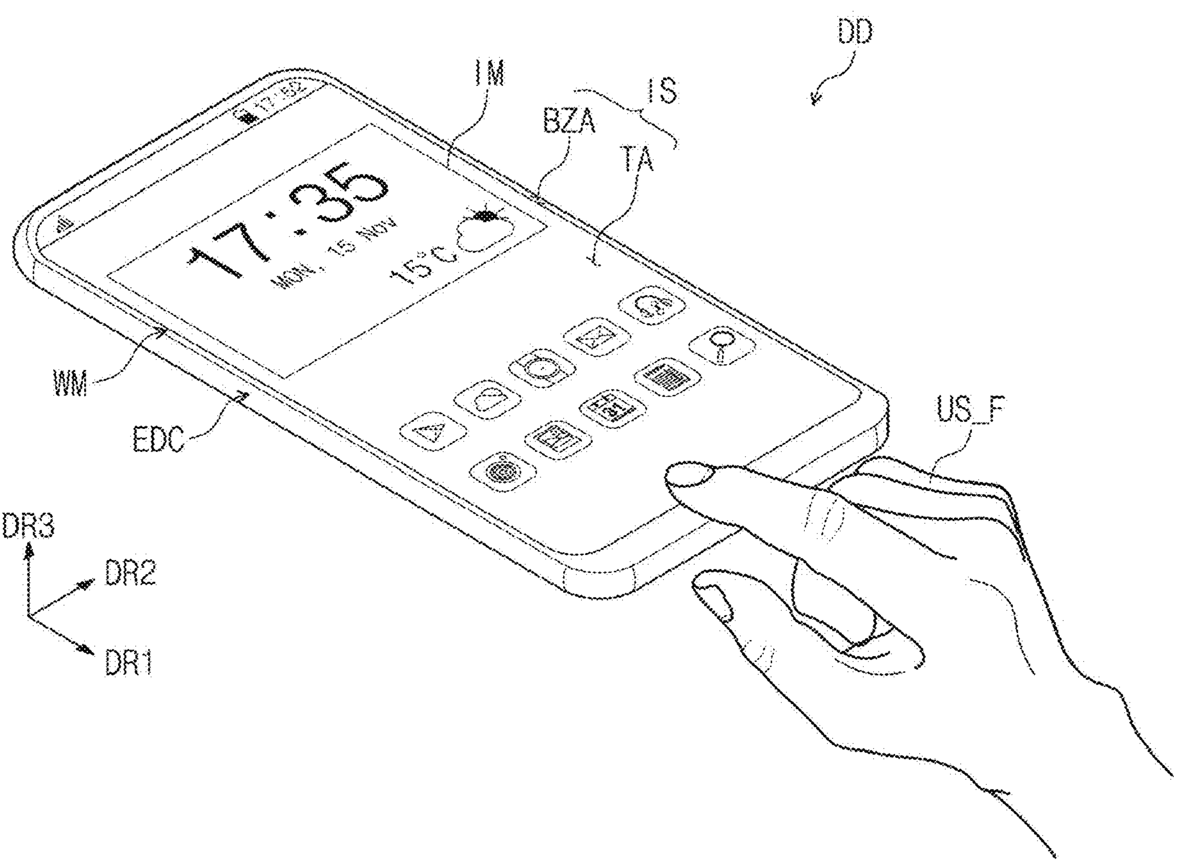
FIG. 1 is a perspective view of a display device according to some embodiments of the present disclosure.

In the present disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, aspects of some embodiments of the present disclosure will be described with reference to accompanying drawings.

Figure 2:
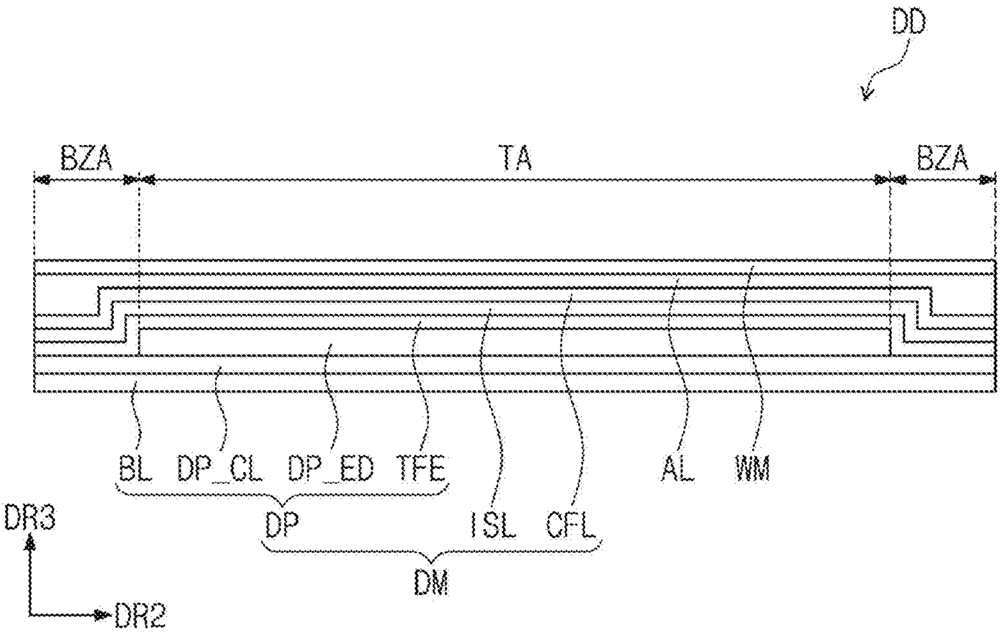
FIG. 2 is a cross-sectional view of a display device according to some embodiments of the present disclosure.

FIG. 1 is a perspective view of a display device DD according to some embodiments of the present disclosure, and FIG. 2 is a cross-sectional view of the display device DD according to some embodiments of the present disclosure.

Referring to FIGS. 1 and 2, the display device DD may have a rectangular shape with long sides parallel to a first direction DR1 and short sides parallel to a second direction DR2 crossing the first direction DR1. However, the shape of the display device DD should not be limited to the rectangular shape, and the display device DD may have a variety of shapes, such as a circular shape, a polygonal shape, or the like.

The display device DD may be activated in response to electrical signals. The display device DD may be applied to various electronic devices. For example, the display device DD may be applied to electronic devices, such as a smart watch, a tablet computer, a notebook computer, a computer, or a smart television, etc.

Hereinafter, a normal line direction substantially perpendicular to a plane defined by the first direction DR1 and the second direction DR2 is referred to as a third direction DR3. In the following descriptions, the expression "when viewed in a plane" or "on a plane" may mean a state of being viewed in the third direction DR3.

An upper surface of the display device DD may be defined as a display surface IS and may be substantially parallel to the plane defined by the first direction DR1 and the second direction DR2. Images IM generated by the display device DD may be provided to a user through the display surface IS.

The display surface IS of the display device DD may be divided into a transmission area TA and a bezel area BZA. The images IM may be displayed through the transmission area TA. The user may view the images IM through the transmission area TA. According to some embodiments, the transmission area TA may have a quadrangular shape with rounded vertices. However, this is merely one example, and the transmission area TA may have a variety of shapes and should not be particularly limited.

The bezel area BZA may be defined adjacent to the transmission area TA. The bezel area BZA may have a color (e.g., a set or predetermined color). The bezel area BZA may surround the transmission area TA. Accordingly, the shape of the transmission area TA may be defined by the bezel area BZA, however, this is merely one example. According to some embodiments, the bezel area BZA may be located adjacent to only one side of the transmission area TA or may be omitted.

The display device DD may sense an external input applied thereto from the outside. The external input may include a variety of external inputs provided from the outside. For example, the external input may include an external input (e.g., a hovering input) applied when in proximity to or approaching close to the display device DD at a distance (e.g., a set or predetermined distance) as well as a touch input by a part of the user's body, e.g., a hand of the user US_F or by an additional device, e.g., an active pen, a digitizer, or the like. In addition, the external input may include various forms, such as force, pressure, temperature, or light.

The display device DD may sense biometric information of the user, which is applied thereto from the outside. The display device DD may include a biometric information sensing area defined in the display surface IS to sense the biometric information of the user. The biometric information sensing area may be defined in an entire portion of the transmission area TA or may be defined in a portion of the transmission area TA. FIG. 1 shows a structure in which the entire portion of the transmission area TA is used as the biometric information sensing area.

The display device DD may include a window WM, a display module DM, and a housing EDC. According to some embodiments, the window WM and the housing EDC may be coupled with each other to form an appearance of the display device DD.

A front surface of the window WM may define the display surface IS of the display device DD. The window WM may include an optically transparent insulating material. For example, the window WM may include a glass or plastic material. The window WM may have a single-layer or multi-layer structure. As an example, the window WM may include a plurality of plastic films coupled to each other by an adhesive or a glass substrate and a plastic film coupled to the glass substrate by an adhesive.

The display module DM may include a display panel DP and an input sensing layer ISL. The display panel DP may display the images IM in response to electrical signals, and the input sensing layer ISL may sense an external input applied thereto from the outside. The external input may be provided in various forms.

The display panel DP according to some embodiments of the present disclosure may be a light-emitting type display panel, however, it should not be particularly limited. For instance, the display panel DP may be an organic light emitting display panel, an inorganic light emitting display panel, or a quantum dot light emitting display panel. A light emitting layer of the organic light emitting display panel may include an organic light emitting material. A light emitting layer of the inorganic light emitting display panel may include an inorganic light emitting material. A light emitting layer of the quantum dot light emitting display panel may include a quantum dot or a quantum rod. Hereinafter, the organic light emitting display panel will be described as a representative example of the display panel DP.

Referring to FIG. 2, the display panel DP may include a base layer BL, a circuit layer DP_CL, an element layer DP_ED, and an encapsulation layer TFE. The display panel DP may be a flexible display panel, however, the present disclosure should not be limited thereto or thereby. According to some embodiments, the display panel DP may be a foldable display panel folded with respect to a folding axis or a rigid display panel.

The base layer BL may include a synthetic resin layer. The synthetic resin layer may be a polyimide-based resin layer, however, a material for the synthetic resin layer should not be particularly limited. In addition, the base layer BL may include a glass substrate, a metal substrate, or an organic/inorganic composite material substrate.

The circuit layer DP_CL may be located on the base layer BL. The circuit layer DP_CL may be located between the base layer BL and the element layer DP_ED. The circuit layer DP_CL may include at least one insulating layer and a circuit element. Hereinafter, the insulating layer included in the circuit layer DP_CL is referred to as an intermediate insulating layer. The intermediate insulating layer may include at least one intermediate inorganic layer and at least one intermediate organic layer. The circuit element may include a pixel driving circuit included in each of pixels displaying the images and a sensor driving circuit included in each of sensors recognizing external information. The external information may be the biometric information. As an example, the sensor may be a fingerprint recognition sensor, a proximity sensor, an iris recognition sensor, or the like. In addition, the sensor may be an optical sensor that recognizes the biometric information in an optical manner. The circuit layer DP_CL may further include signal lines connected to the pixel driving circuit and/or the sensor driving circuit.

The element layer DP_ED may include a light emitting element included in each of the pixels and a light receiving element included in each of the sensors. As an example, the light receiving element may be a photodiode. The light receiving element may be a sensor that senses a light reflected by a user's fingerprint or responds to the light. The circuit layer DP_CL and the element layer DP_ED will be described in detail later with reference to FIGS. 7A to 7D.

The encapsulation layer TFE may encapsulate the element layer DP_ED. The encapsulation layer TFE may include at least one organic layer and at least one inorganic layer. The inorganic layer may include an inorganic material and may protect the element layer DP_ED from moisture and oxygen. The inorganic layer may include a silicon nitride layer, a silicon oxynitride layer, a silicon oxide layer, a titanium oxide layer, or an aluminum oxide layer, however, it should not be particularly limited. The organic layer may include an organic material and may protect the element layer DP_ED from a foreign substance such as dust particles.

The input sensing layer ISL may be located on the display panel DP. The input sensing layer ISL may be located directly on the encapsulation layer TFE. The input sensing layer ISL may be formed on the display panel DP through successive processes. That is, when the input sensing layer ISL is located directly on the display panel DP, an adhesive member may not be located between the input sensing layer ISL and the display panel DP. Alternatively, an adhesive film may be located between the input sensing layer ISL and the display panel DP. In this case, the input sensing layer ISL may not be formed through the successive processes with the display panel DP and may be fixed onto an upper surface of the display panel DP by the adhesive film after being formed separately from the display panel DP.

The input sensing layer ISL may sense the external input, e.g., a user's touch, may convert the external input to an input signal (e.g., a set or predetermined input signal), and may apply the input signal to the display panel DP. The input sensing layer ISL may include a plurality of sensing electrodes to sense the external input. The sensing electrodes may sense the external input by a capacitance method. The display panel DP may receive an input signal from the input sensing layer ISL and may generate an image corresponding to the input signal.

The display module DM may further include a color filter layer CFL. As an example, the color filter layer CFL may be located on the input sensing layer ISL, however, the present disclosure should not be limited thereto or thereby. The color filter layer CFL may be located between the display panel DP and the input sensing layer ISL. The color filter layer CFL may include a plurality of color filters and a black matrix.

The structure of the input sensing layer ISL and the structure of the color filter layer CFL will be described in detail later.

The display device DD may further include an adhesive layer AL The window WM may be attached to the input sensing layer ISL by the adhesive layer AL. The adhesive layer AL may include an optically clear adhesive (OCA), an optically clear adhesive resin (OCR), or a pressure sensitive adhesive (PSA).

The housing EDC may be coupled to the window WM. The housing EDC and the window WM coupled to the housing EDC may provide an inner space (e.g., a set or predetermined inner space). The display module DM may be accommodated in the inner space. The housing EDC may include a material with a relatively high rigidity. For example, the housing EDC may include a glass, plastic, or metal material or a plurality of frames and/or plates of combinations thereof. The housing EDC may stably protect the components of the display device DD accommodated in the inner space from external impacts. According to some embodiments, a battery module may be located between the display module DM and the housing EDC to supply a power source required for an overall operation of the display device DD.

Figure 3:
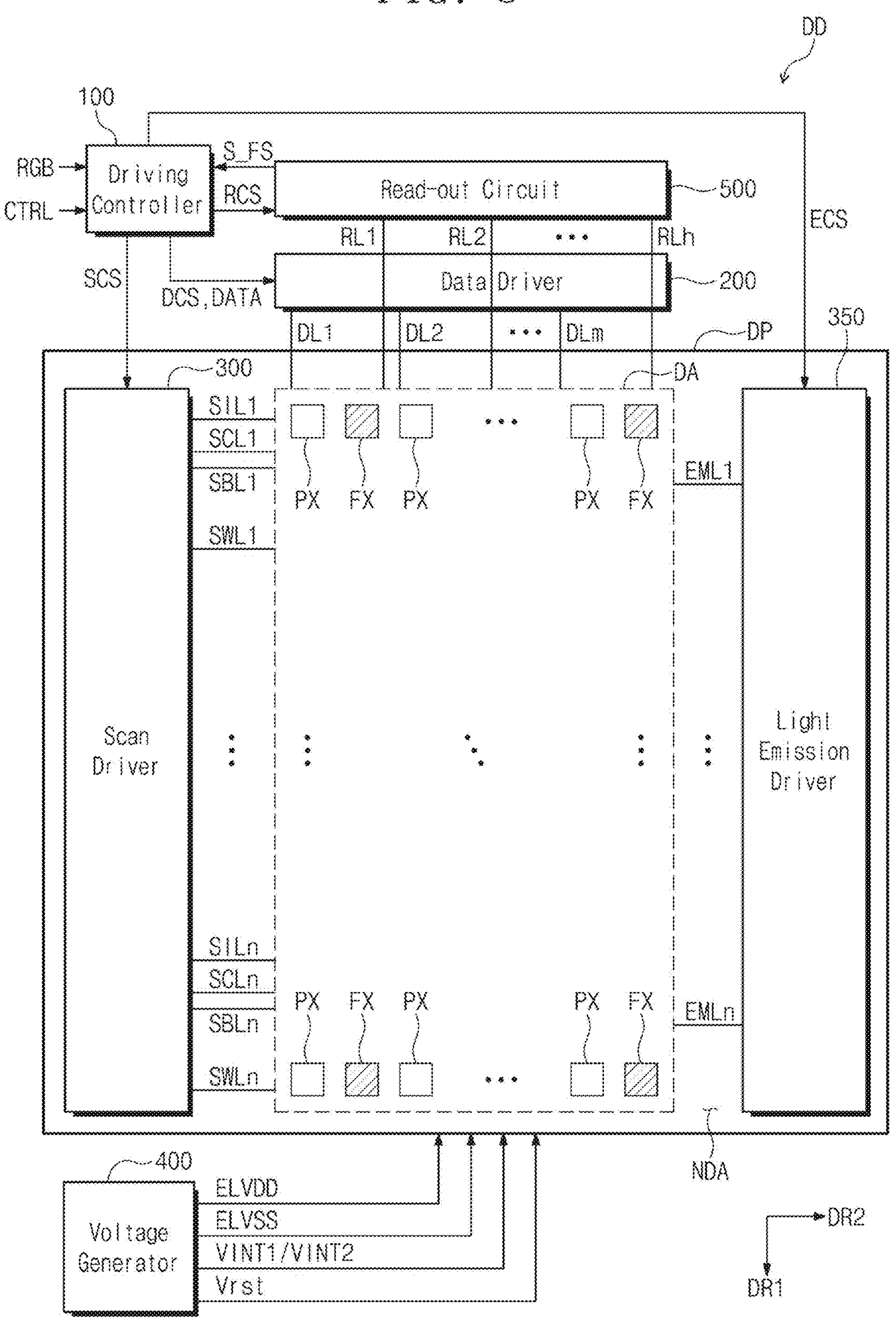
FIG. 3 is a block diagram of a display device according to some embodiments of the present disclosure.

FIG. 3 is a block diagram of the display device DD according to some embodiments of the present disclosure.

Referring to FIG. 3, the display device DD may include the display panel DP, a panel driver, and a driving controller 100. As an example, the panel driver may include a data driver 200, a scan driver 300, a light emission driver 350, a voltage generator 400, and a read-out circuit 500.

The driving controller 100 may receive an image signal RGB and control signals CTRL. The driving controller 100 may convert a data format of the image signal RGB to a data format appropriate to an interface between the data driver 200 and the driving controller 100 to generate an image data DATA. The driving controller 100 may generate a first control signal SCS, a second control signal ECS, a third control signal DCS, and a fourth control signal RCS.

The data driver 200 may receive the third control signal DCS and the image data DATA from the driving controller 100. The data driver 200 may convert the image data DATA to data signals and may output the data signals to a plurality of data lines DL1 to DLm described later. The data signals may be analog voltages corresponding to grayscale values of the image data DATA.

The scan driver 300 may receive the first control signal SCS from the driving controller 100. The scan driver 300 may output scan signals to scan lines in response to the first control signal SCS.

The voltage generator 400 may generate voltages required to operate the display panel DP. According to some embodiments, the voltage generator 400 may generate a first driving voltage ELVDD, a second driving voltage ELVSS, a first initialization voltage VINT1, and a second initialization voltage VINT2.

The display panel DP may include a display area DA corresponding to the transmission area TA (refer to FIG. 1) and a non-display area NDA corresponding to the bezel area BZA (refer to FIG. 1).

The display panel DP may include a plurality of pixels PX located in the display area DA and a plurality of sensors FX located in the display area DA. As an example, each of the sensors FX may be located between two pixels PX adjacent to each other. The pixels PX and the sensors FX may be alternately arranged with each other in the first and second directions DR1 and DR2, however, the present disclosure should not be limited thereto or thereby. That is, two or more pixels PX may be located between two sensors FX adjacent to each other in the first direction DR1 among the sensors FX, or two or more pixels PX may be located between two sensors FX adjacent to each other in the second direction DR2 among the sensors FX.

The display panel DP may further include initialization scan lines SIL1 to SILn, compensation scan lines SCL1 to SCLn, write scan lines SWL1 to SWLn, black scan lines SBL1 to SBLn, light emission control lines EML1 to EMLn, the data lines DL1 to DLm, and read-out lines RL1 to RLh. The initialization scan lines SIL1 to SILn, the compensation scan lines SCL1 to SCLn, the write scan lines SWL1 to SWLn, the black scan lines SBL1 to SBLn, and the light emission control lines EML1 to EMLn may extend in the second direction DR2. The initialization scan lines SIL1 to SILn, the compensation scan lines SCL1 to SCLn, the write scan lines SWL1 to SWLn, the black scan lines SBL1 to SBLn, and the light emission control lines EML1 to EMLn may be arranged in the first direction DR1 and may be spaced apart from each other. The data lines DL1 to DLm and the read-out lines RL1 to RLh may extend in the first direction DR1 and may be arranged spaced apart from each other in the second direction DR2.

The pixels PX may be electrically connected to the initialization scan lines SIL1 to SILn, the compensation scan lines SCL1 to SCLn, the write scan lines SWL1 to SWLn, the black scan lines SBL1 to SBLn, the light emission control lines EML1 to EMLn, and the data lines DL1 to DLm. Each of the pixels PX may be electrically connected to four scan lines. However, the number of the scan lines connected to each of the pixels PX should not be limited thereto or thereby.

The sensors FX may be electrically connected to the write scan lines SWL1 to SWLn and the read-out lines RL1 to RLh. Each of the sensors FX may be electrically connected to one scan line, however, the present disclosure should not be limited thereto or thereby. The number of the scan lines connected to each of the sensors FX may vary. As an example, the number of the read-out lines RL1 to RLh may correspond to a half (½) of the number of the data lines DL1 to DLm, however, the present disclosure should not be limited thereto or thereby. Alternatively, the number of the read-out lines RL1 to RLh may correspond to a ¼ or ⅛ of the number of the data lines DL1 to DLm.

The scan driver 300 may be located in the non-display area NDA of the display panel DP. The scan driver 300 may receive the first control signal SCS from the driving controller 100. Responsive to the first control signal SCS, the scan driver 300 may output initialization scan signals to the initialization scan lines SIL1 to SILn and may output compensation scan signals to the compensation scan lines SCL1 to SCLn. In addition, responsive to the first control signal SCS, the scan driver 300 may output write scan signals to the write scan lines SWL1 to SWLn and may output black scan signals to the black scan lines SBL1 to SBLn. Alternatively, the scan driver 300 may include first and second scan drivers. The first scan driver may output the initialization scan signals and the compensation scan signals, and the second scan driver may output the write scan signals and the black scan signals.

The light emission driver 350 may be located in the non-display area NDA of the display panel DP. The light emission driver 350 may receive the second control signal ECS from the driving controller 100. The light emission driver 350 may output light emission control signals to the light emission control lines EML1 to EMLn in response to the second control signal ECS. According to some embodiments, alternatively, the scan driver 300 may be connected to the light emission control lines EML1 to EMLn. In this case, the light emission driver 350 may be omitted, and the scan driver 300 may output the light emission control signals to the light emission control lines EML1 to EMLn.

The read-out circuit 500 may receive the fourth control signal RCS from the driving controller 100. The read-out circuit 500 may receive sensing signals from the read-out lines RL1 to RLh in response to the fourth control signal RCS. The read-out circuit 500 may process the sensing signals from the read-out lines RL1 to RLh and may provide the processed sensing signals S_FS to the driving controller 100. The driving controller 100 may recognize the biometric information based on the sensing signals S_FS.

Figure 4A:
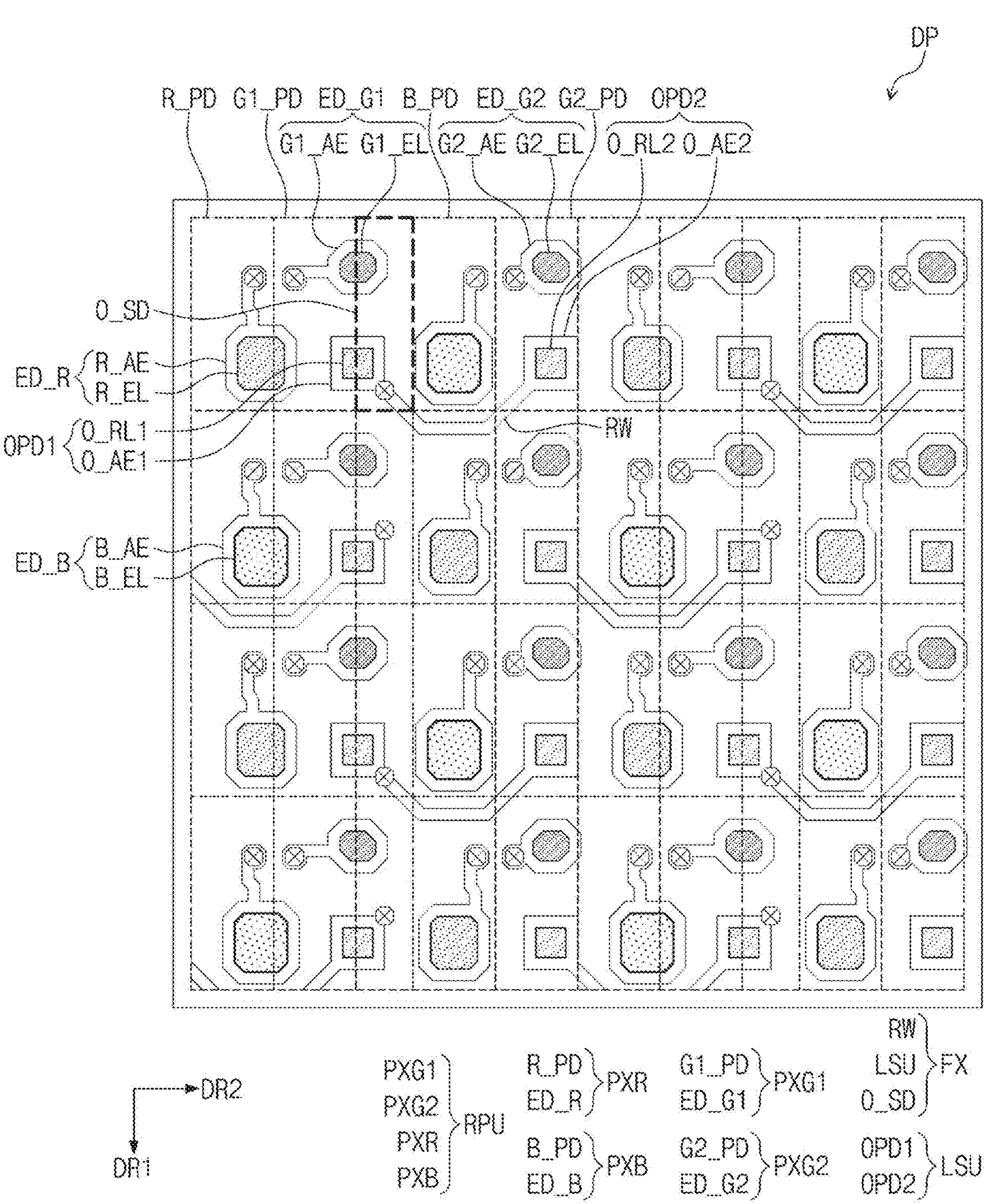
FIGS. 4A and 4B are enlarged plan views of a portion of display panels according to some embodiments of the present disclosure.
Figure 4B:
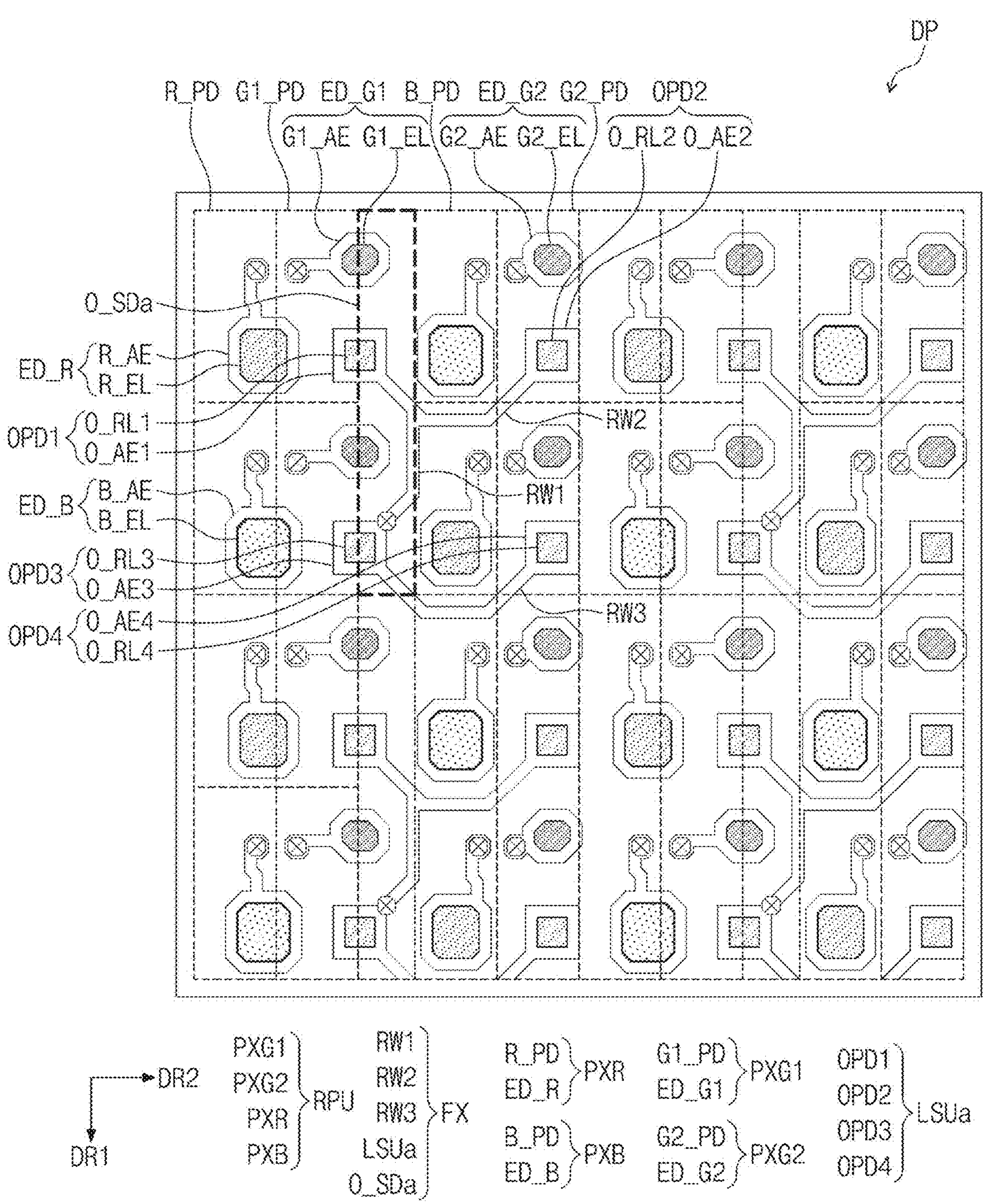

FIGS. 4A and 4B are enlarged plan views of a portion of display panels DP according to embodiments of the present disclosure.

Referring to FIG. 4A, the display panel DP may include a plurality of pixels PXR, PXG1, PXG2, and PXB and a plurality of sensors FX.

The pixels PXR, PXG1, PXG2, PXB may be grouped in a plurality of reference pixel units RPU. As an example, each of the reference pixel units RPU may include four pixels, i.e., two first pixels PXG1 and PXG2 (hereinafter, referred to as first and second green pixels), a third pixel PXR (hereinafter, referred to as a red pixel), and a fourth pixel PXB (hereinafter, referred to as a blue pixel). However, the number of pixels included in each of the reference pixel units RPU should not be limited thereto or thereby. According to some embodiments, alternatively, each of the reference pixel units RPU may include three pixels, i.e., the first green pixel PXG1 (or the second green pixel PXG2), the red pixel PXR, and the blue pixel PXB.

The first and second green pixels PXG1 and PXG2 may respectively include first and second light emitting elements ED_G1 and ED_G2 (hereinafter, referred to as first and second green light emitting elements), the red pixel PXR may include a third light emitting element ED_R (hereinafter, referred to as a red light emitting element), and the blue pixel PXB may include a fourth light emitting element ED_B (hereinafter, referred to as a blue light emitting element). As an example, each of the first and second green light emitting elements ED_G1 and ED_G2 may emit a first color light, e.g., a green light, the red light emitting element ED_R may emit a second color light, e.g., a red light, different from the first color light, and the blue light emitting element ED_B may emit a third color light, e.g., a blue light, different from the first and second color lights. The green light emitted from the first green light emitting element ED_G1 may have the same wavelength band as that of the green light emitted from the second green light emitting element ED_G2.

In the first and second directions DR1 and DR2, the red light emitting elements ED_R may be alternately and repeatedly arranged with the blue light emitting elements ED_B. The first and second green light emitting elements ED_G1 and ED_G2 may be alternately arranged with each other in the first direction DR1 and may be alternately arranged with each other in the second direction DR2. The first and second green light emitting elements ED_G1 and ED_G2 may be arranged in different rows and columns from rows and columns where the red light emitting elements ED_R and the blue light emitting elements ED_B are arranged in the first and second directions DR1 and DR2.

As an example, the red light emitting element ED_R may have a size greater than that of the first and second green light emitting elements ED_G1 and ED_G2. In addition, the blue light emitting element ED_B may have a size equal to or greater than that of the red light emitting element ED_R. The size of each of the light emitting elements ED_R, ED_G1, ED_G2, and ED_B should not be limited thereto or thereby and may be changed in various ways. For instance, according to some embodiments, the light emitting elements ED_R, ED_G1, ED_G2, and ED_B may have the same size as each other.

The first and second green light emitting elements ED_G1 and ED_G2 may have a shape different from that of the red and blue light emitting elements ED_R and ED_B. As an example, each of the red and blue light emitting elements ED_R and ED_B may have an octagonal shape whose length in the first direction DR1 is longer than a length in the second direction DR2. The red and blue light emitting elements ED_R and ED_B may have the same size as each other or may have different sizes from each other, however, the red and blue light emitting elements ED_R and ED_B may have the same shape. The shape of each of the red and blue light emitting elements ED_R and ED_B should not be limited thereto or thereby. As an example, each of the red and blue light emitting elements ED_R and ED_B may have an octagonal shape whose lengths in the first direction DR1 and the second direction DR2 are the same or may have a square shape or a rectangular shape.

Each of the first and second green light emitting elements ED_G1 and ED_G2 may have an octagonal shape whose length in the second direction DR2 is longer than a length in the first direction DR1. As an example, the first and second green light emitting elements ED_G1 and ED_G2 may have the same size as each other. However, the shape of the first and second green light emitting elements ED_G1 and ED_G2 should not be limited thereto or thereby. Each of the first and second green light emitting elements ED_G1 and ED_G2 may have an octagonal shape whose lengths in the first direction DR1 and the second direction DR2 are the same or may have a square shape or a rectangular shape.

The first green light emitting element ED_G1 may be electrically connected to a first green pixel driving circuit G1_PD. In detail, the first green light emitting element ED_G1 may include a first green anode electrode G1_AE and a first green light emitting layer G1_EL, and the first green anode electrode G1_AE may be connected to the first green pixel driving circuit G1_PD via a contact hole. The second green light emitting element ED_G2 may be electrically connected to a second green pixel driving circuit G2_PD. In detail, the second green light emitting element ED_G2 may include a second green anode electrode G2_AE and a second green light emitting layer G2_EL, and the second green anode electrode G2_AE may be connected to the second green pixel driving circuit G2_PD via a contact hole.

The first green light emitting layer G1_EL and the second green light emitting layer G2_EL may have the same size as each other. The first green light emitting layer G1_EL and the second green light emitting layer G2_EL may have the same shape as each other or may have different shapes from each other. As an example, the first green light emitting layer G1_EL and the second green light emitting layer G2_EL may have different shapes from each other on the same plane. The first green anode electrode G1_AE and the second green anode electrode G2_AE may have different sizes and different shapes from each other.

The red light emitting element ED_R may be electrically connected to a red pixel driving circuit R_PD. In detail, the red light emitting element ED_R may include a red anode electrode R_AE and a red light emitting layer R_EL, and the red anode electrode R_AE may be connected to the red pixel driving circuit R_PD via a contact hole. The blue light emitting element ED_B may be electrically connected to a blue pixel driving circuit B_PD. In detail, the blue light emitting element ED_B may include a blue anode electrode B_AE and a blue light emitting layer B_EL, and the blue anode electrode B_AE may be connected to the blue pixel driving circuit B_PD via a contact hole.

Each of the sensors FX may include a light sensing unit LSU and a sensor driving circuit O_SD. The light sensing unit LSU may include at least one light receiving element. As an example, the light sensing unit LSU may include k light receiving elements, and one of the k light receiving elements may be connected to the sensor driving circuit. According to some embodiments, k is a natural number equal to or greater than two. FIG. 4A shows a case where k is two. When k is two, the light sensing unit LSU may include two light receiving elements (hereinafter, referred to as first and second light receiving elements OPD1 and OPD2). As an example, the two light receiving elements, i.e., the first and second light receiving elements OPD1 and OPD2, may be arranged to correspond to one reference pixel unit RPU. However, the number of the light receiving elements arranged to correspond to each reference pixel unit RPU should not be limited thereto or thereby. As an example, one light receiving element may be arranged to correspond to one reference pixel unit RPU.

Each of the first and second light receiving elements OPD1 and OPD2 may be located between the red and blue light emitting elements ED_R and ED_B in the second direction DR2. Each of the first and second light receiving elements OPD1 and OPD2 may be located adjacent to the first green light emitting element ED_G1 or the second green light emitting element ED_G2 in the first direction DR1. In a first reference pixel unit row, the first light receiving element OPD1 and the first green light emitting element ED_G1 may be adjacent to each other in the first direction DR1, and the second light receiving element OPD2 and the second green light emitting element ED_G2 may be adjacent to each other in the first direction DR1. In a second reference pixel unit row, the first light receiving element OPD1 and the second green light emitting element ED_G2 may be adjacent to each other in the first direction DR1, and the second light receiving element OPD2 and the first green light emitting element ED_G1 may be adjacent to each other in the first direction DR1. As an example, the first and second light receiving elements OPD1 and OPD2 may be respectively located between the first green light emitting element ED_G1 and the second green light emitting element ED_G2 adjacent to each other in the first direction DR1.

Each of the first and second light receiving elements OPD1 and OPD2 may have the same size and the same shape. Each of the first and second light receiving elements OPD1 and OPD2 may have the size smaller than that of the red and blue light emitting elements ED_R and ED_B. As an example, each of the first and second light receiving elements OPD1 and OPD2 may have the size equal to or smaller than that of the first and second green light emitting elements ED_G1 and ED_G2. However, the size of each of the first and second light receiving elements OPD1 and OPD2 should not be limited thereto or thereby and may be changed in various ways. Each of the first and second light receiving elements OPD1 and OPD2 may have a shape different from that of the red and blue light emitting elements ED_R and ED_B. As an example, each of the first and second light receiving elements OPD1 and OPD2 may have a square shape. However, the shape of each of the first and second light receiving elements OPD1 and OPD2 should not be limited thereto or thereby. Alternatively, each of the first and second light receiving elements OPD1 and OPD2 may have a rectangular shape whose length in the first direction DR1 is longer than a length in the second direction DR2.

The sensor driving circuit O_SD may be connected to one of the first and second light receiving elements OPD1 and OPD2, for example, the first light receiving element OPD1. The sensor driving circuit O_SD may have the same length as that of the red and blue pixel driving circuits R_PD and B_PD in the first direction DR1. The sensor driving circuit O_SD may overlap one of the first and second light receiving elements OPD1 and OPD2, for example, the first light receiving element OPD1, when viewed in a plane. The sensor driving circuit O_SD may overlap one of the first and second green light emitting elements ED_G1 and ED_G2, for example, the first green light emitting element ED_G1.

The first light receiving element OPD1 may include a first sensing anode electrode O_AE1 and a first photoelectric conversion layer O_RL1, and the second light receiving element OPD2 may include a second sensing anode electrode O_AE2 and a second photoelectric conversion layer O_RL2. The first sensing anode electrode O_AE1 may be directly connected to the sensor driving circuit O_SD via a contact hole.

Each of the sensors FX may further include a routing line RW electrically connecting the first and second light receiving elements OPD1 and OPD2. The routing line RW may be electrically connected to the first sensing anode electrode O_AE1 and the second sensing anode electrode O_AE2. As an example, the routing line RW may be provided integrally with the first sensing anode electrode O_AE1 and the second sensing anode electrode O_AE2.

The routing line RW, the first sensing anode electrode O_AE1, and the second sensing anode electrode O_AE2 may be located on the anode electrodes R_AE, G1_AE, G2_AE, and B_AE. In this case, the routing line RW, the first sensing anode electrode O_AE1, and the second sensing anode electrode O_AE2 may include the same material as and may be formed through the same process as those of the anode electrodes R_AE, G1_AE, G2_AE, and B_AE.

The first and second light receiving elements OPD1 and OPD2 may be connected to the sensor driving circuit O_SD in parallel by routing lines RW. Accordingly, the first and second light receiving elements OPD1 and OPD2 may be substantially simultaneously turned on or turned off by the sensor driving circuit O_SD.

When k is four as shown in FIG. 4B, a light sensing unit LSUa may include four light receiving elements (hereinafter, referred to as first, second, third, and fourth light receiving elements OPD1, OPD2, OPD3, and OPD4). One of the first, second, third, and fourth light receiving elements OPD1, OPD2, OPD3, and OPD4, for example, the third light receiving element OPD3, may be connected to a sensor driving circuit O_SDa.

Each of the sensors FX may further include three routing lines (hereinafter, referred to as first, second, and third routing lines RW1, RW2, and RW3) to electrically connect first, second, third, and fourth light receiving elements OPD1, OPD2, OPD3, and OPD4. The first routing line RW1 may electrically connect two light receiving elements adjacent to each other in the first direction DR1, i.e., the first and third light receiving elements OPD1 and OPD3, among the four light receiving elements OPD1, OPD2, OPD3, and OPD4. The second routing line RW2 may electrically connect two light receiving elements adjacent to each other in the second direction DR2, i.e., the first and second light receiving elements OPD1 and OPD2, among the four light receiving elements OPD1, OPD2, OPD3, and OPD4. The third routing line RW3 may electrically connect two light receiving elements adjacent to each other in the second direction DR2, i.e., the third and fourth light receiving elements OPD3 and OPD4, among the light receiving elements OPD1, OPD2, OPD3, and OPD4.

The first light receiving element OPD1 may include a first sensing anode electrode O_AE1 and a first photoelectric conversion layer O_RL1, and the second light receiving element OPD2 may include a second sensing anode electrode O_AE2 and a second photoelectric conversion layer O_RL2. The third light receiving element OPD3 may include a third sensing anode electrode O_AE3 and a third photoelectric conversion layer O_RL3, and the fourth light receiving element OPD4 may include a fourth sensing anode electrode O_AE4 and a fourth photoelectric conversion layer O_RL4. The third sensing anode electrode O_AE3 may be directly connected to the sensor driving circuit O_SDa via a contact hole. The sensor driving circuit O_SDa may have a length greater than that of the red and blue pixel driving circuits R_PD and B_PD in the first direction DR1. Accordingly, the sensor driving circuit O_SDa may be arranged to overlap two light receiving elements, for example, the first and third light receiving elements OPD1 and OPD3, among the first to fourth light receiving elements OPD1 to OPD4 when viewed in the plane. The sensor driving circuit O_SDa may overlap two green light emitting elements, for example, first and second green light emitting elements ED_G1 and ED_G2, when viewed in the plane.

The first routing line RW1 may be electrically connected to the first sensing anode electrode O_AE1 and the third sensing anode electrode O_AE3, and the second routing line RW2 may be electrically connected to the first sensing anode electrode O_AE1 and the second sensing anode electrode O_AE2. The third routing line RW3 may be electrically connected to the third sensing anode electrode O_AE3 and the fourth sensing anode electrode O_AE4. As an example, the first to third routing lines RW1 to RW3 may be provided integrally with the first to fourth sensing anode electrodes O_AE1 to O_AE4.

The first, second, and third routing lines RW1, RW2, and RW3 and the first to fourth sensing anode electrodes O_AE1 to O_AE4 may be located on the same layer as anode electrodes R_AE, G1_AE, G2_AE, and B_AE. In this case, the first, second, and third routing lines RW1, RW2, and RW3 and the first to fourth sensing anode electrodes O_AE1 to O_AE4 may include the same materials as and may be formed through the same process as those of the anode electrodes R_AE, G1_AE, G2_AE, and B_AE.

The first, second, third, and fourth light receiving elements OPD1, OPD2, OPD3, and OPD4 may be connected to the sensor driving circuit O_SDa in parallel by the first, second, and third routing lines RW1, RW2, and RW3. Accordingly, the first, second, third, and fourth light receiving elements OPD1, OPD2, OPD3, and OPD4 may be substantially simultaneously turned on or turned off by the sensor driving circuit O_SDa.

Each of the sensor driving circuits O_SD and O_SDa may include a plurality of transistors. As an example, the sensor driving circuits O_SD and O_SDa and the pixel driving circuits R_PD, G1_PD, G2_PD, and B_PD may be substantially simultaneously formed through the same processes. In addition, the scan driver 300 (refer to FIG. 3) may include transistors formed through the same processes as the sensor driving circuits O_SD and O_SDa and the pixel driving circuits R_PD, G1_PD, G2_PD, and B_PD.

Figure 5A:
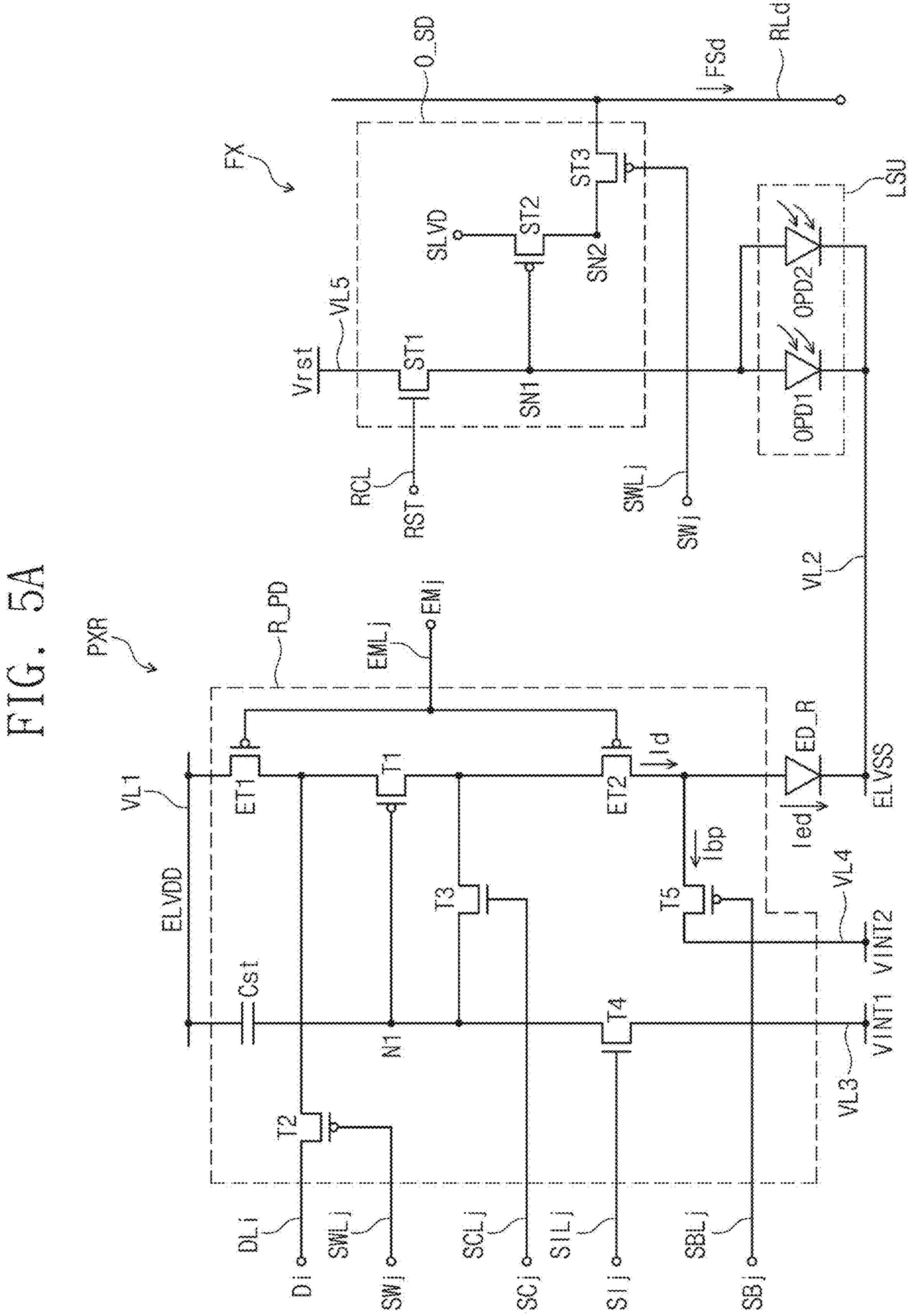
FIG. 5A is a circuit diagram of a pixel and a sensor according to some embodiments of the present disclosure.
Figure 5B:
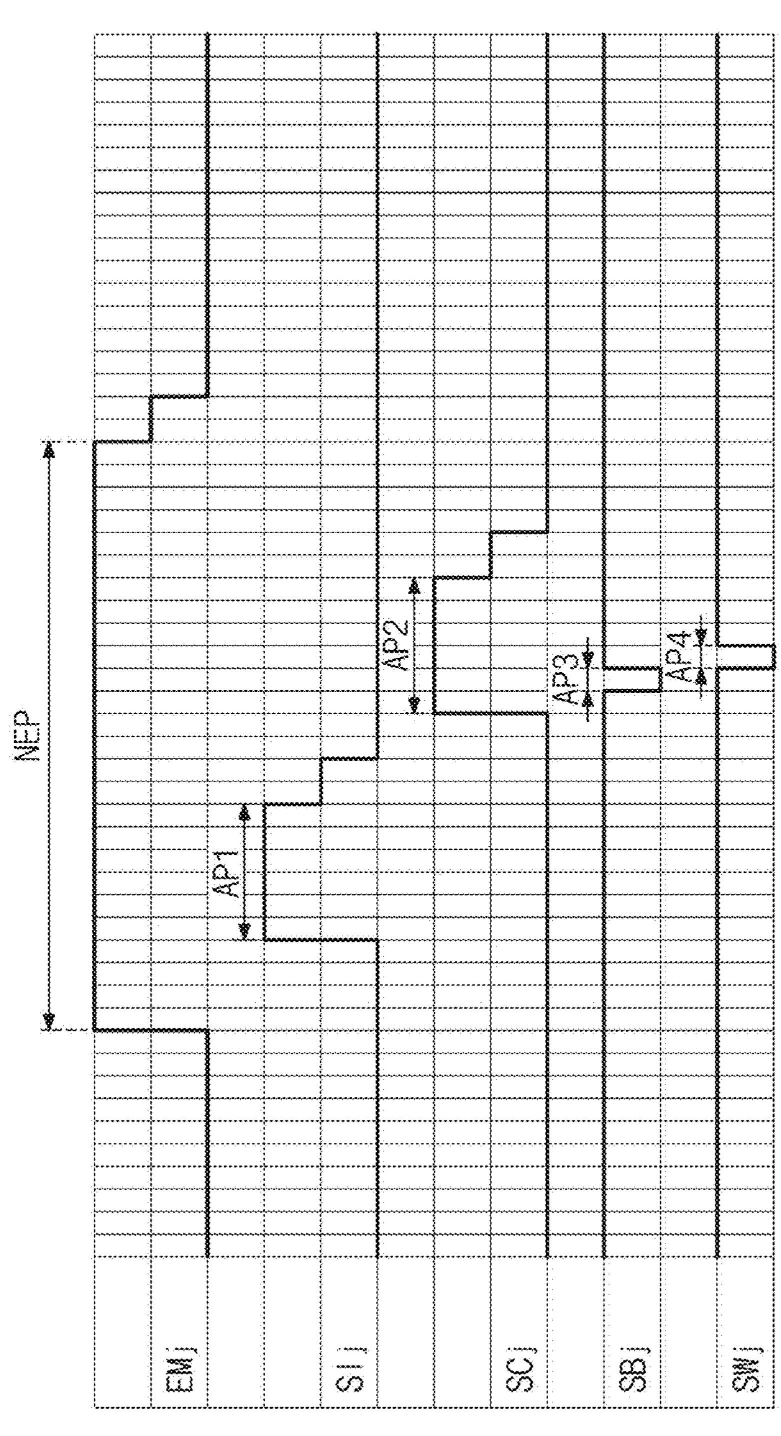
FIG. 5B is a waveform diagram illustrating an operation of the pixel and the sensor shown in FIG. 5A.

FIG. 5A is a circuit diagram of the pixel PXR and the sensor FX according to some embodiments of the present disclosure, and FIG. 5B is a waveform diagram illustrating an operation of the pixel PXR and the sensor FX shown in FIG. 5A.

FIG. 5A shows an equivalent circuit diagram of one pixel, e.g., the red pixel PXR, among the pixels PX shown in FIG. 3. Since the pixels PX may have substantially the same circuit structure, descriptions of the circuit structure will be made based on the red pixel PXR, and details of other pixels will be omitted. In addition, FIG. 5A shows an equivalent circuit diagram of one sensor FX of the sensors FX shown in FIG. 3. Since the sensors FX may have substantially the same circuit structure, the circuit structure of one sensor FX will be described in detail, and descriptions of other sensors will be omitted.

Referring to FIG. 5A, the red pixel PXR may be connected to an i-th data line DLi among the data lines DL1 to DLm, a j-th initialization scan line SILj among the initialization scan lines SIL1 to SILn, a j-th compensation scan line SCLj among the compensation scan lines SCL1 to SCLn, a j-th write scan line SWLj among the write scan lines SWL1 to SWLn, a j-th black scan line SBLj among the black scan lines SBL1 to SBLn, and a j-th light emission control line EMLj among the light emission control lines EML1 to EMLn.

The red pixel PXR may include the red light emitting element ED_R and the red pixel driving circuit R_PD. The red light emitting element ED_R may be a light emitting diode. As an example, the red light emitting element ED_R may be an organic light emitting diode including an organic light emitting layer.

The red pixel driving circuit R_PD may include first, second, third, fourth, and fifth transistors T1, T2, T3, T4, and T5, first and second light emission control transistors ET1 and ET2, and one capacitor Cst. At least one of the first to fifth transistors T1 to T5 and/or the first and second light emission control transistors ET1 or ET2 may be a transistor including a low-temperature polycrystalline silicon (LTPS) semiconductor layer. Some transistors of the first to fifth transistors T1 to T5 and the first and second light emission control transistors ET1 and ET2 may be a P-type transistor, and the other transistors may be an N-type transistor. As an example, each of the first, second, and fifth transistors T1, T2, and T5 and the first and second light emission control transistors ET1 and ET2 may be a PMOS transistor, and each of the third and fourth transistors T3 and T4 may be an NMOS transistor. At least one of the first to fifth transistors T1 to T5 and/or the first and second light emission control transistors ET1 or ET2 may be a transistor including an oxide semiconductor layer. As an example, the third and fourth transistors T3 and T4 may be the oxide semiconductor transistor, and the first, second, and fifth transistors T1, T2, and T5 and the first and second light emission control transistors ET1 and ET2 may be the LTPS transistor.

The circuit structure of the red pixel driving circuit R_PD should not be limited to the embodiments shown in FIG. 5A. The red pixel driving circuit R_PD shown in FIG. 5A is merely an example, and the circuit structure of the red pixel driving circuit R_PD may be changed. As an example, all the first to fifth transistors T1 to T5 and the first and second light emission control transistors ET1 and ET2 may be the P-type transistor or the N-type transistor.

The j-th initialization scan line SILj, the j-th compensation scan line SCLj, the j-th write scan line SWLj, the j-th black scan line SBLj, and the j-th light emission control line EMLj may transmit a j-th initialization scan signal SIj, a j-th compensation scan signal SCj, a j-th write scan signal SWj, a j-th black scan signal SBj, and a j-th light emission control signal EMj to the red pixel PXR, respectively. The i-th data line DLi may transmit an i-th data signal Di to the red pixel PXR. The i-th data signal Di may have a voltage level corresponding to the image signal RGB (refer to FIG. 3) input to the display device DD (refer to FIG. 3).

First and second driving voltage lines VL1 and VL2 may respectively transmit the first driving voltage ELVDD and the second driving voltage ELVSS to the red pixel PXR. In addition, first and second initialization voltage lines VL3 and VL4 may respectively transmit the first initialization voltage VINT1 and the second initialization voltage VINT2 to the red pixel PXR.

The first transistor T1 may be connected between the first driving voltage line VL1 to which the first driving voltage ELVDD is applied and the red light emitting element ED_R. The first transistor T1 may include a first electrode connected to the first driving voltage line VL1 through the first light emission control transistor ET1, a second electrode connected to the red anode electrode R_AE (refer to FIG. 4A) of the red light emitting element ED_R through the second light emission control transistor ET2, and a third electrode (e.g., a gate electrode) connected to one end of the capacitor Cst, e.g., a first node N1. The first transistor T1 may receive the i-th data signal Di via the i-th data line DLi according to a switching operation of the second transistor T2 and may supply a driving current Id to the red light emitting element ED_R.

The second transistor T2 may be connected between the data line DLi and the first electrode of the first transistor T1. The second transistor T2 may include a first electrode connected to the i-th data line DLi, a second electrode connected to the first electrode of the first transistor T1, and a third electrode (e.g., a gate electrode) connected to the j-th write scan line SWLj. The second transistor T2 may be turned on in response to the write scan signal SWj applied thereto through the j-th write scan line SWLj and may transmit the i-th data signal Di provided from the i-th data line DLi to the first electrode of the first transistor T1.

The third transistor T3 may be connected between the second electrode of the first transistor T1 and the first node N1. The third transistor T3 may include a first electrode connected to the third electrode of the first transistor T1, a second electrode connected to the second electrode of the first transistor T1, and a third electrode (e.g., a gate electrode) connected to the j-th compensation scan line SCLj. The third transistor T3 may be turned on in response to the j-th compensation scan signal SCj applied thereto through the j-th compensation scan line SCLj and may connect the second electrode and the third electrode of the first transistor T1, and thus, the first transistor T1 may be connected in a diode configuration.

The fourth transistor T4 may be connected between the first initialization voltage line VL3 to which the first initialization voltage VINT1 is applied and the first node N1. The fourth transistor T4 may include a first electrode connected to the first initialization voltage line VL3 transmitting the first initialization voltage VINT1, a second electrode connected to the first node N1, and a third electrode (e.g., a gate electrode) connected to the j-th initialization scan line SILj. The fourth transistor T4 may be turned on in response to the j-th initialization scan signal SIj applied thereto through the j-th initialization scan line SILj. The turned-on fourth transistor T4 may supply the first initialization voltage VINT1 to the first node N1 to initialize an electric potential of the third electrode of the first transistor T1, i.e., an electric potential of the first node N1.

The first light emission control transistor ET1 may include a first electrode connected to the first driving voltage line VL1, a second electrode connected to the first electrode of the first transistor T1, and a third electrode (e.g., a gate electrode) connected to the j-th light emission control line EMLj.

The second light emission control transistor ET2 may include a first electrode connected to the second electrode of the first transistor T1, a second electrode connected to the red anode electrode R_AE of the red light emitting element ED_R, and a third electrode (e.g., a gate electrode) connected to the j-th light emission control line EMLj.

The first and the second light emission control transistors ET1 and ET2 may be substantially simultaneously turned on in response to the j-th light emission control signal EMj applied thereto through the j-th light emission control line EMLj. The first driving voltage ELVDD provided through the turned-on first light emission control transistor ET1 may be compensated for by the first transistor T1 in the diode configuration and then may be supplied to the red light emitting element ED_R.

The fifth transistor T5 may include a first electrode connected to the second initialization voltage line VL4 to which the second initialization voltage VINT2 is applied, a second electrode connected to the second electrode of the second light emission control transistor ET2, and a third electrode (e.g., a gate electrode) connected to the j-th black scan line SBLj. The second initialization voltage VINT2 may have a voltage level equal to or lower than that of the first initialization voltage VINT1.

As described above, the one end of the capacitor Cst may be connected to the third electrode of the first transistor T1, and the other end of the capacitor Cst may be connected to the first driving voltage line VL1. A cathode electrode of the red light emitting element ED_R may be connected to the second driving voltage line VL2 transmitting the second driving voltage ELVSS. The second driving voltage ELVSS may have a voltage level lower than that of the first driving voltage ELVDD. As an example, the second driving voltage ELVSS may have a voltage level lower than that of the first and second initialization voltages VINT1 and VINT2.

Referring to FIGS. 5A and 5B, the j-th light emission control signal EMj may have a high level during a non-light-emitting period NEP. The j-th initialization scan signal SIj may be activated within the non-light-emitting period NEP. When the j-th initialization scan signal SIj having the high level is provided through the j-th initialization scan line SILj during an activation period AP1 (hereinafter, referred to as a first activation period) of the j-th initialization scan signal SIj, the fourth transistor T4 may be turned on in response to the j-th initialization scan signal SIj having the high level. The first initialization voltage VINT1 may be applied to the third electrode of the first transistor T1 through the turned-on fourth transistor T4, and the first node N1 may be initialized to the first initialization voltage VINT1. Accordingly, the first activation period AP1 may be defined as an initialization period of the red pixel PXR.

Then, when the j-th compensation scan signal SCj is activated and the j-th compensation scan signal SCj having the high level is provided through the j-th compensation scan line SCLj during an activation period AP2 (hereinafter, referred to as a second activation period) of the j-th compensation scan signal SCj, the third transistor T3 may be turned on. The first transistor T1 may be connected in the diode configuration by the third transistor T3 and may be forward biased. The first activation period AP1 may not overlap the second activation period AP2.

The j-th write scan signal SWj may be activated within the second activation period AP2. The j-th write scan signal SWj may have a low level during an activation period AP4 (hereinafter, referred to as a fourth activation period). The second transistor T2 may be turned on in response to the j-th write scan signal SWj having the low level during the fourth activation period AP4. Then, a compensation voltage "Di-Vth" reduced by a threshold voltage Vth of the first transistor T1 from the i-th data signal Di provided through the i-th data line DLi may be applied to the third electrode of the first transistor T1. That is, an electric potential of the third electrode of the first transistor T1 may be the compensation voltage "Di-Vth". The fourth activation period AP4 may overlap the second activation period AP2. A duration of the second activation period AP2 may be greater than a duration of the fourth activation period AP4.

The first driving voltage ELVDD and the compensation voltage "Di-Vth" may be respectively applied to both ends of the capacitor Cst, and the capacitor Cst may be charged with electric charges corresponding to a difference in voltage between the both ends of the capacitor Cst. A high level period of the j-th compensation scan signal SCj may be referred to as a compensation period of the red pixel PXR.

Meanwhile, the j-th black scan signal SBj may be activated within the second activation period AP2 of the j-th compensation scan signal SCj. The j-th black scan signal SBj may have the low level during an activation period AP3 (hereinafter, referred to as a third activation period). During the third activation period AP3, the fifth transistor T5 may be turned on in response to the j-th black scan signal SBj having the low level and applied thereto through the j-th black scan line SBLj. A portion of the driving current Id may be bypassed as a bypass current Ibp via the fifth transistor T5. The third activation period AP3 may overlap the second activation period AP2. The duration of the second activation period AP2 may be greater than a duration of the third activation period AP3. The third activation period AP3 may precede the fourth activation period AP4 and may not overlap the fourth activation period AP4.

In a case where the red pixel PXR displays a black image, when the red light emitting element ED_R emits a light even though a minimum driving current of the first transistor T1 flows as the driving current Id, the red pixel PXR may not properly display the black image. Therefore, the fifth transistor T5 of the red pixel PXR according to some embodiments of the present disclosure may distribute a portion of the minimum driving current of the first transistor T1 to another current path as the bypass current Ibp rather than a current path to the red light emitting element ED_R. In this case, the minimum driving current of the first transistor T1 may mean a current flowing to the first transistor T1 under a condition that a gate-source voltage Vgs of the first transistor T1 is less than the threshold voltage Vth and the first transistor T1 is turned off. In this way, when the minimum driving current, which flows to the first transistor T1 under the condition that the first transistor T1 is turned off, for example, a current of less than about 10 pA, is transmitted to the red light emitting element ED_R, an image with a black grayscale may be displayed. In the case where the red pixel PXR displays the black image, an influence of the bypass current Ibp with respect to the minimum driving current is relatively large, however, in the case where images, such as a normal image or a white image, are displayed, the influence of the bypass current Ibp with respect to the driving current Id may be negligible. Accordingly, when the black image is displayed, a current, i.e., a light emitting current Ied, reduced by an amount of the bypass current Ibp, which is bypassed through the fifth transistor T5, from the driving current Id may be provided to the red light emitting element ED_R, and thus, the black image may be clearly displayed. Thus, the red pixel PXR may display an accurate black grayscale image using the fifth transistor T5, and as a result, a contrast ratio may be improved.

Then, a level of the j-th light emission control signal EMj provided from the j-th light emission control line EMLj may be changed to the low level from the high level. The first and second light emission control transistors ET1 and ET2 may be turned on in response to the j-th light emission control signal EMj having the low level. As a result, the driving current Id may be generated due to a difference in voltage between the voltage of the third electrode of the first transistor T1 and the first driving voltage ELVDD, the driving current Id may be supplied to the red light emitting element ED_R via the second light emission control transistor ET2, and thus, the light emitting current Ied may flow through the red light emitting element ED_R.

Referring to FIG. 5A again, the sensor FX may be connected to a d-th read-out line RLd among the read-out lines RL1 to RLh, the j-th write scan line SWLj, and a reset control line RCL.

The sensor FX may include the light sensing unit LSU and the sensor driving circuit O_SD. The light sensing unit LSU may include k light receiving elements connected to each other in parallel. When k is two, the first and second light receiving elements OPD1 and OPD2 may be connected to each other in parallel. When k is four, the first to fourth light receiving elements OPD1 to OPD4 (refer to FIG. 4B) may be connected to each other in parallel. Each of the first and second light receiving elements OPD1 and OPD2 may be the photodiode. As an example, each of the first and second light receiving elements OPD1 and OPD2 may be an organic photodiode including an organic material as the photoelectric conversion layer.

The first and second sensing anode electrodes O_AE1 and O_AE2 (refer to FIG. 4A) of the first and second light receiving elements OPD1 and OPD2 may be connected to a first sensing node SN1, and first and second sensing cathode electrodes of the first and second light receiving elements OPD1 and OPD2 may be connected to the second driving voltage line VL2 transmitting the second driving voltage ELVSS. The first and second sensing cathode electrodes may be electrically connected to the cathode electrodes of the light emitting elements ED_R, ED_G1, ED_G2, and ED_B (refer to FIG. 4A). As an example, the first and second sensing cathode electrodes may be provided integrally with the cathode electrodes of the light emitting elements ED_R, ED_G1, ED_G2, and ED_B and thus may form a common cathode electrode C_CE (refer to FIG. 7D).

The sensor driving circuit O_SD may include three transistors ST1, ST2, and ST3. The three transistors ST1 to ST3 may be a reset transistor ST1, an amplification transistor ST2, and an output transistor ST3, respectively. At least one of the reset transistor ST1, the amplification transistor ST2, or the output transistor ST3 may be an oxide semiconductor transistor. As an example, the reset transistor ST1 may be the oxide semiconductor transistor, and the amplification transistor ST2 and the output transistor ST3 may be the LTPS transistor, however, the present disclosure should not be limited thereto or thereby. According to some embodiments, at least the reset transistor ST1 and the output transistor ST3 may be the oxide semiconductor transistor, and the amplification transistor ST2 may be the LTPS transistor.

In addition, some of the reset transistor ST1, the amplification transistor ST2, and the output transistor ST3 may be the P-type transistor, and the other transistors may be the N-type transistor. As an example, the amplification transistor ST2 and the output transistor ST3 may be the PMOS transistor, and the reset transistor ST1 may be the NMOS transistor, however, the present disclosure should not be limited thereto or thereby. According to some embodiments, all the reset transistor ST1, the amplification transistor ST2, and the output transistor ST3 may be the N-type transistor or the P-type transistor.

One transistor, for example, the reset transistor ST1, or more among the reset transistor ST1, the amplification transistor ST2, and the output transistor ST3 may be the same type of transistor as the third and fourth transistors T3 and T4 of the red pixel PXR. The amplification transistor ST2 and the output transistor ST3 may be the same type of transistor as the first, second, and fifth transistors T1, T2, and T5 and the first and second light emission control transistors ET1 and ET2 of the red pixel PXR.

The circuit structure of the sensor driving circuit O_SD should not be limited to that shown in FIG. 5A. The sensor driving circuit O_SD shown in FIG. 5A is merely an example, and the circuit structure of the sensor driving circuit O_SD may be changed in various ways.

The reset transistor ST1 may include a first electrode receiving a reset voltage Vrst, a second electrode connected to the first sensing node SN1, and a third electrode receiving a reset control signal RST. The reset transistor ST1 may reset an electric potential of the first sensing node SN1 to the reset voltage Vrst in response to the reset control signal RST. The reset control signal RST may be a signal provided through the reset control line RCL, however, the present disclosure should not be limited thereto or thereby. Alternatively, the reset control signal RST may be the j-th compensation scan signal SCj provided through the j-th compensation scan line SCLj. That is, the reset transistor ST1 may receive the j-th compensation scan signal SCj provided through the j-th compensation scan line SCLj as the reset control signal RST. As an example, the reset voltage Vrst may have a voltage level lower than that of the second driving voltage ELVSS at least during an activation period of the reset control signal RST. The reset voltage Vrst may be a DC voltage maintained at a voltage level lower than that of the second driving voltage ELVSS.

The reset transistor ST1 may include a plurality of sub-reset transistors connected to each other in series. As an example, the reset transistor ST1 may include two sub-reset transistors (hereinafter, first and second sub-reset transistors). In this case, a third electrode of the first sub-reset transistor and a third electrode of the second sub-reset transistor may be connected to the reset control line RCL. In addition, a second electrode of the first sub-reset transistor and a first electrode of the second sub-reset transistor may be electrically connected to each other. In addition, the reset voltage Vrst may be applied to a first electrode of the first sub-reset transistor, and a second electrode of the second sub-reset transistor may be electrically connected to the first sensing node SN1. However, the number of sub-reset transistors should not be limited thereto or thereby.

The amplification transistor ST2 may include a first electrode receiving a sensing driving voltage SLVD, a second electrode connected to a second sensing node SN2, and a third electrode connected to the first sensing node SN1. The amplification transistor ST2 may be turned on depending on the electric potential of the first sensing node SN1 and may apply the sensing driving voltage SLVD to the second sensing node SN2. As an example, the sensing driving voltage SLVD may be one of the first driving voltage ELVDD and the first and second initialization voltages VINT1 and VINT2. When the sensing driving voltage SLVD is the first driving voltage ELVDD, the first electrode of the amplification transistor ST2 may be electrically connected to the first driving voltage line VL1. When the sensing driving voltage SLVD is the first initialization voltage VINT1, the first electrode of the amplification transistor ST2 may be electrically connected to the first initialization voltage line VL3, and when the sensing driving voltage SLVD is the second initialization voltage VINT2, the first electrode of the amplification transistor ST2 may be electrically connected to the second initialization voltage line VL4.

The output transistor ST3 may include a first electrode connected to the second sensing node SN2, a second electrode connected to the d-th read-out line RLd, and a third electrode receiving an output control signal. The output transistor ST3 may apply a sensing signal FSd to the d-th read-out line RLd in response to the output control signal. The output control signal may be the j-th write scan signal SWj provided through the j-th write scan line SWLj. That is, the output transistor ST3 may receive the j-th write scan signal SWj provided through the j-th write scan line SWLj as the output control signal.

The light sensing unit LSU of the sensor FX may be exposed to a light during a light emitting period of the light emitting elements ED_R, ED_G1, ED_G2, and ED_B. The light may be emitted from one of the light emitting elements ED_R, ED_G1, ED_G2, and ED_B.

When the user's hand US_F (refer to FIG. 1) touches the display surface IS (refer to FIG. 1), the first and second light receiving elements OPD1 and OPD2 may generate photo-charges corresponding to the light reflected by ridges of the user's fingerprint or valleys between the ridges of the user's fingerprint, and the generated photo-charges may be accumulated in the first sensing node SN1.

The amplification transistor ST2 may be a source follower amplifier that generates a source-drain current in proportion to an amount of electric charge of the first sensing node SN1 input to the third electrode.

During the fourth activation period AP4, the j-th write scan signal SWj having the low level may be applied to the output transistor ST3 via the j-th write scan line SWLj. When the output transistor ST3 is turned on in response to the j-th write scan signal SWj having the low level, the sensing signal FSd corresponding to a current flowing through the amplification transistor ST2 may be output to the d-th read-out line RLd.

Then, when the reset control signal RST having the high level is provided through the reset control line RCL during a reset period, the reset transistor ST1 may be turned on. The reset period may be defined as an activation period of the reset control line RCL, i.e., a high level period. Alternatively, when the reset transistor ST1 is the PMOS transistor, the reset control signal RST having the low level may be applied to the reset control line RCL during the reset period. During the reset period, the first sensing node SN1 may be reset to an electric potential corresponding to the reset voltage Vrst. As an example, the reset voltage Vrst may have a voltage level lower than that of the second driving voltage ELVSS.

Then, when the reset period is finished, the light sensing unit LSU may generate photo-charges corresponding to the light provided thereto, and the generated photo-charges may be accumulated in the first sensing node SN1.

Figure 6A:
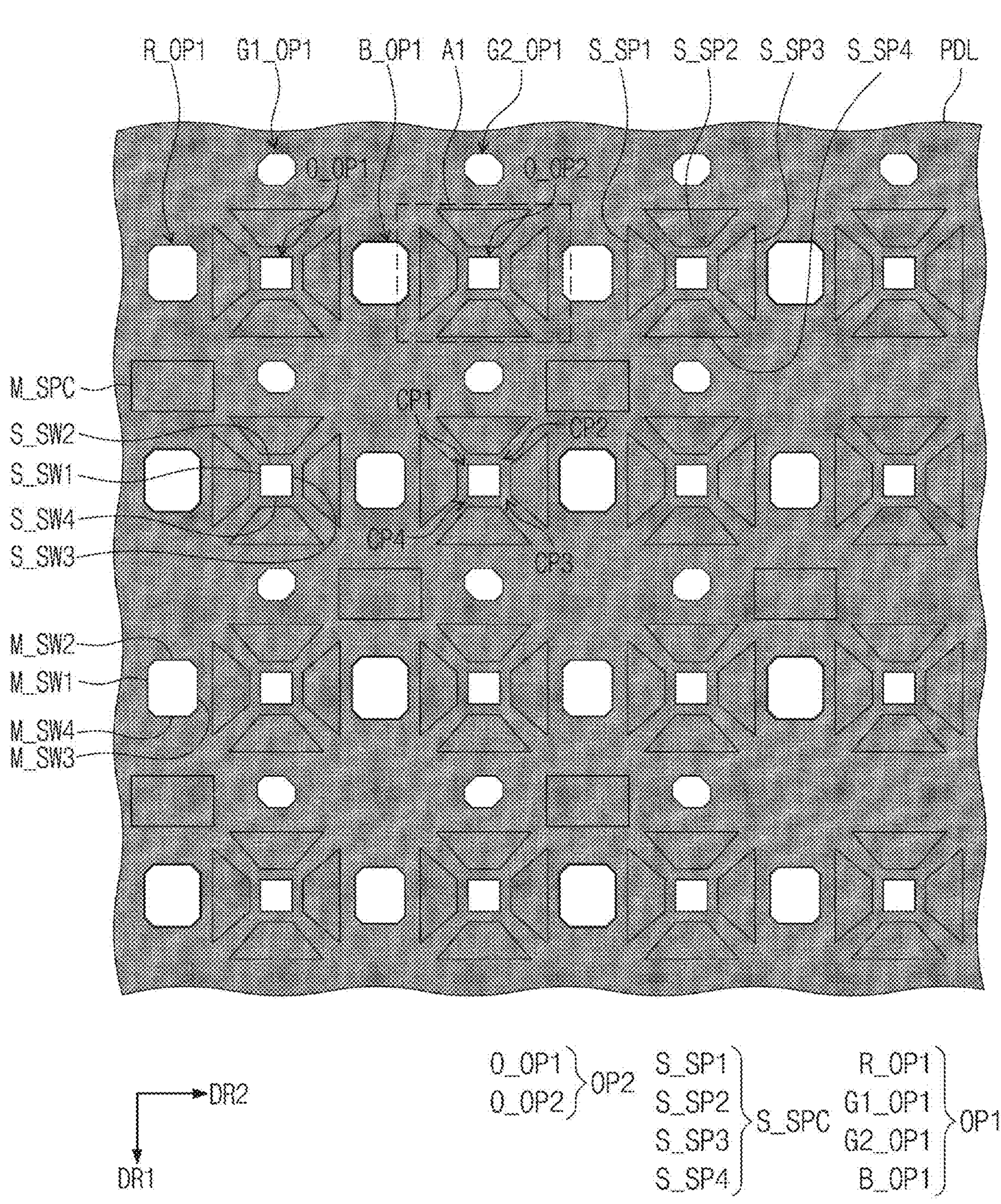
FIG. 6A is a plan view of a pixel definition layer, a main spacer layer, and a disconnected spacer layer according to some embodiments of the present disclosure.
Figure 6B:
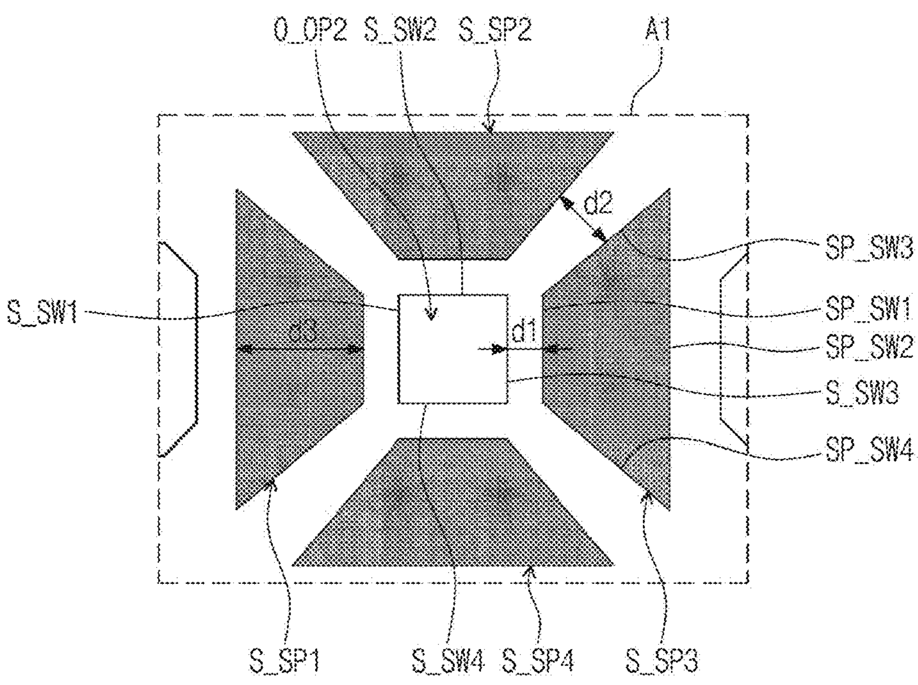
FIGS. 6B and 6C are enlarged plan views of a portion A1 shown in FIG. 6A.
Figure 6C:
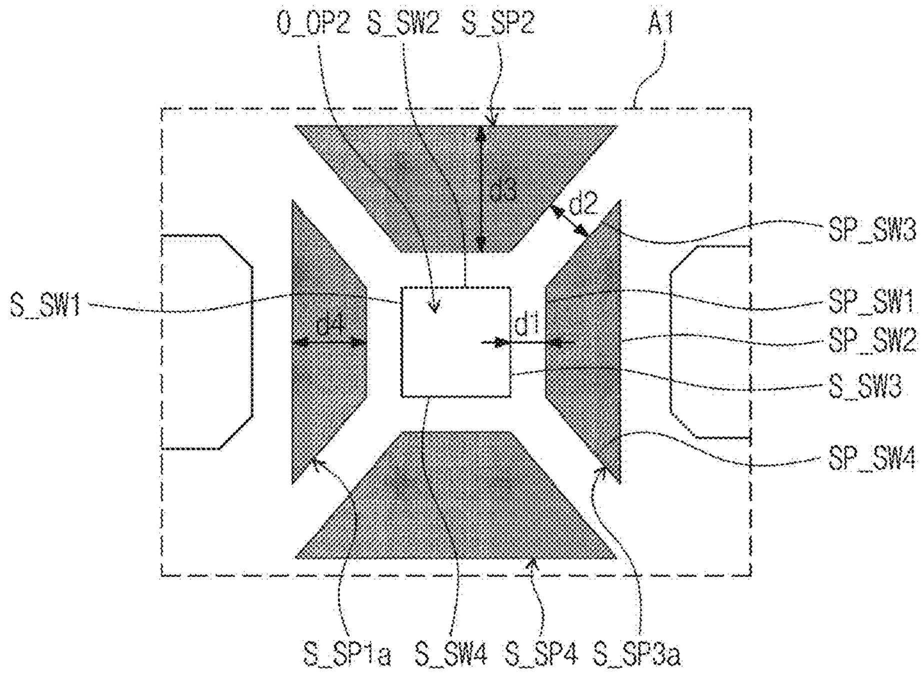
Figure 6D:
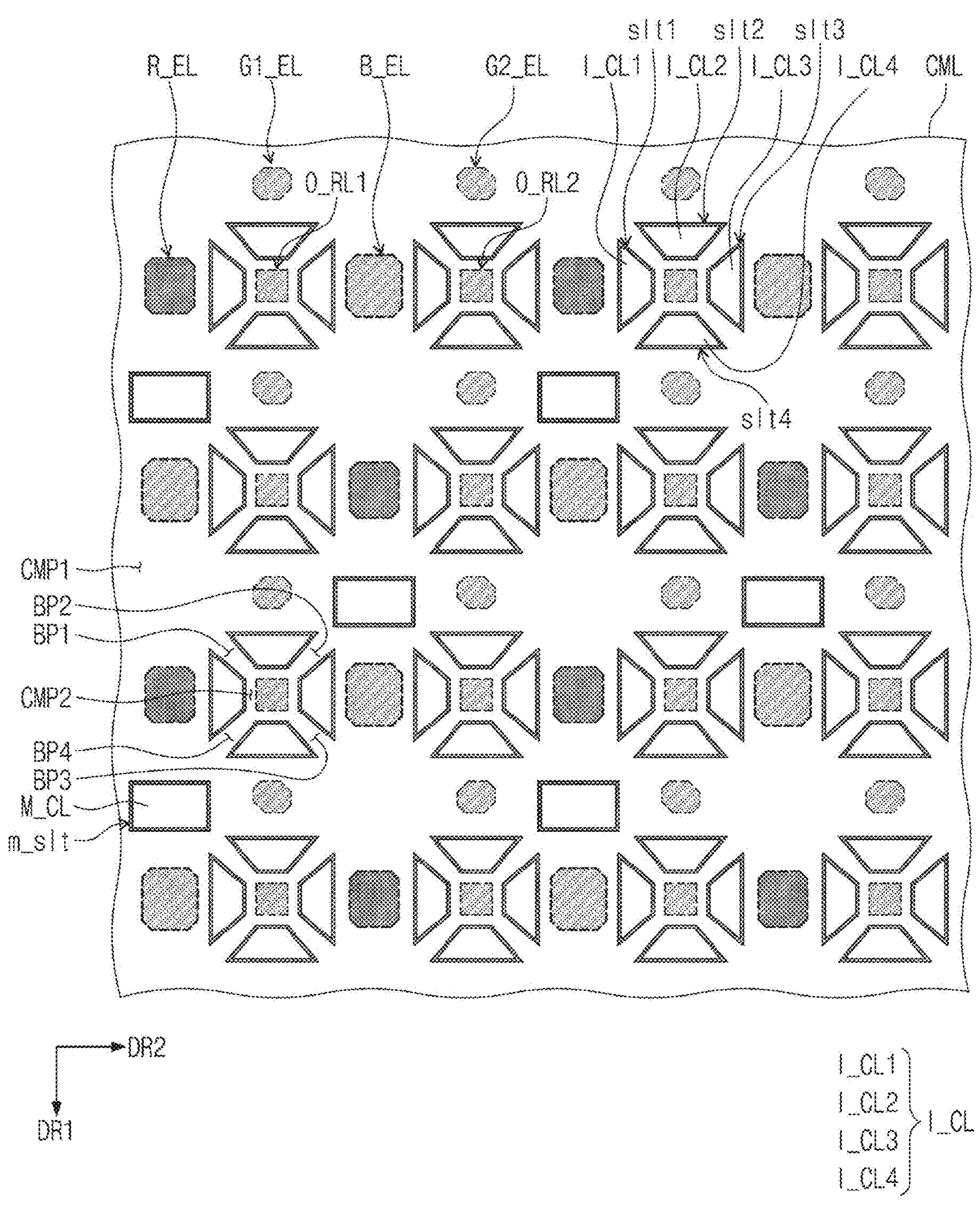
FIG. 6D is a plan view of a common layer, a light emitting layer, and a photoelectric conversion layer according to some embodiments of the present disclosure.
Figure 7A:
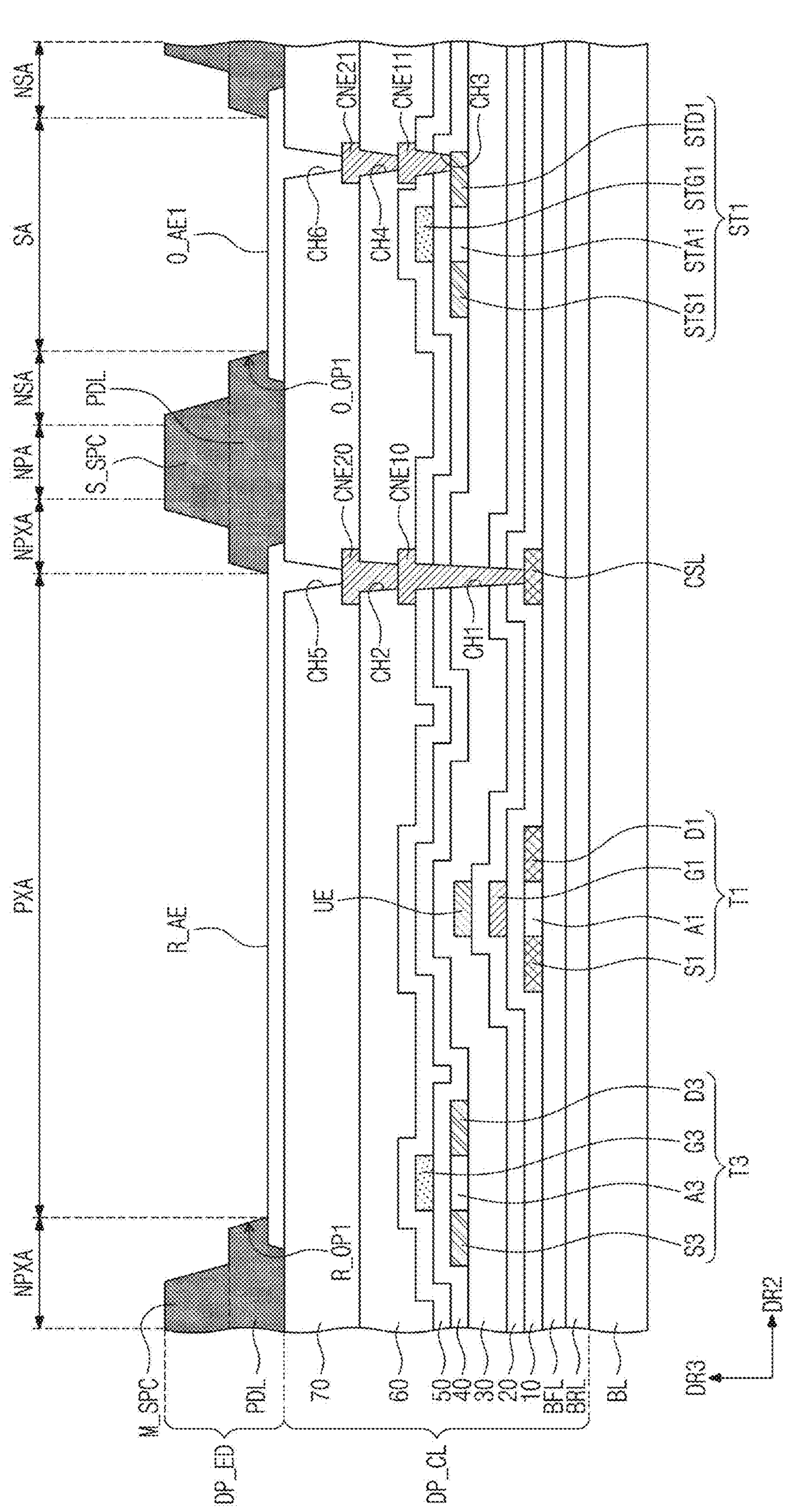
FIG. 7A is a cross-sectional view of the pixel definition layer, the main spacer layer, and the disconnected spacer layer shown in FIG. 6A.
Figure 7B:
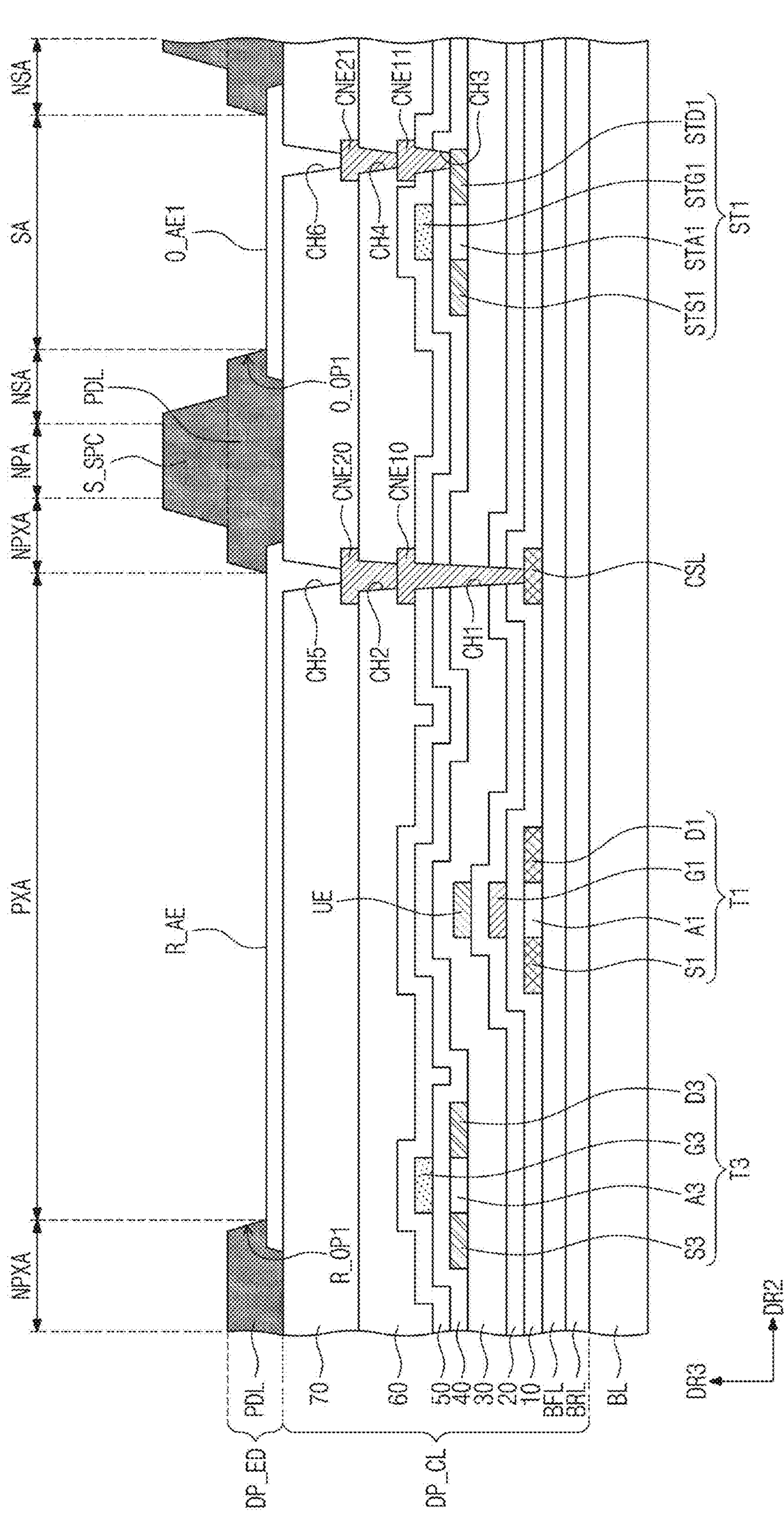
FIG. 7B is a cross-sectional view of a pixel definition layer and a disconnected spacer layer.
Figure 7C:
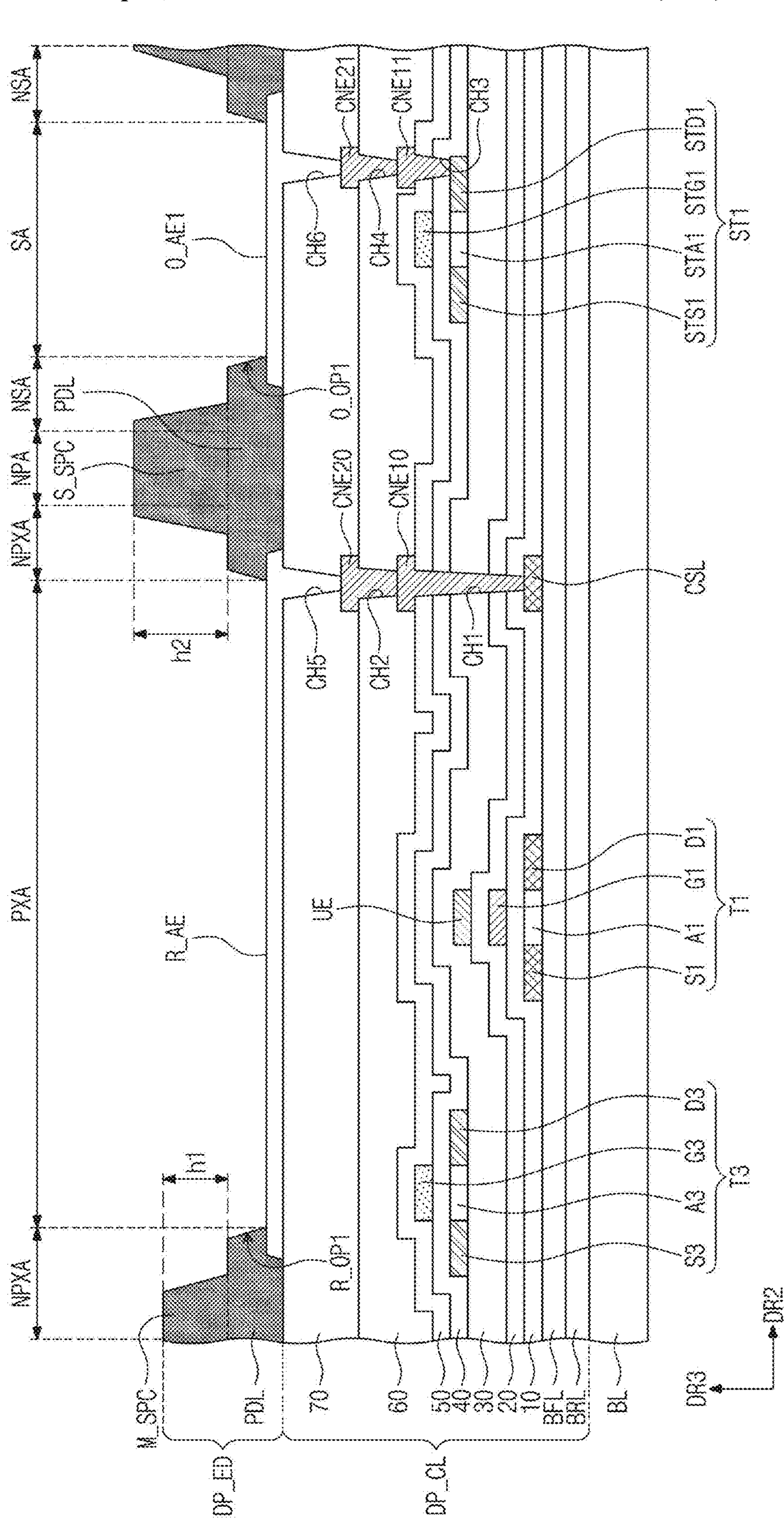
FIG. 7C is a cross-sectional view of a pixel definition layer, a main spacer layer, and a disconnected spacer layer.
Figure 7D:
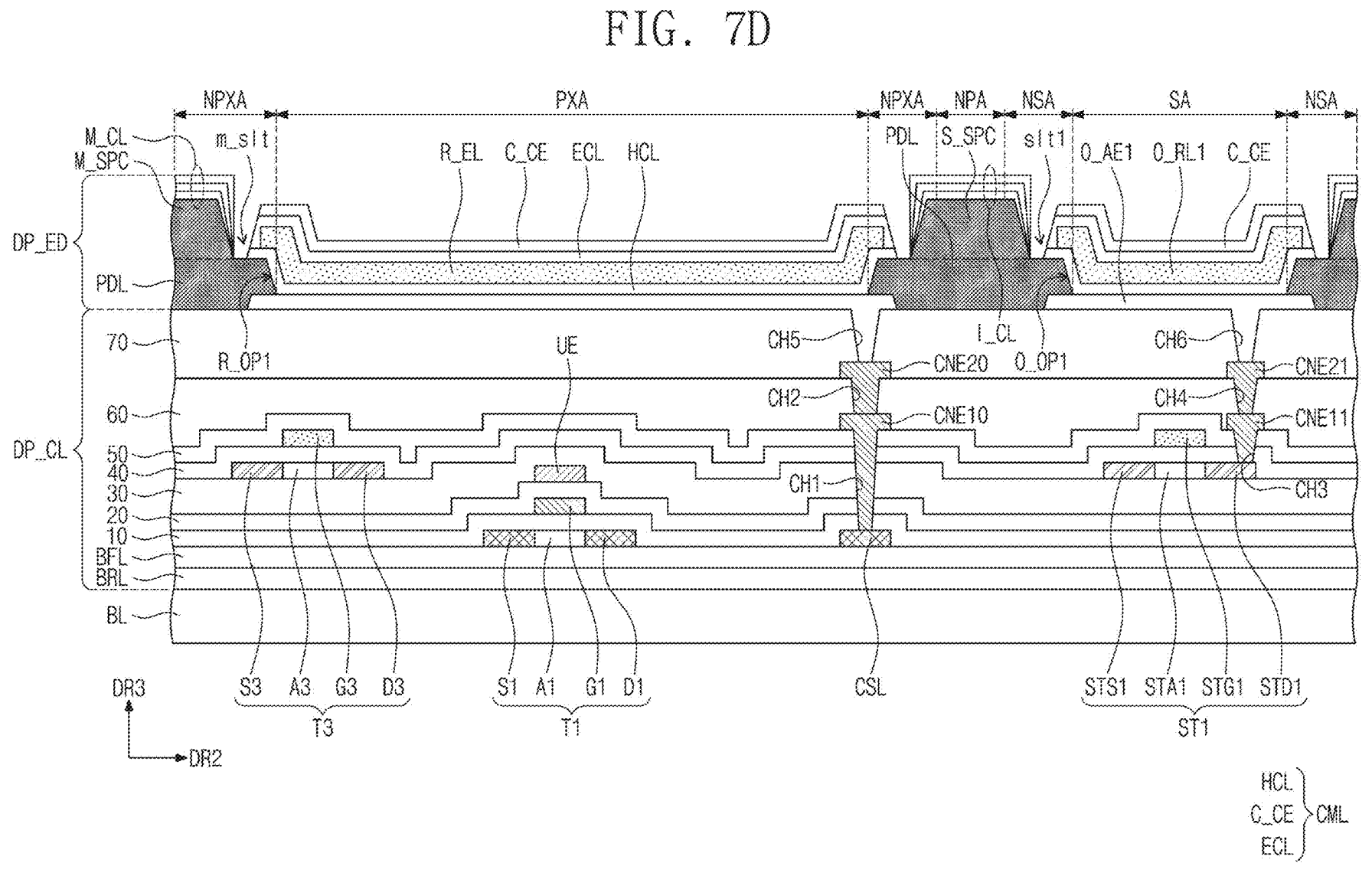

FIG. 6A is a plan view of a pixel definition layer PDL, a main spacer layer M_SPC, and a disconnected spacer layer S_SPC according to some embodiments of the present disclosure, FIGS. 6B and 6C are enlarged plan views of a portion A1 shown in FIG. 6A, and FIG. 6D is a plan view of a common layer CML, a light emitting layer, and a photoelectric conversion layer according to some embodiments of the present disclosure. FIG. 7A is a cross-sectional view of the pixel definition layer PDL, the main spacer layer M_SPC, and the disconnected spacer layer S_SPC shown in FIG. 6A, FIG. 7B is a cross-sectional view of the pixel definition layer and the disconnected spacer layer, FIG. 7C is a cross-sectional view of the pixel definition layer PDL, the main spacer layer M_SPC, and the disconnected spacer layer S_SPC, and FIG. 7D is a cross-sectional view of the common layer CML, the light emitting layer, and the photoelectric conversion layer shown in FIG. 6D.

Referring to FIGS. 6A, 6B, and 7A, the display panel DP may include the base layer BL, the circuit layer DP_CL, the pixel definition layer PDL, the main spacer layer M_SPC, and the disconnected spacer layer S_SPC.

The base layer BL may include a synthetic resin layer. The synthetic resin layer may include a heat-curable resin. The synthetic resin layer may include a polyimide-based resin, however, a material for the synthetic resin layer should not be particularly limited. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, or a perylene-based resin. According to some embodiments, the base layer BL may include a glass substrate, a metal substrate, or an organic/inorganic composite material substrate.

At least one inorganic layer may be located on an upper surface of the base layer BL. The inorganic layer may include at least one of aluminum oxide, titanium oxide, silicon oxide, silicon nitride, silicon oxynitride, zirconium oxide, or hafnium oxide. The inorganic layer may be formed in multiple layers. The inorganic layers may form a barrier layer BRL and/or a buffer layer BFL. According to some embodiments, the buffer layer BFL and the barrier layer BRL may be selectively formed.

The circuit layer DP_CL may include the barrier layer BRL and/or the buffer layer BFL. The barrier layer BRL may prevent a foreign substance from entering from the outside. The barrier layer BRL may include a silicon oxide layer and a silicon nitride layer. Each of the silicon oxide layer and the silicon nitride layer may be provided in plural, and the silicon oxide layers may be alternately stacked with the silicon nitride layers.

The buffer layer BFL may be located on the barrier layer BRL. The buffer layer BFL may increase an adhesion between the base layer BL and a semiconductor pattern or between the base layer BL and a conductive pattern. According to some embodiments, the buffer layer BFL may include a silicon oxide layer and a silicon nitride layer. The silicon oxide layer and the silicon nitride layer may be alternately stacked one on another.

The semiconductor pattern may be located on the buffer layer BFL. Hereinafter, the semiconductor pattern located directly on the buffer layer BFL may be referred to as a first semiconductor pattern. The first semiconductor pattern may include a silicon semiconductor. The first semiconductor pattern may include polysilicon, however, embodiments according to the present disclosure are not limited thereto or thereby. According to some embodiments, the first semiconductor pattern may include amorphous silicon.

FIG. 7A shows only a portion of the first semiconductor pattern, and the first semiconductor pattern may be further arranged in other areas of the pixel PXR (refer to FIG. 5A). The first semiconductor pattern may have different electrical properties depending on whether it is doped or not or whether it is doped with an N-type dopant or a P-type dopant. The first semiconductor pattern may include a doped region and a non-doped region. The doped region may be doped with the N-type dopant or the P-type dopant. A P-type transistor may include a doped region doped with the P-type dopant, and an N-type transistor may include a doped region doped with the N-type dopant.

The doped region may have a conductivity greater than that of the non-doped region and may substantially serve as an electrode or signal line. The non-doped region may substantially correspond to an active (or a channel) of the transistor. In other words, a portion of the first semiconductor pattern may be the active of the transistor, another portion of the first semiconductor pattern may be a source or a drain of the transistor, and the other portion of the first semiconductor pattern may be a connection signal line or a connection electrode.

As shown in FIG. 7A, a first electrode S1, a channel portion A1, and a second electrode D1 of the first transistor T1 may be formed from the first semiconductor pattern. The first electrode S1 and the second electrode D1 of the first transistor T1 may extend in opposite directions to each other from the channel portion A1.

FIG. 7A shows a portion of a connection signal line CSL formed from the semiconductor pattern. According to some embodiments, the connection signal line CSL may be connected to the second electrode of the second light emission control transistor ET2 (refer to FIG. 5A) when viewed in a plane.

A first insulating layer 10 may be located on the buffer layer BFL. The first insulating layer 10 may commonly overlap the pixels PX (refer to FIG. 3) and may cover the first semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon oxynitride, zirconium oxide, or hafnium oxide. According to some embodiments, the first insulating layer 10 may have a single-layer structure of a silicon oxide layer. Not only the first insulating layer 10, but also an insulating layer of the circuit layer DP_CL described later may be an inorganic layer and/or an organic layer and may have a single-layer or multi-layer structure. The inorganic layer may include at least one of the abovementioned materials, however, embodiments according to the present disclosure are not limited thereto or thereby.

A third electrode G1 of the first transistor T1 may be located on the first insulating layer 10. The third electrode G1 may be a portion of a metal pattern. The third electrode G1 of the first transistor T1 may overlap the channel portion A1 of the first transistor T1. The third electrode G1 of the first transistor T1 may be used as a mask in a process of doping the first semiconductor pattern.

A second insulating layer 20 may be located on the first insulating layer 10 and may cover the third electrode G1. The second insulating layer 20 may commonly overlap the pixels PX. The second insulating layer 20 may be an inorganic layer and/or an organic layer and may have a single-layer or multi-layer structure. According to some embodiments, the second insulating layer 20 may have a single-layer structure of a silicon oxide layer.

An upper electrode UE may be located on the second insulating layer 20. The upper electrode UE may overlap the third electrode G1. The upper electrode UE may be a portion of the metal pattern or a portion of the doped semiconductor pattern. A portion of the third electrode G1 and the upper electrode UE overlapping the portion of the third electrode G1 may define the capacitor Cst (refer to FIG. 5A). According to some embodiments, the upper electrode UE may be omitted.

According to some embodiments, the second insulating layer 20 may be replaced with an insulating pattern. The upper electrode UE may be located on the insulating pattern. The upper electrode UE may serve as a mask in the process of forming the insulating pattern from the second insulating layer 20.

A third insulating layer 30 may be located on the second insulating layer 20 to cover the upper electrode UE. The third insulating layer 30 may have a single-layer structure of a silicon oxide layer. The semiconductor pattern may be located on the third insulating layer 30. Hereinafter, the semiconductor pattern located directly on the third insulating layer 30 may be referred to as a second semiconductor pattern. The second semiconductor pattern may include metal oxide. The oxide semiconductor may include a crystalline or amorphous oxide semiconductor. As an example, the oxide semiconductor may include the metal oxide of metals, such as zinc (Zn), indium (In), gallium (Ga), tin (Sn), titanium (T1), etc., or a mixture of the metal, such as zinc (Zn), indium (In), gallium (Ga), tin (Sn), titanium (T1), etc., and oxides thereof. The oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO), or the like.

FIG. 7A shows only a portion of the second semiconductor pattern, and the second semiconductor pattern may be further arranged in other areas of the red pixel PXR (refer to FIG. 5A). The second semiconductor pattern may include a plurality of areas distinguished from each other depending on whether the metal oxide is reduced or not. An area (hereinafter, referred to as a reduced area) where the metal oxide is reduced may have a conductivity higher than that of an area (hereinafter, referred to as a non-reduced area) where the metal oxide is not reduced. The reduced area may substantially act as the electrode or the signal line. The non-reduced area may substantially correspond to the channel portion of the transistor. In other words, a portion of the second semiconductor pattern may be the channel portion of the transistor, and the other portion of the second semiconductor pattern may be the source or the drain of the transistor.

Referring to FIG. 7A, a first electrode S3, a channel portion A3, and a second electrode D3 of the third transistor T3 may be formed from the second semiconductor pattern. The first electrode S3 and the second electrode D3 may include a metal reduced from a metal oxide semiconductor. The first electrode S3 and the second electrode D3 may include a metal layer having a thickness (e.g., a set or predetermined thickness) from an upper surface of the second semiconductor pattern and containing the reduced metal.

A fourth insulating layer 40 may be located on the third insulating layer 30 to cover the second semiconductor pattern. According to some embodiments, the fourth insulating layer 40 may have a single-layer structure of a silicon oxide layer. A third electrode G3 of the third transistor T3 may be located on the fourth insulating layer 40. The third electrode G3 may be a portion of a metal pattern. The third electrode G3 of the third transistor T3 may overlap the channel portion A3 of the third transistor T3.

According to some embodiments, the fourth insulating layer 40 may be replaced with an insulating pattern. The third electrode G3 of the third transistor T3 may be located on the insulating pattern. According to some embodiments, the third electrode G3 may have substantially the same shape as that of the insulating pattern when viewed in a plane. For the convenience of explanation, one third electrode G3 is shown, however, the third transistor T3 may include two third electrodes.

A fifth insulating layer 50 may be located on the fourth insulating layer 40 to cover the third electrode G3. The fifth insulating layer 50 may include a silicon oxide layer and a silicon nitride layer. According to some embodiments, the fifth insulating layer 50 may include silicon oxide layers alternately stacked with silicon nitride layers.

According to some embodiments, the first and second electrodes of the fourth transistor T4 (refer to FIG. 5A) may be formed through the same process as the first electrode S3 and the second electrode D3 of the third transistor T3.

The circuit layer DP_CL may further include a portion of the semiconductor pattern of the sensor driving circuit O_SD (refer to FIG. 5A). For the convenience of explanation, the reset transistor ST1 of the semiconductor pattern of the sensor driving circuit O_SD is shown. A first electrode STS1, a channel portion STA1, and a second electrode STD1 of the reset transistor ST1 may be formed from a third semiconductor pattern. As an example, the third semiconductor pattern may include the same metal oxide as the second semiconductor pattern of the third transistor T3. The third semiconductor pattern may be formed through the same process as the second semiconductor pattern. The first electrode STS1 and the second electrode STD1 of the reset transistor ST1 may include a metal reduced from a metal oxide semiconductor. The first electrode STS1 and the second electrode STD1 may include a metal layer having a thickness (e.g., a set or predetermined thickness) from an upper surface of the third semiconductor pattern and may include a metal layer containing the reduced metal.

The fourth insulating layer 40 may be arranged to cover the first electrode STS1, the channel portion STA1, and the second electrode STD1 of the reset transistor ST1. A third electrode STG1 of the reset transistor ST1 may be located on the fourth insulating layer 40. According to some embodiments, the third electrode STG1 of the reset transistor ST1 may be a portion of a metal pattern. The third electrode STG1 of the reset transistor ST1 may overlap the channel portion STA1 of the reset transistor ST1. According to some embodiments, one third electrode STG1 is shown for the convenience of explanation, however, the reset transistor ST1 may include two third electrodes.

As an example, the reset transistor ST1 may be located on the same layer as a layer on which the third transistor T3 is located. That is, the first electrode STS1, the channel portion STA1, and the second electrode STD1 of the reset transistor ST1 may be formed through the same processes as those of the first electrode S3, the channel portion A3, and the second electrode D3 of the third transistor T3. According to some embodiments, the first and second electrodes of the amplification transistor ST2 and the output transistor ST3 of the sensor driving circuit O_SD may be formed through the same processes as those of the first electrode S1 and the second electrode D1 of the first transistor T1. As described above, since the sensor driving circuit O_SD is formed through the process of forming the pixel driving circuits R_PD, G1_PD G2_PD, B_PD (refer to FIG. 4A), no additional processes are required to form the sensor driving circuit O_SD, and thus, a process efficiency may be improved.

At least one insulating layer may be further located on the fifth insulating layer 50. A sixth insulating layer 60 and a seventh insulating layer 70 may be located on the fifth insulating layer 50. Each of the sixth insulating layer 60 and the seventh insulating layer 70 may be an organic layer and may have a single-layer or multi-layer structure. Each of the sixth insulating layer 60 and the seventh insulating layer 70 may have a single-layer structure of a polyimide-based resin layer, however, they should not be limited thereto or thereby. According to some embodiments, each of the sixth insulating layer 60 and the seventh insulating layer 70 may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, or a perylene-based resin.

A first connection electrode CNE10 may be located on the fifth insulating layer 50. The first connection electrode CNE10 may be connected to the connection signal line CSL through a first contact hole CH1 defined through the first to fifth insulating layers 10 to 50, and a second connection electrode CNE20 may be connected to the first connection electrode CNE10 through a second contact hole CH2 defined through the sixth insulating layer 60. According to some embodiments of the present disclosure, at least one of the fifth, sixth, or seventh insulating layers 50, 60, or 70 may be omitted.

A third connection electrode CNE11 may be further located on the fifth insulating layer 50. The third connection electrode CNE11 may be connected to the third electrode STD1 of the reset transistor ST1 via a third contact hole CH3 defined through the fourth and fifth insulating layers 40 and 50, and a fourth connection electrode CNE21 may be connected to the third connection electrode CNE11 via a fourth contact hole CH4 defined through the sixth insulating layer 60.

The element layer DP_ED may be located on the circuit layer DP_CL. The element layer DP_ED may include the red anode electrode R_AE, the first and second green anode electrodes G1_AE and G2_AE (refer to FIG. 4A), the blue anode electrode B_AE (refer to FIG. 4A), and the first and second sensing anode electrodes O_AE1 and O_AE2 (refer to FIG. 4A). As shown in FIG. 7A, the red anode electrode R_AE may be connected to the second connection electrode CNE20 via a fifth contact hole CH5 defined through the seventh insulating layer 70. The first sensing anode electrode O_AE1 may be connected to the fourth connection electrode CNE21 via a sixth contact hole CH6 defined through the seventh insulating layer 70.

The element layer DP_ED may further include the pixel definition layer PDL located on the circuit layer DP_CL. The pixel definition layer PDL may be provided with light emitting openings OP1 defined therethrough to correspond to the light emitting elements ED_R, ED_G1, ED_G2, and ED_B and light receiving openings OP2 defined therethrough to correspond to the light receiving elements OPD1 and OPD2. The light emitting openings OP1 may include a red opening R_OP1, a first green opening G1_OP1, a second green opening G2_OP1, and a blue opening B_OP1. At least a portion of the red anode electrode R_AE of the red light emitting element ED_R may be exposed through the red opening R_OP1. At least a portion of the first green anode electrode G1_AE of the first green light emitting element ED_G1 may be exposed through the first green opening G1_OP1. At least a portion of the second green anode electrode G2_AE of the second green light emitting element ED_G2 may be exposed through the second green opening G2_OP1. At least a portion of the blue anode electrode B_AE of the blue light emitting element ED_B may be exposed through the blue opening B_OP1.

Each light emitting opening OP1 of the pixel definition layer PDL may define a light emitting area PXA. For instance, the pixels PX (refer to FIG. 3) may be arranged according to a certain rule on the plane of the display panel DP (refer to FIG. 3). Areas in which the pixels PX are arranged may be referred to as pixel areas, and one pixel area may include a light emitting area PXA and a non-light-emitting area NPXA adjacent to the light emitting area PXA. The non-light-emitting area NPXA may surround the light emitting area PXA.

The light receiving openings OP2 may include a first light receiving opening O_OP1 and a second light receiving opening O_OP2. The first light receiving opening O_OP1 may expose the first sensing anode electrode O_AE1 of the first light receiving element OPD1 (refer to FIG. 4A), and the second light receiving opening O_OP2 may expose the second sensing anode electrode O_AE2 of the second light receiving element OPD2 (refer to FIG. 4A).

Each of the light receiving openings OP2 of the pixel definition layer PDL may define a light receiving area SA. For instance, the sensors FX (refer to FIG. 3) may be arranged according to a certain rule on the display panel DP when viewed in the plane. Areas in which the sensors FX are arranged may be referred to as sensing areas, and one sensing area may include the light receiving area SA and a non-light-receiving area NSA adjacent to the light receiving area SA. The non-light-receiving area NSA may surround the light receiving area SA.

As an example, the main spacer layer M_SPC and the disconnected spacer layer S_SPC may be located on the pixel definition layer PDL. FIGS. 6A and 7A show a structure in which the main spacer layer M_SPC and the disconnected spacer layer S_SPC are located on the pixel definition layer PDL, however, the present disclosure should not be limited thereto or thereby. As shown in FIG. 7B, only the disconnected spacer layer S_SPC may be located on the pixel definition layer PDL, and the main spacer layer M_SPC may be omitted. In addition, the main spacer layer M_SPC and the disconnected spacer layer S_SPC shown in FIG. 7A may have the same height as each other, however, the present disclosure should not be limited thereto or thereby. Alternatively, as shown in FIG. 7C, the disconnected spacer layer S_SPC may have a height higher than that of the main spacer layer M_SPC based on an upper surface of the pixel definition layer PDL. When the main spacer layer M_SPC has a first height h1, the disconnected spacer layer S_SPC may have a second height h2 greater than the first height h1.

The main spacer layer M_SPC and the disconnected spacer layer S_SPC may be provided integrally with the pixel definition layer PDL. That is, the main spacer layer M_SPC and the disconnected spacer layer S_SPC may be substantially simultaneously formed in the process of patterning the pixel definition layer PDL to define the light emitting openings OP1 and the light receiving openings OP2 through the pixel definition layer PDL.

The pixel definition layer PDL may include a plurality of main sidewalls defining each light emitting opening OP1 and a plurality of sub-sidewalls defining each light receiving opening OP2. The number of the main sidewalls defining each light emitting opening OP1 may be determined by the shape of the light emitting opening. As an example, in a case where each light emitting opening has an octagonal shape, eight main sidewalls may be required to define each light emitting opening OP1. In FIG. 6A, for the convenience of explanation, reference numerals of only four main sidewalls (hereinafter, referred to as first, second, third, and fourth main sidewalls M_SW1, M_SW2, M_SW3, and M_SW4) having relatively long length among the eighth main sidewalls are shown. As an example, each of the first and second light receiving openings O_OP1 and O_OP2 may have a quadrangular shape. In this case, the sub-sidewalls may include first, second, third, and fourth sub-sidewalls S_SW1, S_SW2, S_SW3, and S_SW4. The first and third main sidewalls M_SW1 and M_SW3 may be substantially parallel to the first and third sub-sidewalls S_SW1 and S_SW3 in the first direction DR1, and the second and fourth main sidewalls M_SW2 and M_SW4 may be substantially parallel to the second and fourth sub-sidewalls S_SW2 and S_SW4 in the second direction DR2. Each of the first, second, third, and fourth main sidewalls M_SW1, M_SW2, M_SW3, and M_SW4 may have a length different from a length of each of the first, second, third, and fourth sub-sidewalls S_SW1, S_SW2, S_SW3, and S_SW4. The length of each of the first, second, third, and fourth main sidewalls M_SW1, M_SW2, M_SW3, and M_SW4 may be greater than the length of each of the first, second, third, and fourth sub-sidewalls S_SW1, S_SW2, S_SW3, and S_SW4.

The disconnected spacer layer S_SPC may include first, second, third, and fourth disconnected spacers S_SP1, S_SP2, S_SP3, and S_SP4 located respectively adjacent to the first, second, third, and fourth sub-sidewalls S_SW1, S_SW2, S_SW3, and S_SW4. As an example, each of the first, second, third, and fourth disconnected spacers S_SP1, S_SP2, S_SP3, and S_SP4 may have a trapezoidal shape when viewed in the plane.

The pixel definition layer PDL may further include a plurality of corner portions defined by two sub-sidewalls adjacent to each other and connected to each other among the sub-sidewalls. As an example, the corner portions may include a first corner portion CP1 defined by the first and second sub-sidewalls S_SW1 and S_SW2, a second corner portion CP2 defined by the second and third sub-sidewalls S_SW2 and S_SW3, a third corner portion CP3 defined by the third and fourth sub-sidewalls S_SW3 and S_SW4, and a fourth corner portion CP4 defined by the fourth and first sub-sidewalls S_SW4 and S_SW1.

The first and second disconnected spacers S_SP1 and S_SP2 may be spaced apart from each other in an area adjacent to the first corner portion CP1, and the second and third disconnected spacers S_SP2 and S_SP3 may be spaced apart from each other in an area adjacent to the second corner portion CP2. The third and fourth disconnected spacers S_SP3 and S_SP4 may be spaced apart from each other in an area adjacent to the third corner portion CP3, and the fourth and first disconnected spacers S_SP4 and S_SP1 may be spaced apart from each other in an area adjacent to the fourth corner portion CP4.

As shown in FIG. 6B, each of the first, second, third, and fourth disconnected spacers S_SP1, S_SP2, S_SP3, and S_SP4 may include first and second disconnected sidewalls SP_SW1 and SP_SW2 having different lengths from each other. The first disconnected sidewall SP_SW1 may be defined as a sidewall adjacent to the sub-sidewalls S_SW1, S_SW2, S_SW3, and S_SW4, and the second disconnected sidewall S_SW2 may be defined as a sidewall adjacent to the main sidewalls M_SW1, M_SW2, M_SW3, and M_SW4. Each of the first, second, third, and fourth disconnected spacers S_SP1, S_SP2, S_SP3, and S_SP4 may include a third disconnected sidewall SP_SW3 connecting one end portions of the first and second disconnected sidewalls SP_SW1 and SP_SW2 and a fourth disconnected sidewall SP_SW4 connecting the other end portions of the first and second disconnected sidewalls SP_SW1 and SP_SW2.

As an example, the first disconnected sidewall SP_SW1 may be spaced apart from the sub-sidewall adjacent thereto, e.g., the third sub-sidewall S_SW3, by a first distance d1. As an example, the first distance d1 may be equal to or greater than about 1.8 μm. As an example, the first distance d1 may be about 3.75 μm. However, the first distance d1 should not be particularly limited and may be determined considering process limitations. Two disconnected spacers adjacent to each other, e.g., the second disconnected spacer S_SP2 and the third disconnected spacer S_SP3, may be space apart from each other by a second distance d2. As an example, the second distance d2 may be equal to or greater than about 7 μm. As an example, the second distance d2 between two disconnected spacers may be constant, however, the present disclosure should not be limited thereto or thereby. Alternatively, the second distance d2 may increase as a distance from a corresponding light receiving opening, e.g., the second light receiving opening O_OP2, increases.

As an example, the first and second disconnected sidewalls SP_SW1 and SP_SW2 may be spaced apart from each other in a third distance d3. As an example, the third distance d3 may be equal to or greater than abut 9 μm, however, the third distance d3 should not be limited thereto or thereby. The third distance d3 may be determined considering a distance between the light receiving opening OP2 and the light emitting opening OP1 adjacent to the light receiving opening OP2.

In addition, the first and second disconnected sidewalls SP_SW1 and SP_SW2 may be spaced apart from each other by the third distance d3 in each of the first to fourth disconnected spacers S_SP to S_SP4, however, the present disclosure should not be limited thereto or thereby. Alternatively, the distance between the first and second disconnected sidewalls SP_SW1 and SP_SW2 may be different in each of the first to fourth disconnected spacers S_SP1 to S_SP4. As shown in FIG. 6C, the first and second disconnected sidewalls SP_SW1 and SP_SW2 may be spaced apart from each other by the third distance d3 in each of the second and fourth disconnected spacers S_SP2 and S_SP4, and the first and second disconnected sidewalls SP_SW1 and SP_SW2 may be spaced apart from each other by a fourth distance d4 in each of the first and third disconnected spacers S_SP1*a* and S_SP3*a*. As an example, the fourth distance d4 may be smaller than the third distance d3.

Referring to FIGS. 6A, 6D, and 7D, the common layer CML may be located on the pixel definition layer PDL, the main spacer layer M_SPC, and the disconnected spacer layer S_SPC. That is, the common layer CML may be commonly formed in the pixels PX (refer to FIG. 3) and the sensors FX (refer to FIG. 3). The common layer CML may include a common cathode electrode C_CE, a hole control layer HCL, and an electron control layer ECL. The common cathode electrode C_CE may be commonly connected to the light emitting elements R_ED, G1_ED, G2_ED, and B_ED (refer to FIG. 4A) and the light receiving elements OPD1 and OPD2 (refer to FIG. 4A). The hole control layer HCL and the electron control layer ECL may be located between the pixel definition layer PDL and the common cathode electrode C_CE. The hole control layer HCL may include a hole transport layer and a hole injection layer, and the electron control layer ECL may include an electron transport layer and an electron injection layer.

The light emitting layer may be arranged to correspond to the light emitting opening OP1 defined through the pixel definition layer PDL, and the photoelectric conversion layer may be arranged to correspond to the light receiving opening OP2 defined through the pixel definition layer PDL. The light emitting layer may include the red light emitting layer R_EL provided to correspond to the red opening R_OP1, the first and second green light emitting layers G1_EL and G2_EL provided to respectively correspond to the first and second green openings G1_OP1 and G2_OP1, and the blue light emitting layer B_EL provided to correspond to the blue opening B_OP1. According to some embodiments, the patterned light emitting layer is shown as a representative example, however, the present disclosure should not be limited thereto or thereby. A common light emitting layer may be commonly located in the pixels PX. In this case, the common light emitting layer may generate a white light or a blue light.

The photoelectric conversion layer may include the first photoelectric conversion layer O_RL1 provided to correspond to the first light receiving opening O_OP1 and the second photoelectric conversion layer O_RL2 provided to correspond to the second light receiving opening O_OP2. The light emitting layer and the photoelectric conversion layer may be located on the hole control layer HCL. The electron control layer ECL may be located on the light emitting layer and the photoelectric conversion layer. The common cathode electrode C_CE may be located on the electron control layer ECL. The hole control layer HCL, the electron control layer ECL, and the common cathode electrode C_CE may be commonly arranged over the plural pixels PX and the plural sensors FX.

The common layer CML may be partially disconnected around the first and second light receiving elements OPD1 and OPD2 due to the disconnected spacer layer S_SPC. The common layer CML may be partially disconnected due to a step difference between the disconnected spacer layer S_SPC and the pixel definition layer PDL. As a height of the disconnected spacer layer S_SPC increases, the step difference between the disconnected spacer layer S_SPC and the pixel definition layer PDL may increase, and the common layer CML may be efficiently disconnected.

As an example, the common layer CML may be disconnected along a sidewall (or an edge) of the first disconnected spacer S_SP1 and may be disconnected along a sidewall (or an edge) of the second disconnected spacer S_SP2. In addition, the common layer CML may be disconnected along a sidewall of the third and fourth disconnected spacers S_SP3 and S_SP4. Accordingly, the common layer CML may include an island portion I_CL provided with an island shape on the disconnected spacer layer S_SPC. The island portion I_CL may include a first island portion I_CL1 located on the first disconnected spacer S_SP1 and a second island portion I_CL2 located on the second disconnected spacer S_SP2. The island portion I_CL may further include third and fourth island portions I_CL3 and I_CL4 located on the third and fourth disconnected spacers S_SP3 and S_SP4, respectively.

The common layer CML may include a first common portion CMP1 commonly arranged on the light emitting elements R_ED, G1_ED, G2_ED, and B_ED and second common portions CMP2 arranged to respectively correspond to the light receiving elements OPD1 and OPD2. The common layer CML may include a first slit slt1 formed therein to surround the first island portion I_CL1 and a second slit slt2 formed therein to surround the second island portion I_CL2. In addition, the common layer CML may include third and fourth slits slt3 and slt4 to respectively surround the third and fourth island portions I_CL3 and I_CL4. Accordingly, the first to fourth island portions I_CL1 to I_CL4 may be electrically insulated from the first and second common portions CMP1 and CMP2 by the first to fourth slits slt1 to slt4.

The common layer CML may further include a first connection portion BP1, a second connection portion BP2, a third connection portion BP3, and a fourth connection portion BP4 to electrically connect the first common portion CMP1 and the second common portion CMP2. When viewed in the plane, the first connection portion BP1 may be located between the first and second disconnected spacers S_SP1 and S_SP2, and the second connection portion BP2 may be located between the second and third disconnected spacers S_SP2 and S_SP3. When viewed in the plane, the third connection portion BP3 may be located between the third and fourth disconnected spacers S_SP3 and S_SP4, and the fourth connection portion BP4 may be located between the fourth and first disconnected spacers S_SP4 and S_SP1. The second common portion CMP2 may be electrically connected to the first common portion CMP1 via the first to fourth connection portions BP1 to BP4.

As an example, the common layer CML may be partially disconnected by the main spacer layer M_SPC. The common layer CML may be disconnected along a sidewall of the main spacer layer M_SPC, and thus, the common layer CML may include a main island layer M_CL formed on the main spacer layer M_SPC. The common layer CML may further include a main slit m_slt formed therein to surround the main island layer M_CL, however, the present disclosure should not be limited thereto or thereby. As an example, in a case where the first height h1 of the main spacer layer M_SPC is smaller than the second height h2 of the disconnected spacer layer S_SPC as shown in FIG. 7C, the common layer CML may not be disconnected around the main spacer layer M_SPC but may be disconnected only around the disconnected spacer layer S_SPC. In this case, the main slit m_slt and the main island layer M_CL may not be provided to the common layer CML.

As shown in FIG. 7B, when the main spacer layer M_SPC is omitted, the disconnected spacer layer S_SPC may serve as the main spacer layer M_SPC. As an example, when the main spacer layer M_SPC is omitted, the disconnected spacer layer S_SPC may serve to support a fine metal mask (FMM) used to pattern the light emitting layer and the photoelectric conversion layer.

As described above, as the disconnected spacer layer S_SPC is located adjacent to the first and second light receiving elements OPD1 and OPD2 on the pixel definition layer PDL, the common layer CML may be partially disconnected around the first and second light receiving elements OPD1 and OPD2. Accordingly, even though the first and second light receiving elements OPD1 and OPD2 may be electrically connected to the light emitting elements R_ED, G1_ED, G2_ED, and B_ED via the common layer CML, the current charged in the first and second light receiving elements OPD1 and OPD2 may be prevented from leaking through the common layer CML or the leakage of the current charged in the first and second light receiving elements OPD1 and OPD2 may be reduced.

As the first and second common portions CMP1 and CMP2 are electrically connected to each other via the first to fourth connection portions BP1 to BP4, a separate power supply is not required to drive the first and second light receiving elements OPD1 and OPD2, and a power line used to drive the light emitting elements R_ED, G1_ED, G2_ED, and B_ED, e.g., the second driving voltage line VL2, may be shared.

Although the power line is shared, the leakage of the current may be prevented by partially disconnecting the common layer CML using the disconnected spacer layer S_SPC. Accordingly, the electric potential of the first sensing node SN1 (refer to FIG. 5A) may be stably maintained, and as a result, the sensing performance of the sensor FX may be improved.

Figure 8A:
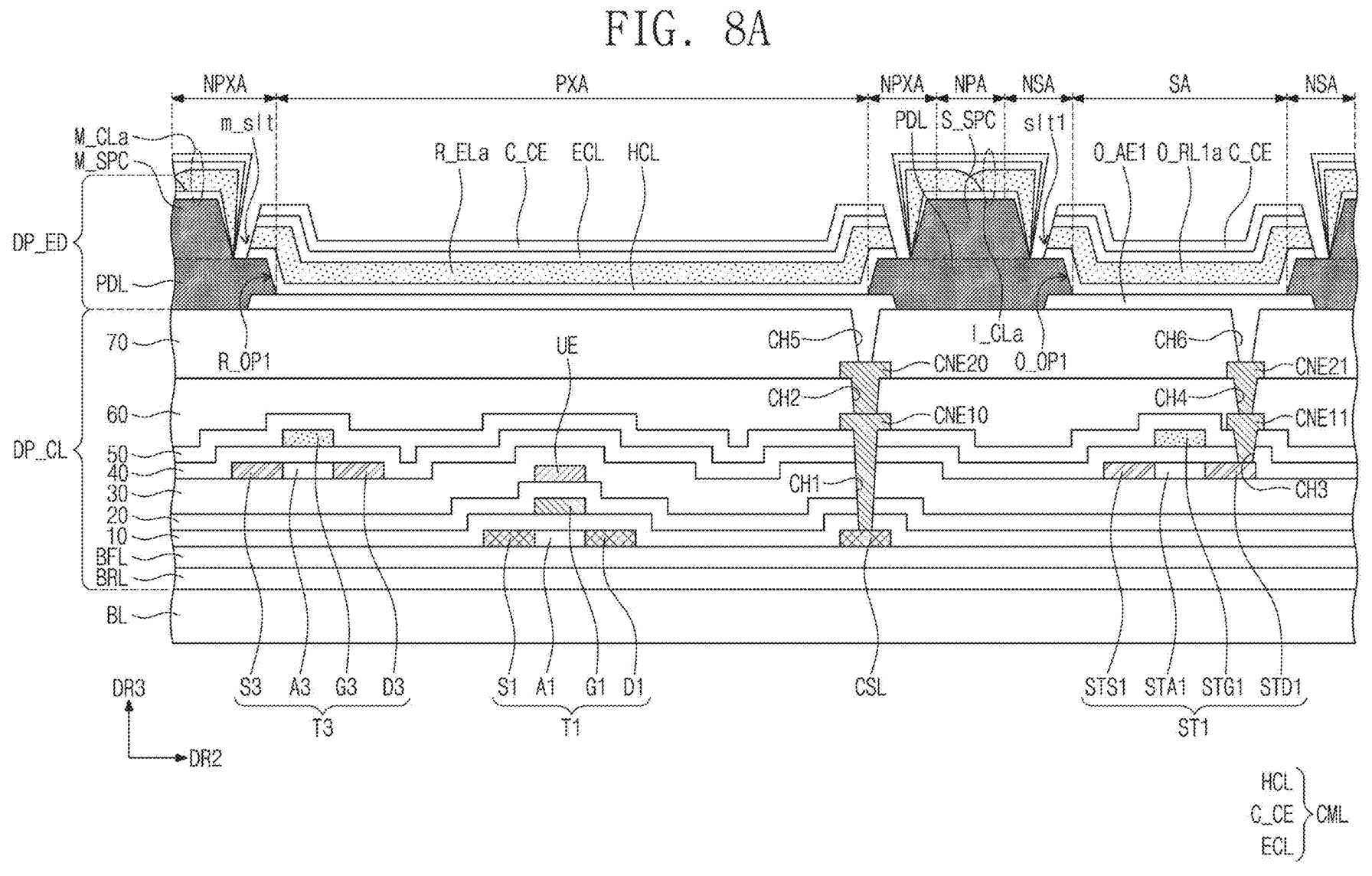

FIG. 8A is a cross-sectional view of a display panel according to some embodiments of the present disclosure.

Referring to FIG. 8A, a common layer CML may be located on a pixel definition layer PDL, a main spacer layer M_SPC, and a disconnected spacer layer S_SPC. The common layer CML may be commonly formed in pixels PX (refer to FIG. 3) and sensors FX (refer to FIG. 3). The common layer CML may include a common cathode electrode C_CE, a hole control layer HCL, and an electron control layer ECL. The common cathode electrode C_CE may be commonly connected to light emitting elements R_ED, G1_ED, G2_ED, and B_ED (refer to FIG. 4A) and light receiving elements OPD1 and OPD2 (refer to FIG. 4A). The hole control layer HCL and the electron control layer ECL may be located between the pixel definition layer PDL and the common cathode electrode C_CE. The hole control layer HCL may include a hole transport layer and a hole injection layer, and the electron control layer ECL may include an electron transport layer and an electron injection layer.

A red light emitting layer R_ELa may be arranged to correspond to a red opening R_OP1 defined through the pixel definition layer PDL, and a first photoelectric conversion layer O_RL1*a* may be provided to correspond to a first light receiving opening O_OP1 defined through the pixel definition layer PDL. The red light emitting layer R_ELa and the first photoelectric conversion layer O_RL1*a* may overlap the pixel definition layer PDL, the main spacer layer M_SPC, and/or the disconnected spacer layer S_SPC. In addition, the red light emitting layer R_ELa may overlap a light emitting layer of a light emitting element adjacent thereto, e.g., first and second green light emitting layers G1_EL and G2_EL (refer to FIG. 6D) and a blue light emitting layer B_EL (refer to FIG. 6D). The red light emitting layer R_ELa may overlap the first photoelectric conversion layer O_RL1*a* of the light receiving element adjacent thereto.

The common layer CML may be partially disconnected due to the step difference between the disconnected spacer layer S_SPC and the pixel definition layer PDL. In the case where the red light emitting layer R_ELa and the first photoelectric conversion layer O_RL1*a* may overlap each other on the disconnected spacer layer S_SPC, the red light emitting layer R_ELa and the first photoelectric conversion layer O_RL1*a* may also be partially disconnected due to the step difference between the disconnected spacer layer S_SPC and the pixel definition layer PDL.

Accordingly, an island portion I_CLa may include the disconnected portion of the common layer CML, the disconnected portion of the red light emitting layer R_Ela, and the disconnected portion of the first photoelectric conversion layer O_RL1*a*. The disconnected portion of the red light emitting layer R_ELa may overlap the disconnected portion of the first photoelectric conversion layer O_RL1*a*. The portion where the red light emitting layer R_ELa overlaps the first photoelectric conversion layer O_RL1*a* may be disconnected from a non-overlapping portion, i.e., a portion of the light emitting layer located in the light emitting area PXA and a portion of the photoelectric conversion layer located in the light receiving area SA due to the disconnected spacer layer S_SPC. Accordingly the leakage of the current, which is caused by the light emitting layer and the photoelectric conversion layer, may be prevented in the structure in which the red light emitting layer R_ELa (or the light emitting layer) overlaps the first photoelectric conversion layer O_RL1*a* (or the photoelectric conversion layer).

Figure 8B:
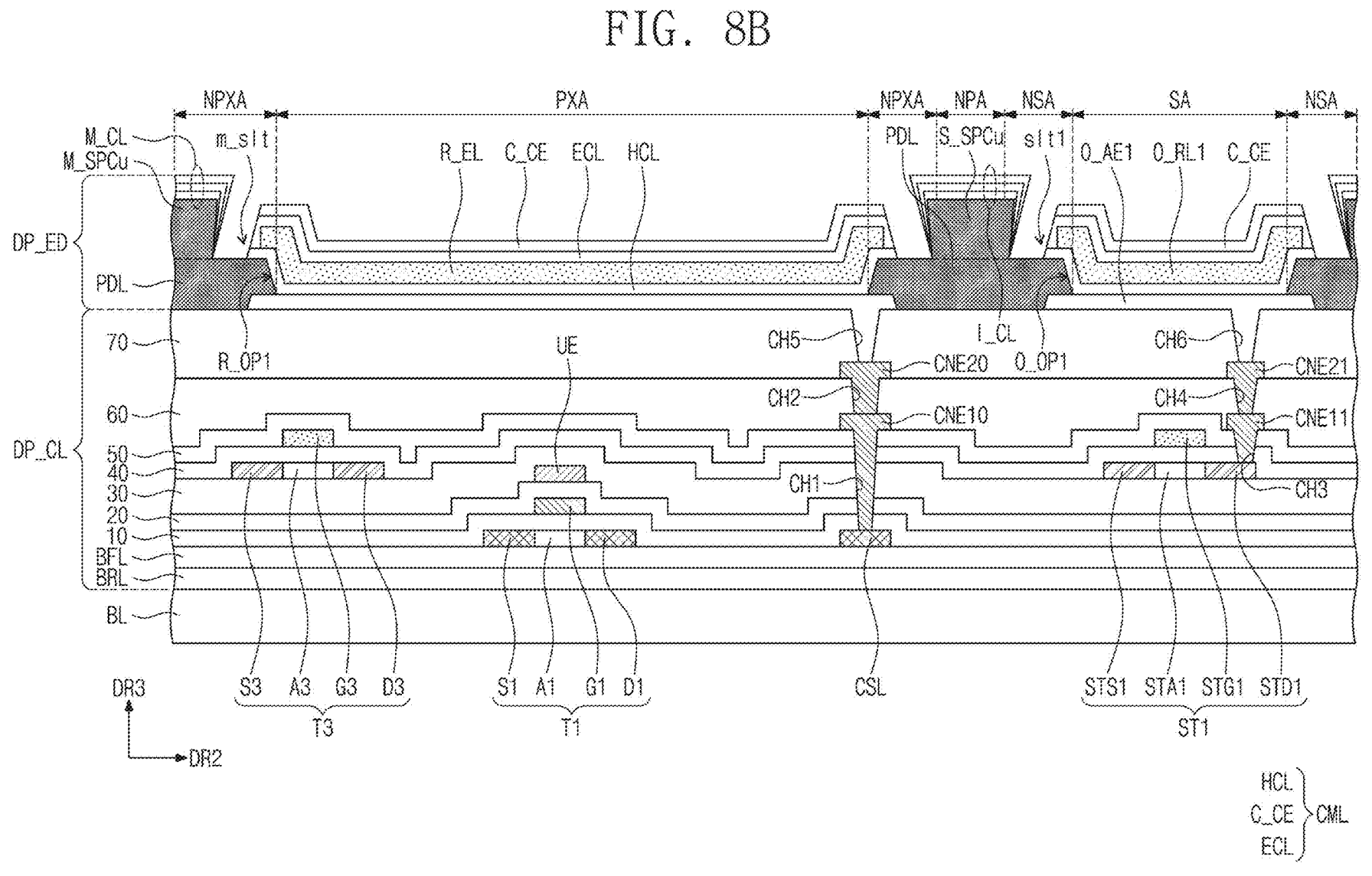

FIG. 8B is a cross-sectional view of a pixel definition layer PDL, a main spacer layer M_SPCu, and a disconnected spacer layer S_SPCu according to some embodiments of the present disclosure.

Referring to FIG. 8B, the main spacer layer M_SPCu and the disconnected spacer layer S_SPCu may be located on the pixel definition layer PDL. Different from the main spacer layer M_SPC and the disconnected spacer layer S_SPC shown in FIGS. 7A to 7D, the main spacer layer M_SPCu and the disconnected spacer layer S_SPCu shown in FIG. 8B may have a reverse tapered shape. As an example, a width in the second direction DR2 of the main spacer layer M_SPCu and the disconnected spacer layer S_SPCu may decrease as a distance from the pixel definition layer PDL decreases.

The main spacer layer M_SPCu and the disconnected spacer layer S_SPCu may be provided integrally with the pixel definition layer PDL. That is, the main spacer layer M_SPCu and the disconnected spacer layer S_SPCu may be formed through a patterning process of forming light emitting openings OP1 and light receiving openings OP2 through the pixel definition layer PDL.

The common layer CML may be partially disconnected around the main spacer layer M_SPCu and the disconnected spacer layer S_SPCu. That is, the common layer CML may be disconnected along a side surface of the reverse tapered shape. When the side surface of the main spacer layer M_SPCu and the disconnected spacer layer S_SPCu has the reverse tapered shape, the common layer CML may be more effectively disconnected.

Figure 9A:
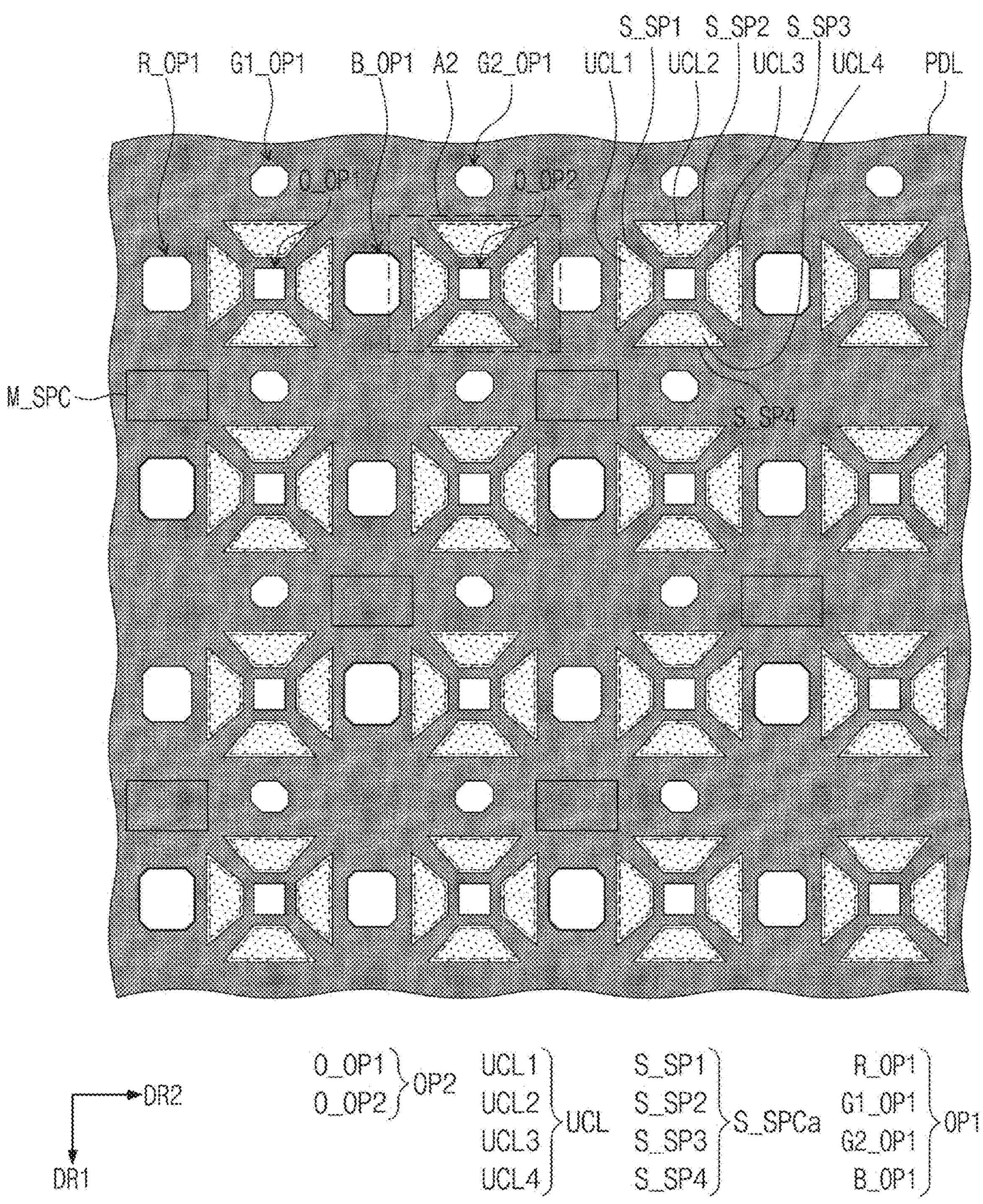
FIG. 9A is a plan view of a pixel definition layer, an undercut layer, and a disconnected spacer layer according to some embodiments of the present disclosure.
Figure 9B:
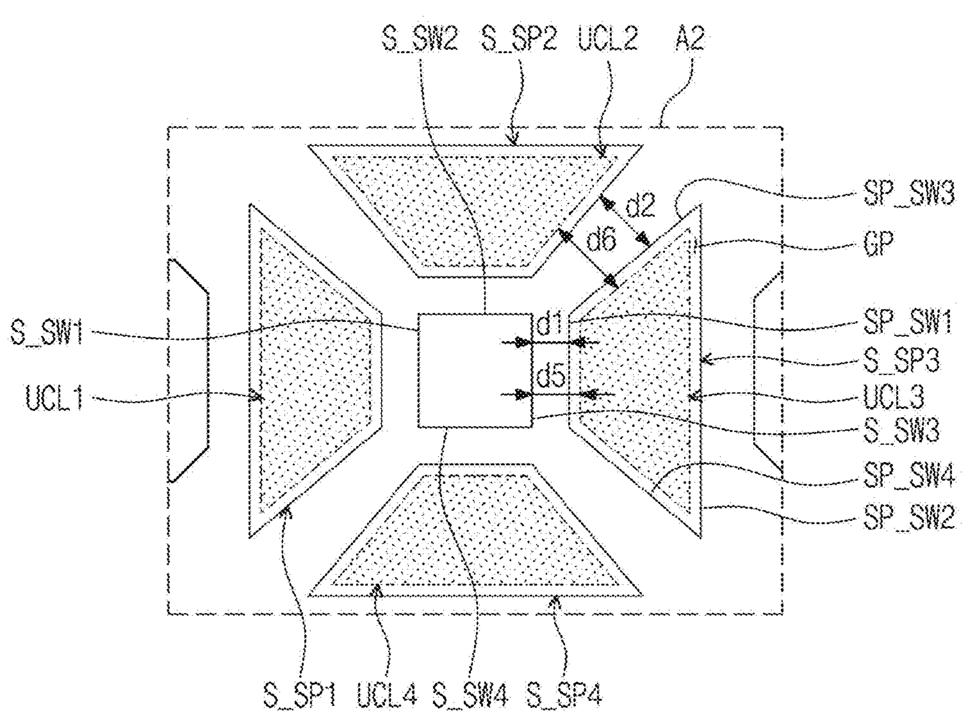
FIG. 9B is an enlarged plan view of a portion A2 shown in FIG. 9A.
Figure 9C:
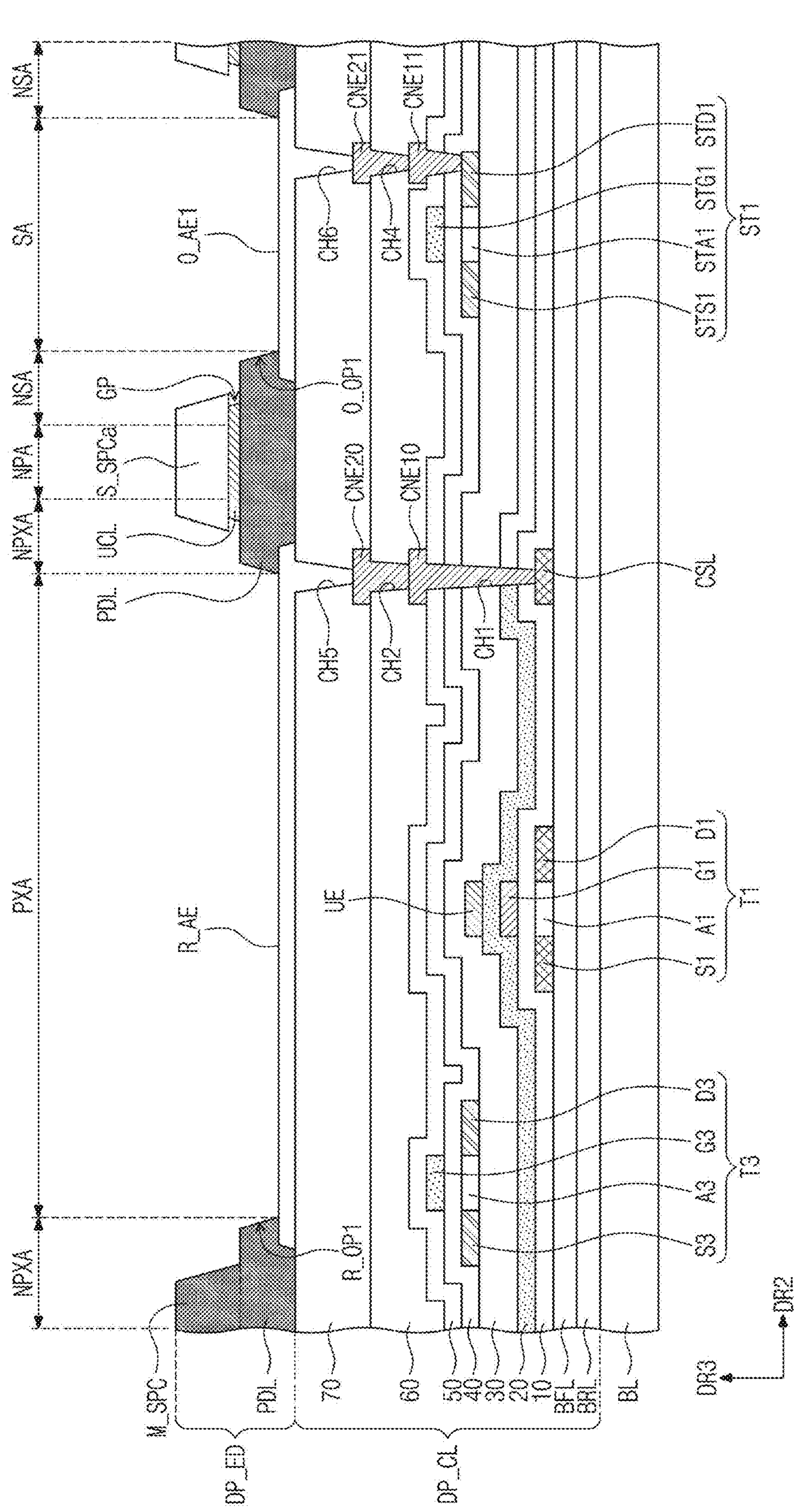
FIG. 9C is a cross-sectional view of the pixel definition layer, the undercut layer, and the disconnected spacer layer shown in FIG. 9A.
Figure 9D:
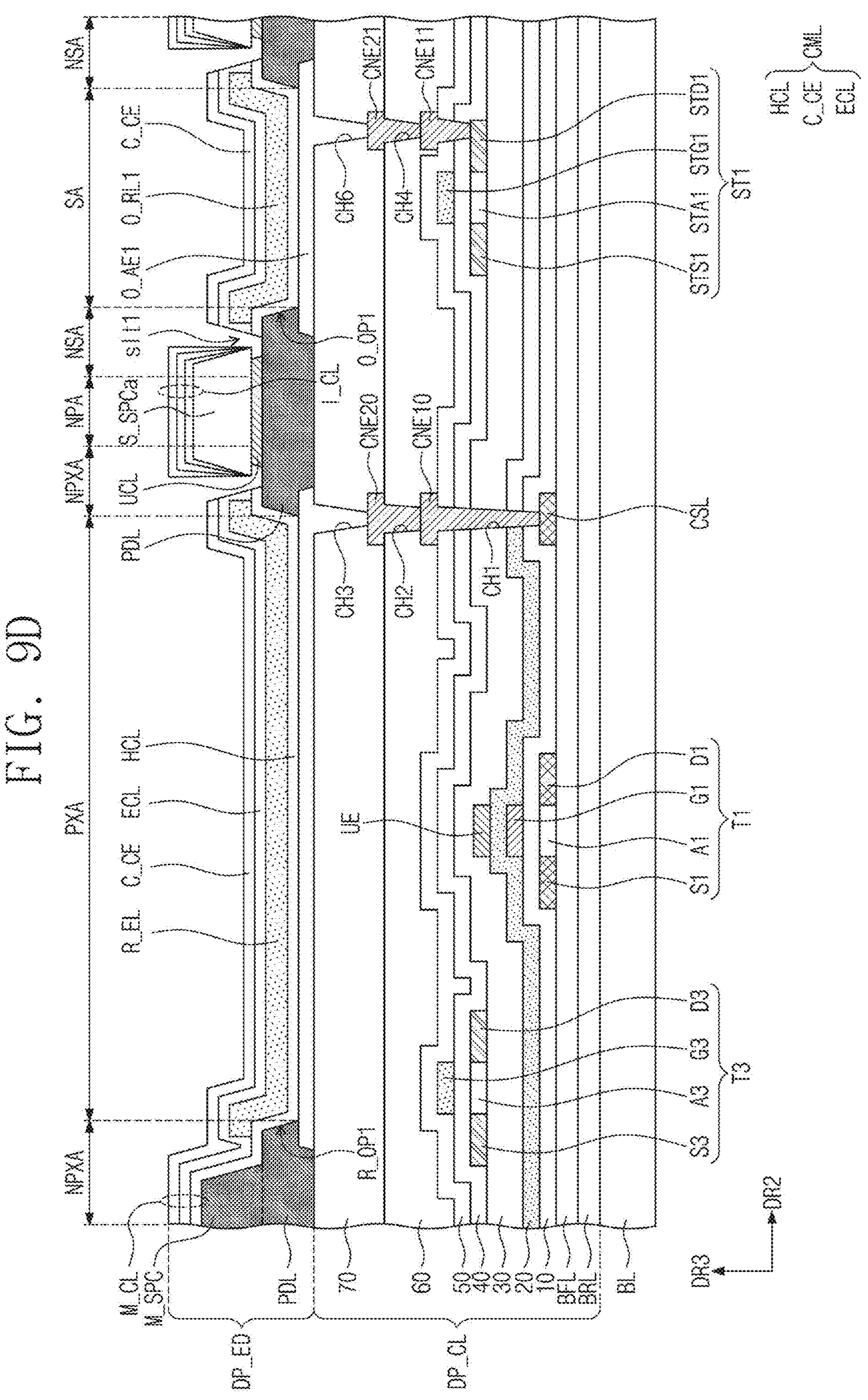
FIG. 9D is a cross-sectional view of a common layer, a light emitting layer, and a photoelectric conversion layer according to some embodiments of the present disclosure.

FIG. 9A is a plan view of a pixel definition layer PDL, an undercut layer UCL, and a disconnected spacer layer S_SPCa according to some embodiments of the present disclosure, and FIG. 9B is an enlarged plan view of a portion A2 shown in FIG. 9A. FIG. 9C is a cross-sectional view of the pixel definition layer, the undercut layer UCL, and the disconnected spacer layer S_SPCa shown in FIG. 9A, and FIG. 9D is a cross-sectional view of a common layer CML, a light emitting layer, and a photoelectric conversion layer according to some embodiments of the present disclosure. In FIGS. 9A to 9D, the same reference numerals denote the same elements in FIGS. 6A to 7D, and thus, detailed descriptions of the same elements will be omitted.

Referring to FIGS. 9A, 9B, and 9C, an element layer DP_ED may further include the undercut layer UCL located between the pixel definition layer PDL and the disconnected spacer layer S_SPCa. As an example, the undercut layer UCL may be located only between the disconnected spacer layer S_SPCa and the pixel definition layer PDL and may not be located between a main spacer layer M_SPC and the pixel definition layer PDL. In a case where the disconnected spacer layer S_SPCa includes first to fourth disconnected spacers S_SP1 to S_SP4, the undercut layer UCL may include first to fourth undercut layers UCL1 to UCL4 arranged to respectively correspond to the first to fourth disconnected spacers S_SP1 to S_SP4.

Each of the first to fourth undercut layers UCL1 to UCL4 may have the same shape as that of each of the first to fourth disconnected spacers S_SP1 to S_SP4. As an example, the first to fourth disconnected spacers S_SP1 to S_SP4 and the first to fourth undercut layers UCL1 to UCL4 may have a trapezoidal shape when viewed in the plane.

An edge of the undercut layer UCL may be located inside an edge of the disconnected spacer layer S_SPCa. Accordingly, a gap GP may be provided between the disconnected spacer layer S_SPCa and the pixel definition layer PDL to surround the undercut layer UCL. As an example, the undercut layer UCL may include a metal material or a transparent conductive material.

As an example, a first disconnected sidewall SP_SW1 of each of the disconnected spacers S_SP1 to S_SP4, e.g., a third disconnected spacer S_SP3, may be spaced apart from a sub-sidewall adjacent thereto, e.g., a third sub-sidewall S_SW3, by a first distance d1. Each of the undercut layers UCL1 to UCL4, e.g., a third undercut layer UCL3, may be spaced apart from a sub-sidewall adjacent thereto, e.g., the third sub-sidewall S_SW3, by a fifth distance d5. The fifth distance d5 may be greater than the first distance d1. The gap GP may have a width obtained by subtracting the first distance d1 from the fifth distance d5.

Two disconnected spacers adjacent to each other, e.g., a second disconnected spacer S_SP2 and the third disconnected spacer S_SP3, may be spaced apart from each other by a second distance d2. Two undercut layers adjacent thereto, e.g., the second undercut layer UCL2 and the third undercut layer UCL3, may be spaced apart from each other by a sixth distance d6. The sixth distance d6 may be greater than the second distance d2.

Referring to FIG. 9D, the common layer CML may be located on a pixel definition layer PDL, a main spacer layer M_SPC, and a disconnected spacer layer S_SPCa. The common layer CML may include a common cathode electrode C_CE, a hole control layer HCL, and an electron control layer ECL. The common cathode electrode C_CE may be commonly connected to light emitting elements R_ED, G1_ED, G2_ED, and B_ED (refer to FIG. 4A) and light receiving elements OPD1 and OPD2 (refer to FIG. 4A). The hole control layer HCL and the electron control layer ECL may be located between the pixel definition layer PDL and the common cathode electrode C_CE.

The common layer CML may include a first common portion CMP1 (refer to FIG. 6D) commonly located in the light emitting elements R_ED, G1_ED, G2_ED, and B_ED and second common portions CMP2 (refer to FIG. 6D) arranged to respectively correspond to the light receiving elements OPD1 and OPD2.

The common layer CML may be partially disconnected around the first and second light receiving elements OPD1 and OPD2 due to the disconnected spacer layer S_SPCa and an undercut layer UCL. The common layer CML may be disconnected along a sidewall or an edge of a first disconnected spacer S_SP1 and a side surface of a first undercut layer UCL1. Accordingly, the common layer CML may include a first island portion I_CL1 (refer to FIG. 6D) formed on the first disconnected spacer S_SP1. A first slit slt1 (refer to FIG. 6D) may be formed in the common layer CML to surround the first island portion I_CL1. The common layer CML may be disconnected along a sidewall or an edge of a second disconnected spacer S_SP2 and a side surface of a second undercut layer UCL2. Accordingly, the common layer CML may include a second island portion I_CL2 (refer to FIG. 6D) formed on the second disconnected spacer S_SP2. A second slit slt2 (refer to FIG. 6D) may be formed in the common layer CML to surround the second island portion I_CL2. The common layer CML may be disconnected along a sidewall or an edge of third and fourth disconnected spacers S_SP3 and S_SP4 and a side surface of third and fourth undercut layers UCL3 and UCL4. Accordingly, the common layer CML may include third and fourth island portions I_CL3 and I_CL4 (refer to FIG. 6D) respectively formed on the third and fourth disconnected spacers S_SP3 and S_SP4. Third and fourth slits slt3 and slt4 (refer to FIG. 6D) may be formed in the common layer CML to respectively surround the third and fourth island portions I_CL3 and I_CL4. Accordingly, the first to fourth island portions I_CL1 to I_CL4 may be electrically insulated from the first and second common portions CMP1 and CMP2.

As the undercut layer UCL is further formed to form an undercut between the disconnected spacer layer S_SPCa and the pixel definition layer PDL, the common layer CML may be more effectively disconnected around the light receiving elements OPD1 and OPD2.

The common layer CML may further include a first connection portion BP1, a second connection portion BP2, a third connection portion BP3, and a fourth connection portion BP4. When viewed in the plane, the first connection portion BP1 may be located between the first and second disconnected spacers S_SP1 and S_SP2, and the second connection portion BP2 may be located between the second and third disconnected spacers S_SP2 and S_SP3. When viewed in the plane, the third connection portion BP3 may be located between the third and fourth disconnected spacers S_SP3 and S_SP4, and the fourth connection portion BP4 may be located between the fourth and first disconnected spacers S_SP4 and S_SP1. The second common portion CMP2 may be electrically connected to the first common portion CMP1 via the first to fourth connection portions BP1 to BP4.

As described above, as the first and second common portions CMP1 and CMP2 are electrically connected to each other via the first to fourth connection portions BP1 to BP4, a separate power supply is not required to drive the first and second light receiving elements OPD1 and OPD2, and a power line used to drive the light emitting elements R_ED, G1_ED, G2_ED, and B_ED, e.g., the second driving voltage line VL2, may be shared.

Although the power line is shared, the leakage of the current may be effectively prevented or reduced by partially disconnecting the common layer CML using the disconnected spacer layer S_SPCa and the undercut layer UCL. Accordingly, the electric potential of the first sensing node SN1 (refer to FIG. 5A) may be stably maintained, and as a result, the sensing performance of the sensor FX may be improved.

Figure 10A:
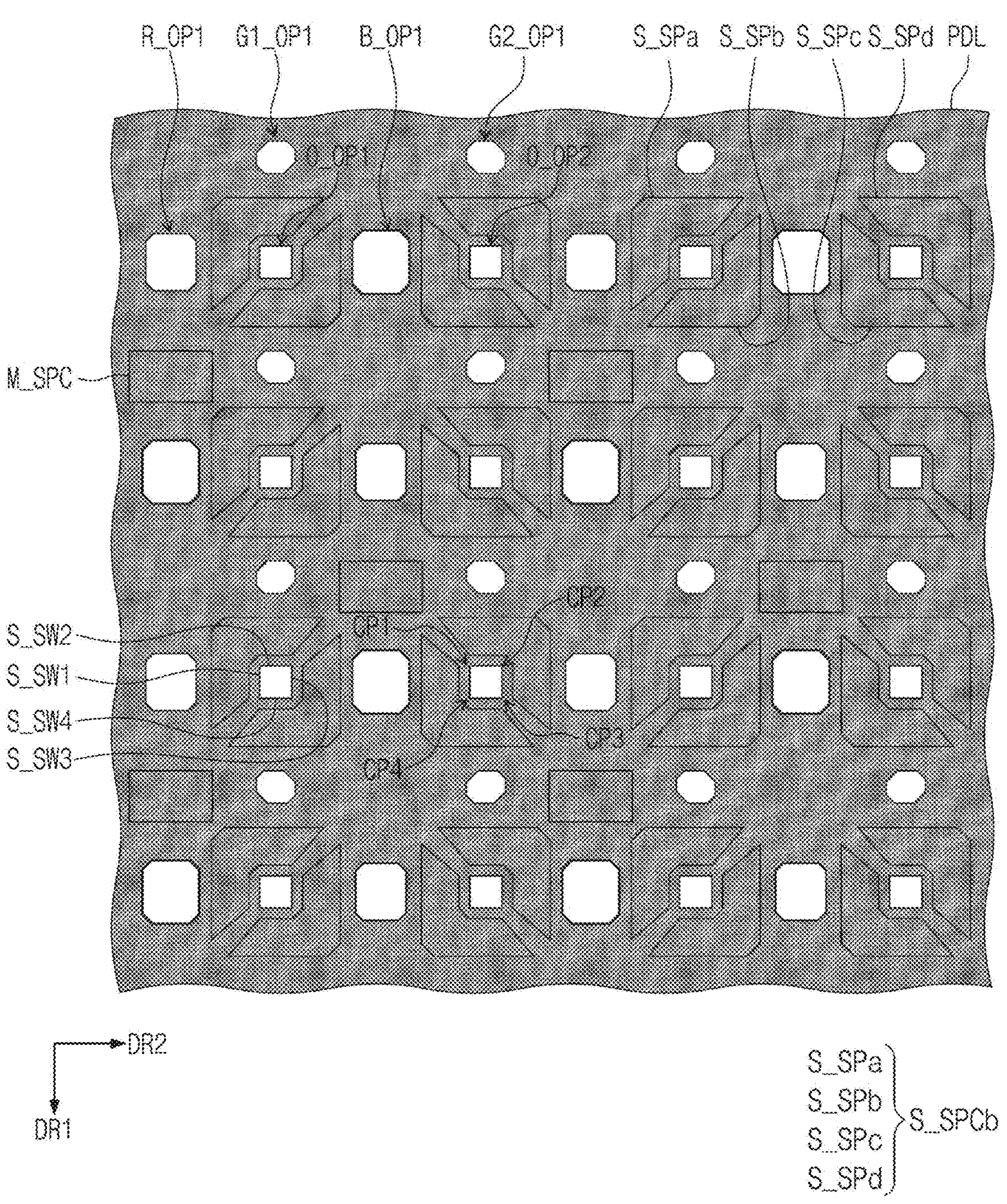
FIG. 10A is a plan view of a pixel definition layer, a main spacer layer, and a disconnected spacer layer according to some embodiments of the present disclosure.
Figure 10B:
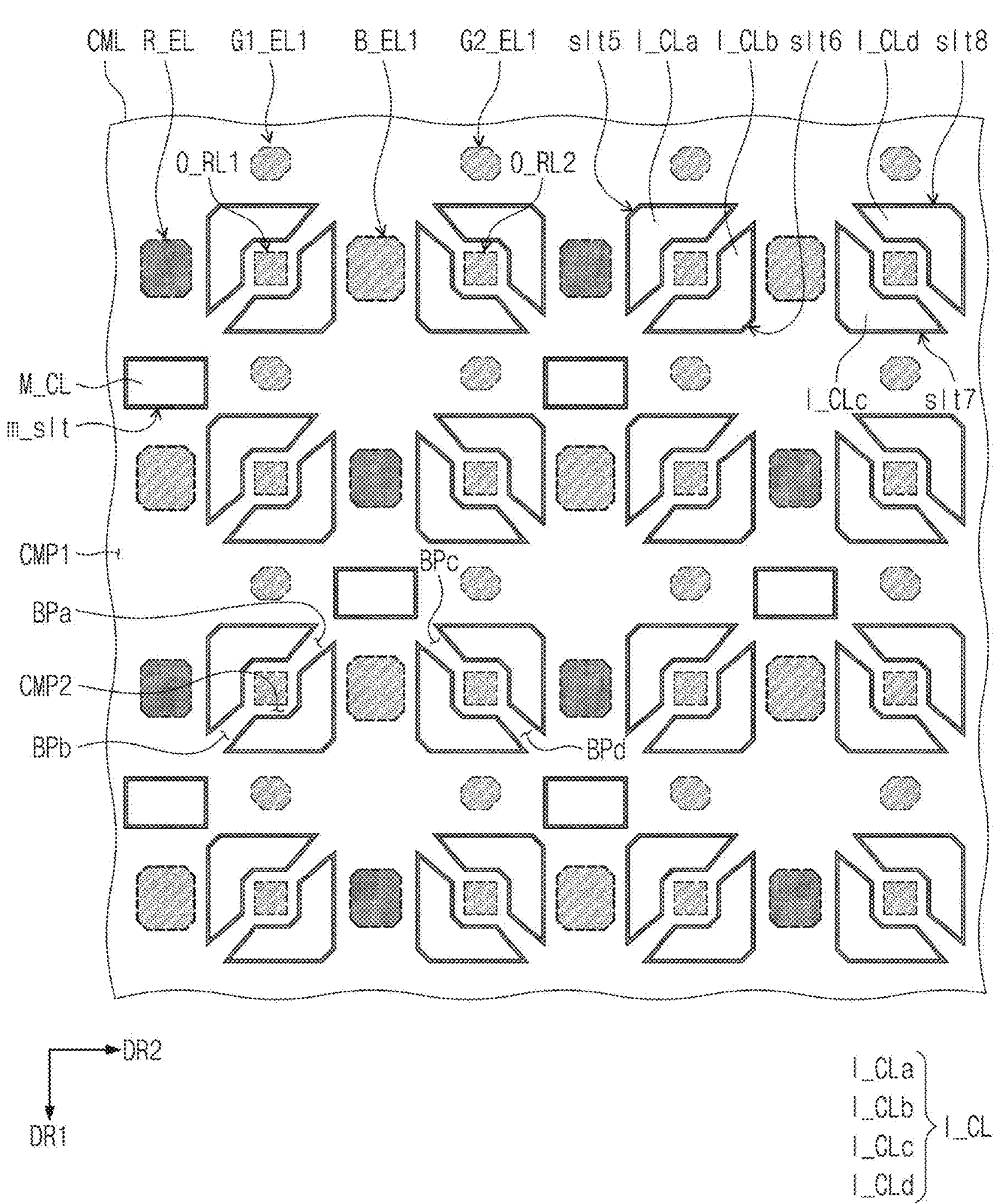
FIG. 10B is a plan view of a common layer, a light emitting layer, and a photoelectric conversion layer according to some embodiments of the present disclosure.

FIG. 10A is a plan view of a pixel definition layer PDL, a main spacer layer M_SPC, and a disconnected spacer layer S_SPCb according to some embodiments of the present disclosure, and FIG. 10B is a plan view of a common layer CML, a light emitting layer, and a photoelectric conversion layer according to some embodiments of the present disclosure.

Referring to FIG. 10A, the pixel definition layer PDL may include a plurality of main sidewalls defining each light emitting opening OP1 and a plurality of sub-sidewalls defining each light receiving opening OP2. The number of main sidewalls defining each light emitting opening OP1 may be determined by a shape of the light emitting opening. As an example, each of first and second light receiving openings O_OP1 and O_OP2 may have a quadrangular shape. In this case, the sub-sidewalls may include first, second, third, and fourth sub-sidewalls S_SW1, S_SW2, S_SW3, and S_SW4. The pixel definition layer PDL may include a plurality of corner portions defined by two sub-sidewalls adjacent to each other and connected to each other among the sub-sidewalls. As an example, the corner portions may include a first corner portion CP1 defined by the first and second sub-sidewalls S_SW1 and S_SW2, a second corner portion CP2 defined by the second and third sub-sidewalls S_SW2 and S_SW3, a third corner portion CP3 defined by the third and fourth sub-sidewalls S_SW3 and S_SW4, and a fourth corner portion CP4 defined by the fourth and first sub-sidewalls S_SW4 and S_SW1.

As an example, the disconnected spacer layer S_SPCb may include four disconnected spacers, for example, first, second, third, and fourth disconnected spacers S_SPa, S_SPb, S_SPc, and S_SPd. The first disconnected spacer S_SPa may be located adjacent to the first and second sub-sidewalls S_SW1 and S_SW2 defining the first light receiving opening O_OP1, and the second disconnected spacer S_SPb may be located adjacent to the third and fourth sub-sidewalls S_SW3 and S_SW4 defining the first light receiving opening O_OP1. The third disconnected spacer S_SPc may be located adjacent to the first and fourth sub-sidewalls S_SW1 and S_SW4 defining the second light receiving opening O_OP2, and the fourth disconnected spacer S_SPd may be located adjacent to the second and third sub-sidewalls S_SW2 and S_SW3 defining the second light receiving opening O_OP2.

The first and second disconnected spacers S_SPa and S_SPb may be spaced apart from each other in areas adjacent to the second corner portion CP2 and the fourth corner portion CP4 of the first light receiving opening O_OP1. The third and fourth disconnected spacers S_SPc and S_SPd may be spaced apart from each other in areas adjacent to the first corner portion CP1 and the third corner portion CP3 of the second light receiving opening O_OP2. As an example, each of the first to fourth disconnected spacers S_Spa to S_SPd may have an L shape rotated in a clockwise or counterclockwise direction. The first and second disconnected spacers S_SPa and S_SPb may have a symmetrical shape with respect to an imaginary line connecting the second corner portion CP2 and the fourth corner portion CP4 of the first light receiving opening O_OP1. The third and fourth disconnected spacers S_SPc and S_SPd may have a symmetrical shape with respect to an imaginary line connecting the first corner portion CP1 and the third corner portion CP3 of the second light receiving opening O_OP2.

Referring to FIGS. 10A and 10B, a common layer CML may be located on the pixel definition layer PDL, the main spacer layer M_SPC, and the disconnected spacer layer S_SPCb. The common layer CML may include a common cathode electrode C_CE, a hole control layer HCL, and an electron control layer ECL. The common cathode electrode C_CE may be commonly connected to light emitting elements R_ED, G1_ED, G2_ED, and B_ED (refer to FIG. 4A) and light receiving elements OPD1 and OPD2 (refer to FIG. 4A), and the hole control layer HCL and the electron control layer ECL may be located between the pixel definition layer PDL and the common cathode electrode C_CE.

The common layer CML may be partially disconnected around the first and second light receiving elements OPD1 and OPD2 due to the disconnected spacer layer S_SPCb. The common layer CML may be disconnected along a sidewall or an edge of the first disconnected spacer S_SPa and a sidewall or an edge of the second disconnected spacer S_SPb. In addition, the common layer CML may be disconnected along a sidewall of the third and fourth disconnected spacers S_SPc and S_SPd. Accordingly, the common layer CML may include an island portion I_CL provided with an island shape on the disconnected spacer layer S_SPCb. The island portion I_CL may include a first island portion I_CLa formed on the first disconnected spacer S_SPa and a second island portion I_CLb formed on the second disconnected spacer S_SPb. The island portion I_CL may further include third and fourth island portions I_CLc and I_CLd respectively formed on the third and fourth disconnected spacers S_SPc and S_SPd.

The common layer CML may include a first common portion CMP1 commonly located on the light emitting elements R_ED, G1_ED, G2_ED, and B_ED and second common portions CMP2 arranged to respectively correspond to the light receiving elements OPD1 and OPD2. A first slit slt5 may be formed in the common layer CML to surround the first island portion I_CLa, and a second slit slt6 may be formed in the common layer CML to surround the second island portion I_CLb. In addition, third and fourth slits slt7 and slt8 may be formed in the common layer CML to respectively surround the third and fourth island portions I_CLc and I_CLd. Accordingly, the first to fourth island portions I_CLa to I_CLd may be electrically insulated from the first and second common portions CMP1 and CMP2 due to the first to fourth slits slt5 to slt8.

As an example, the common layer CML may be partially disconnected due to the main spacer layer M_SPC. The common layer CML may be disconnected along a sidewall of the main spacer layer M_SPC, and thus, the common layer CML may include a main island layer M_CL formed on the main spacer layer M_SPC. A main slit m_slt may be formed in the common layer CML to surround the main island layer M_CL.

The common layer CML may include a first connection portion BPa, a second connection portion BPb, a third connection portion BPc, and a fourth connection portion BPd to electrically connect the first common portion CMP1 and the second common portion CMP2. When viewed in the plane, the first connection portion BPa may be located adjacent to the second corner portion CP2 of the first light receiving opening O_OP1 and may be located between the first and second disconnected spacers S_SPa and S_SPb, and the second connection portion BPb may be located adjacent to the fourth corner portion CP4 of the first light receiving opening O_OP1 and may be located between the first and second disconnected spacers S_SPa and S_SPb. When viewed in the plane, the third connection portion BPc may be located adjacent to the first corner portion CP1 of the second light receiving opening O_OP2 and may be located between the third and fourth disconnected spacers S_SPc and S_SPd, and the fourth connection portion BPd may be located adjacent to the third corner portion CP3 of the second light receiving opening O_OP2 and may be located between the third and fourth disconnected spacers S_SPc and S_SPd.

As described above, as the first and second common portions CMP1 and CMP2 are electrically connected to each other via the first and second connection portions BPa and BPb, a separate power supply is not required to drive the first and second light receiving elements OPD1 and OPD2, and a power line used to drive the light emitting elements R_ED, G1_ED, G2_ED, and B_ED, e.g., the second driving voltage line VL2, may be shared.

In FIG. 6D, four connection portions BP1 to BP4, i.e., a leakage current path, are formed in one light receiving element, however, two connection portions BPa and BPb, i.e., a leakage current path, may be formed in one light receiving element in FIG. 10B. As described above, when the number of the leakage current paths decreases, the leakage of the current charged in the first and second light receiving elements OPD1 and OPD2 through the common layer CML may be more effectively prevented. However, as an area of the island portion I_CL increases, an effective area of the common cathode electrode C_CE may decrease, and a voltage drop may occur due to the decrease of the effective area. Accordingly, the number of the connection portions BPa and BPb formed in the common layer CML may be determined by taking into account the leakage current and the voltage drop.

Figure 11A:
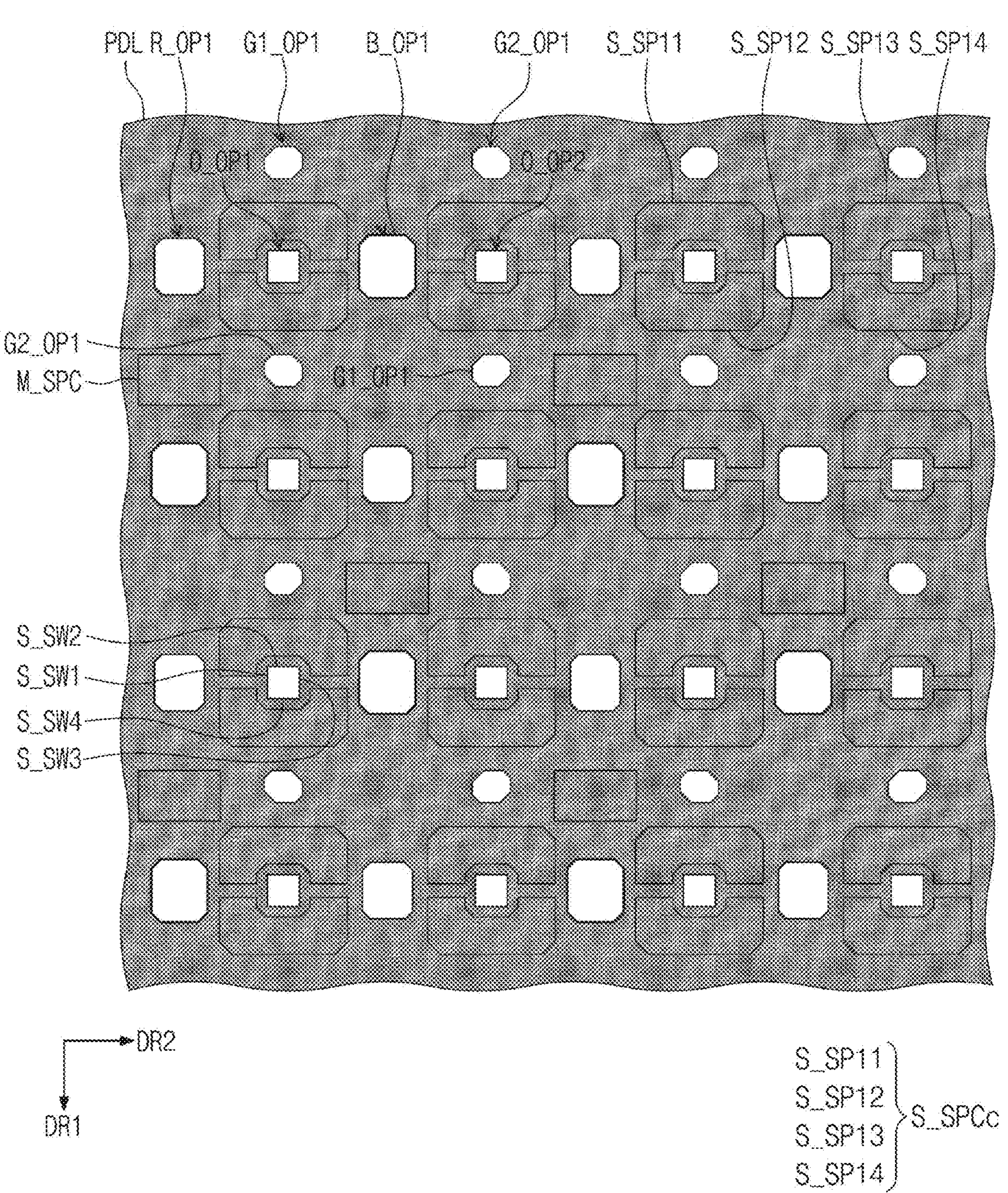
FIG. 11A is a plan view of a pixel definition layer, a main spacer layer, and a disconnected spacer layer according to some embodiments of the present disclosure.
Figure 11B:
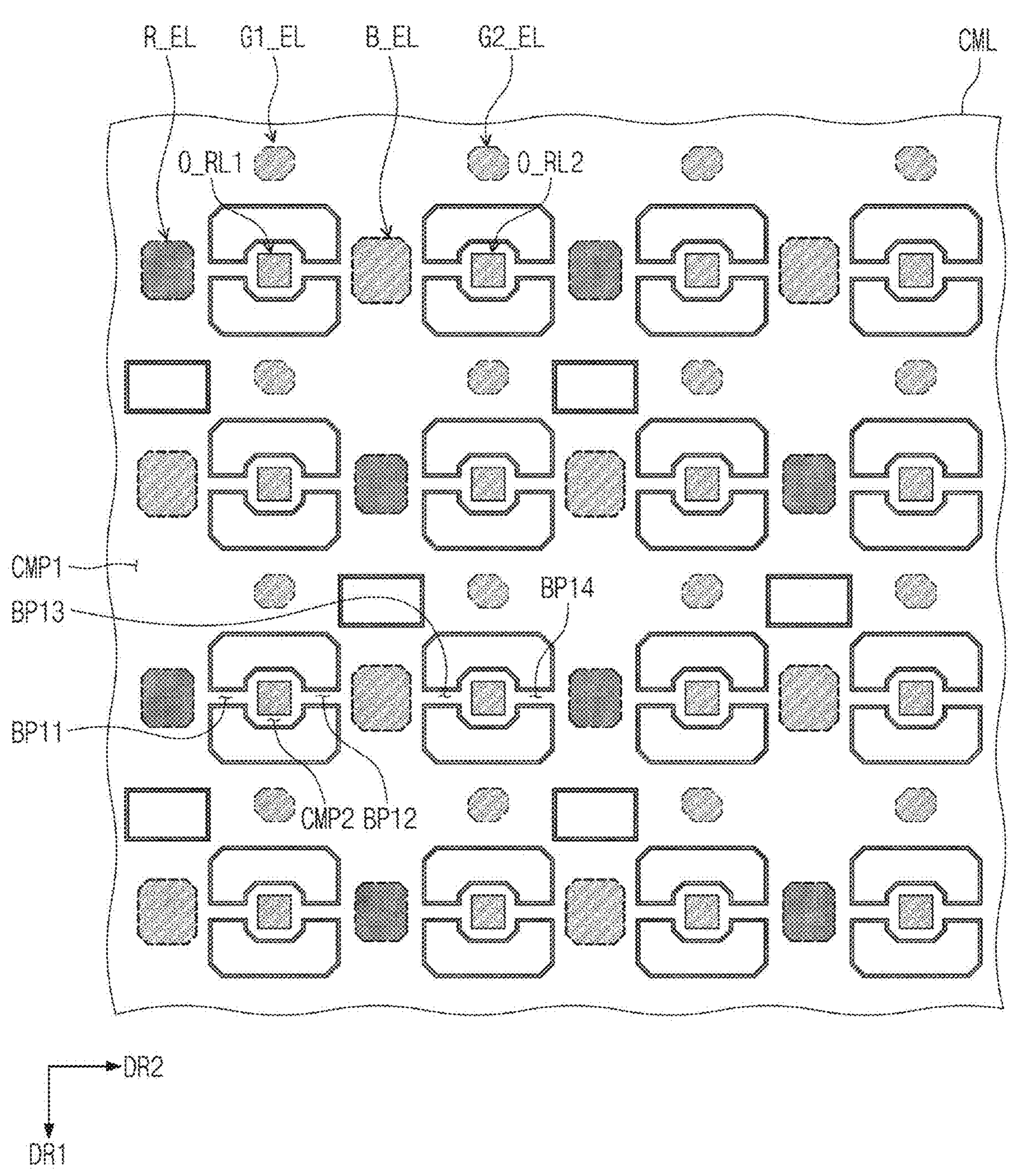
FIG. 11B is a plan view of a common layer, a light emitting layer, and a photoelectric conversion layer according to some embodiments of the present disclosure.

FIG. 11A is a plan view of a pixel definition layer PDL, a main spacer layer M_SPC, and a disconnected spacer layer S_SPCc according to some embodiments of the present disclosure, and FIG. 11B is a plan view of a common layer CML, a light emitting layer, and a photoelectric conversion layer according to some embodiments of the present disclosure.

Referring to FIG. 11A, the main spacer layer M_SPC and the disconnected spacer layer S_SPCc may be located on the pixel definition layer PDL. The disconnected spacer layer S_SPCc may include four disconnected spacers, e.g., first, second, third, and fourth disconnected spacers S_SP11, S_SP12, S_SP13, and S_SP14.

The first disconnected spacer S_SP11 may be located between a first green light emitting opening G1_OP1 and a first light receiving opening O_OP1, and the second disconnected spacer S_SP12 may be located between a second green light emitting opening G2_OP1 and the first light receiving opening O_OP1. The third disconnected spacer S_SP13 may be located between the second green light emitting opening G2_OP1 and a second light receiving opening O_OP2, and the fourth disconnected spacer S_SP14 may be located between the first green light emitting opening G1_OP1 and the second light receiving opening O_OP2. The first disconnected spacer S_SP11 and the second disconnected spacer S_SP12 may be spaced apart from each other in the first direction DR1, and the third disconnected spacer S_SP13 and the fourth disconnected spacer S_SP14 may be spaced apart from each other in the first direction DR1.

The first disconnected spacer S_SP11 may be arranged along a second sub-sidewall S_SW2 defining the first light receiving opening O_OP1. The second disconnected spacer S_SP12 may be arranged along a fourth sub-sidewall S_SW4 defining the first light receiving opening O_OP1. Both ends of the first disconnected spacer S_SP11 may be bent to the second disconnected spacer S_SP12 and may be located respectively adjacent to first and third sub-sidewalls S_SW1 and S_SW3. Both ends of the second disconnected spacer S_SP12 may be bent to the first disconnected spacer S_SP11 and may be located respectively adjacent to the first and third sub-sidewalls S_SW1 and S_SW3. The first and second disconnected spacers S_SP11 and S_SP12 may be spaced apart from each other in areas respectively adjacent to the first and third sub-sidewalls S_SW1 and S_SW3.

FIG. 11A shows a structure in which both ends of the first and second disconnected spacers S_SP11 and S_SP12 are bent, however, the present disclosure should not be limited thereto or thereby. Each of the first and second disconnected spacers S_SP11 and S_SP12 may have a bar shape extending in the second direction DR2.

The third disconnected spacer S_SP13 may be arranged along the second sub-sidewall S_SW2 defining the second light receiving opening O_OP2, and the fourth disconnected spacers S_SP14 may be arranged along the fourth sub-sidewall S_SW4 defining the second light receiving opening O_OP2. Both ends of the third disconnected spacer S_SP13 may be bent to the fourth disconnected spacer S_SP14 and may be located respectively adjacent to the first and third sub-sidewalls S_SW1 and S_SW3. Both ends of the fourth disconnected spacer S_SP14 may be bent to the third disconnected spacer S_SP13 and may be located respectively adjacent to the first and third sub-sidewalls S_SW1 and S_SW3. The third and fourth disconnected spacers S_SP13 and S_SP14 may be spaced apart from each other in areas respectively adjacent to the first and third sub-sidewalls S_SW1 and S_SW3.

FIG. 11A shows a structure in which both ends of the third and fourth disconnected spacers S_SP13 and S_SP14 are bent, however, the present disclosure should not be limited thereto or thereby. Each of the third and fourth disconnected spacers S_SP13 and S_SP14 may have a bar shape extending in the second direction DR2.

The first and second disconnected spacers S_SP11 and S_SP12 may have a symmetrical shape with respect to an imaginary line passing through a center of the first light receiving opening O_OP1 and parallel to the second direction DR2. The third and fourth disconnected spacers S_SP13 and S_SP14 may have a symmetrical shape with respect to an imaginary line passing through a center of the second light receiving opening O_OP2 and parallel to the second direction DR2.

Referring to FIGS. 11A and 11B, the common layer CML may be located on the pixel definition layer PDL, the main spacer layer M_SPC, and the disconnected spacer layer S_SPCc.

The common layer CML may be partially disconnected around first and second light receiving elements OPD1 and OPD2 (refer to FIG. 4A) by the disconnected spacer layer S_SPCc. The common layer CML may be disconnected along a sidewall of the first and second disconnected spacers S_SP11 and S_SP12 and may be disconnected along a sidewall of the third and fourth disconnected spacers S_SP13 and S_SP14.

The common layer CML may include a first connection portion BP11, a second connection portion BP12, a third connection portion BP13, and a fourth connection portion BP14. When viewed in the plane, the first connection portion BP11 may be located adjacent to the first sub-sidewall S_SW1 of the first light receiving opening O_OP1 and may be located between the first and second disconnected spacers S_SP11 and S_SP12, and the second connection portion BP12 may be located adjacent to the third sub-sidewall S_SW3 of the first light receiving opening O_OP1 and may be located between the first and second disconnected spacers S_SP11 and S_SP12. When viewed in the plane, the third connection portion BP13 may be located adjacent to the first sub-sidewall S_SW1 of the second light receiving opening O_OP2 and may be located between the third and fourth disconnected spacers S_SP13 and S_SP14, and the fourth connection portion BP14 may be located adjacent to the third sub-sidewall S_SW3 of the second light receiving opening O_OP2 and may be located between the third and fourth disconnected spacers S_SP13 and S_SP14.

The common layer CML may include a first common portion CMP1 commonly arranged on light emitting elements R_ED, G1_ED, G2_ED, and B_ED (refer to FIG. 4A) and second common portions CMP2 arranged to respectively correspond to the light receiving elements OPD1 and OPD2 (refer to FIG. 4A). The second common portions CMP2 may be electrically connected to the first common portion CMP1 via the first to fourth connection portions BP11 to BP14.

As described above, in the case where the first and second light receiving elements OPD1 and OPD2 receive the light to sense from the first and second green light emitting elements ED_G1 and ED_G2, the first to fourth disconnected spacers S_SP11 to S_SP14 may be located between the first and second light receiving elements OPD1 and OPD2 and the first and second green light emitting elements ED_G1 and ED_G2. Accordingly, as the common layer CML is partially disconnected by the first to fourth disconnected spacers S_SP11 to S_SP14, the leakage current to the first and second green light emitting elements ED_G1 and ED_G2 may be effectively blocked.

However, the present disclosure should not be limited thereto or thereby. In a case where the first and second light receiving elements OPD1 and OPD2 receive the light to sense from the red or blue light emitting element ED_R or ED_B, first to fourth disconnected spacers S_SP21 to S_SP24 (refer to FIG. 12A) may be located between the first and second light receiving elements OPD1 and OPD2 and the red and blue light emitting elements ED_R and ED_B.

Figure 12A:
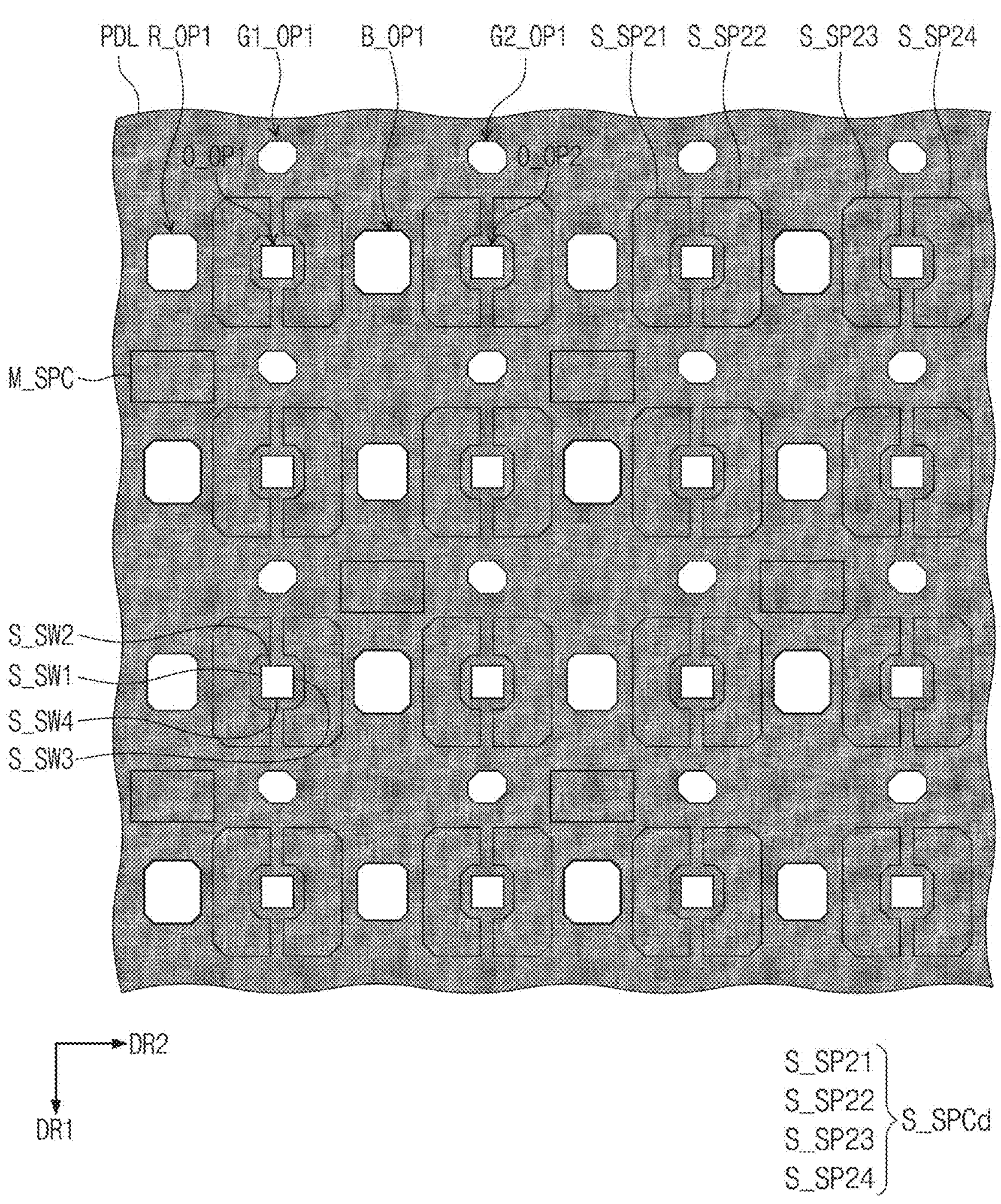
FIG. 12A is a plan view of a pixel definition layer, a main spacer layer, and a disconnected spacer layer according to some embodiments of the present disclosure.
Figure 12B:
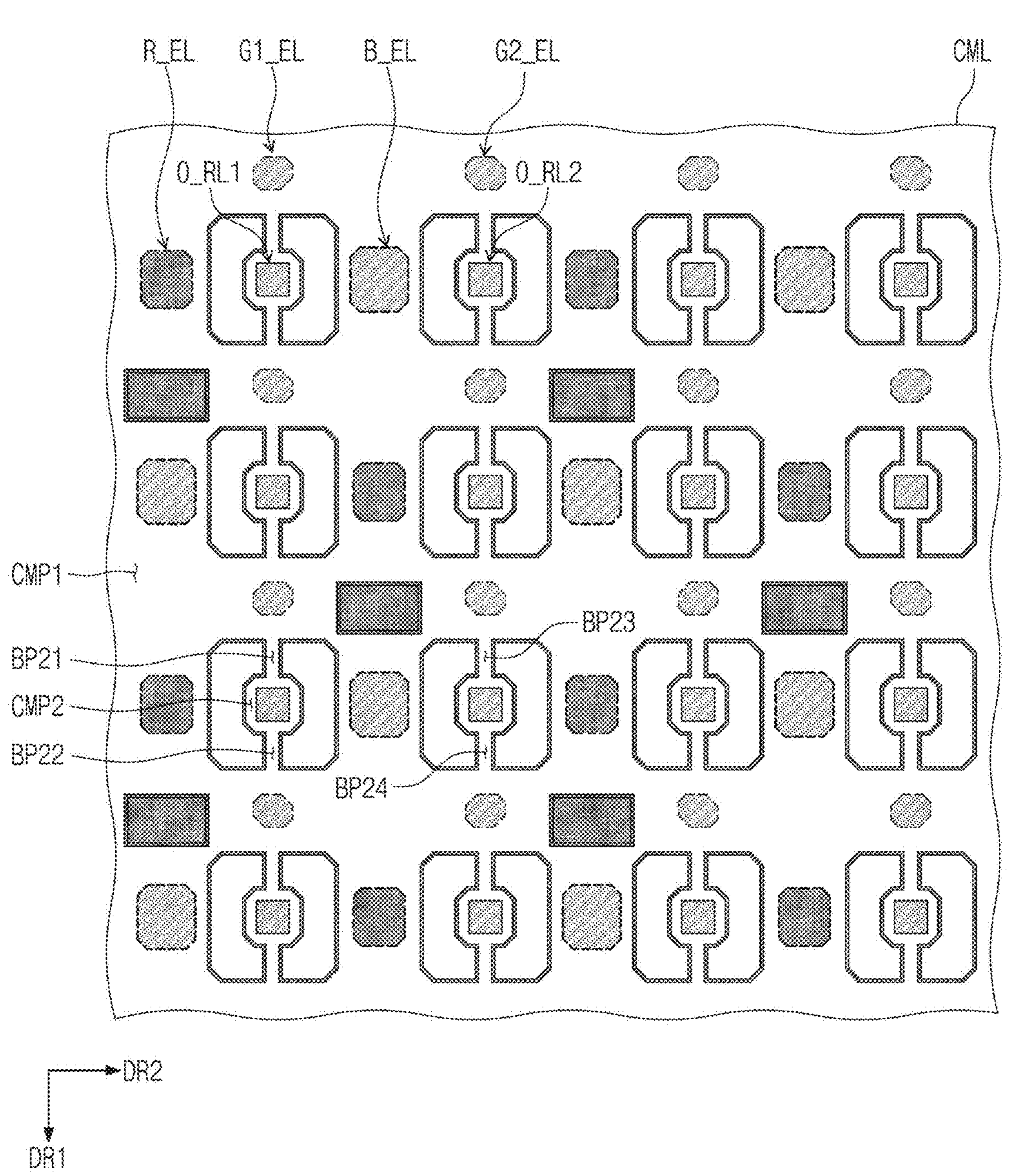
FIG. 12B is a plan view of a common layer, a light emitting layer, and a photoelectric conversion layer according to some embodiments of the present disclosure.

FIG. 12A is a plan view of a pixel definition layer, a main spacer layer, and a disconnected spacer layer according to some embodiments of the present disclosure, and FIG. 12B is a plan view of a common layer, a light emitting layer, and a photoelectric conversion layer according to some embodiments of the present disclosure.

Referring to FIG. 12A, the main spacer layer M_SPC and the disconnected spacer layer S_SPCd may be located on the pixel definition layer PDL. The disconnected spacer layer S_SPCd may include four disconnected spacers, for example, the first, second, third, and fourth disconnected spacers S_SP21, S_SP22, S_SP23, and S_SP24.

The first disconnected spacer S_SP21 may be located between a red light emitting opening R_OP1 and a first light receiving opening O_OP1, and the second disconnected spacer S_SP22 may be located between a blue light emitting opening B_OP1 and the first light receiving opening O_OP1. The third disconnected spacer S_SP23 may be located between the blue light emitting opening B_OP and a second light receiving opening O_OP2, and the fourth disconnected spacer S_SP24 may be located between the red light emitting opening R_OP1 and the second light receiving opening O_OP2. The first disconnected spacer S_SP21 and the second disconnected spacer S_SP22 may be spaced apart from each other in the second direction DR2, and the third disconnected spacer S_SP23 and the fourth disconnected spacer S_SP24 may be spaced apart from each other in the second direction DR2.

The first disconnected spacer S_SP21 may be arranged along a first sub-sidewall S_SW1 defining the first light receiving opening O_OP1. The second disconnected spacer S_SP22 may be arranged along a third sub-sidewall S_SW3 defining the first light receiving opening O_OP1. Both ends of the first disconnected spacer S_SP21 may be bent to the second disconnected spacer S_SP22 and may be located respectively adjacent to the second and fourth sub-sidewalls S_SW2 and S_SW4. Both ends of the second disconnected spacer S_SP22 may be bent to the first disconnected spacer S_SP21 and may be located respectively adjacent to the second and fourth sub-sidewalls S_SW2 and S_SW4. The first and second disconnected spacers S_SP21 and S_SP22 may be spaced apart from each other in areas respectively adjacent to the second and fourth sub-sidewalls S_SW2 and S_SW4.

FIG. 12A shows a structure in which both ends of the first and second disconnected spacers S_SP21 and S_SP22 are bent, however, the present disclosure should not be limited thereto or thereby. Each of the first and second disconnected spacers S_SP21 and S_SP22 may have a bar shape extending in the first direction DR1.

The third disconnected spacer S_SP23 may be arranged along the first sub-sidewall S_SW1 defining the second light receiving opening O_OP2, and the fourth disconnected spacer S_SP24 may be arranged along the third sub-sidewall SW3 defining the second light receiving opening O_OP2. Both ends of the third disconnected spacer S_SP23 may be bent to the fourth disconnected spacer S_SP24 and may be located respectively adjacent to the second and fourth sub-sidewalls S_SW2 and S_SW4. Both ends of the fourth disconnected spacer S_SP24 may be bent to the third disconnected spacer S_SP23 and may be located respectively adjacent to the second and fourth sub-sidewalls S_SW2 and S_SW4. The third and fourth disconnected spacers S_SP23 and S_SP24 may be spaced apart from each other in areas respectively adjacent to the second and fourth sub-sidewalls S_SW2 and S_SW4.

FIG. 12A shows a structure in which both ends of the third and fourth disconnected spacers S_SP23 and S_SP24 are bent, however, the present disclosure should not be limited thereto or thereby. Each of the third and fourth disconnected spacers S_SP23 and S_SP24 may have a bar shape extending in the first direction DR1.

The first and second disconnected spacers S_SP21 and S_SP22 may have a symmetrical shape with respect to an imaginary line passing through a center of the first light receiving opening O_OP1 and parallel to the first direction DR1. The third and fourth disconnected spacers S_SP23 and S_SP24 may have a symmetrical shape with respect to an imaginary line passing through a center of the second light receiving opening O_OP2 and parallel to the first direction DR1.

Referring to FIGS. 12A and 12B, the common layer CML may be located on the pixel definition layer PDL, the main spacer layer M_SPC, and the disconnected spacer layer S_SPCd.

The common layer CML may be disconnected around the first and second light receiving elements OPD1 and OPD2 by the disconnected spacer layer S_SPCd. The common layer CML may be disconnected along a sidewall of the first and second disconnected spacers S_SP21 and S_SP22 and may be disconnected along a sidewall of the third and fourth disconnected spacers S_SP23 and S_SP24.

The common layer CML may include a first connection portion BP21, a second connection portion BP22, a third connection portion BP23, and a fourth connection portion BP24. When viewed in the plane, the first connection portion BP21 may be located adjacent to the second sub-sidewall SW2 of the first light receiving opening O_OP1 and may be located between the first and second disconnected spacers S_SP21 and S_SP22, and the second connection portion BP22 may be located adjacent to the fourth sub-sidewall S_SW4 of the first light receiving opening O_OP1 and may be located between the first and second disconnected spacers S_SP21 and S_SP22. When viewed in the plane, the third connection portion BP23 may be located adjacent to the second sub-sidewall S_SW2 of the second light receiving opening O_OP2 and may be located between the third and fourth disconnected spacers S_SP23 and S_SP24, and the fourth connection portion BP24 may be located adjacent to the fourth sub-sidewall S_SW4 of the second light receiving opening O_OP2 and may be located between the third and fourth disconnected spacers S_SP23 and S_SP24.

The common layer CML may include a first common portion CMP1 commonly arranged on light emitting elements R_ED, G1_ED, G2_ED, and B_ED (refer to FIG. 4A) and second common portions CMP2 arranged to respectively correspond to the light receiving elements OPD1 and OPD2 (refer to FIG. 4A). The second common portion CMP2 may be electrically connected to the first common portion CMP1 via the first to fourth connection portions BP21 to BP24.

As described above, in the case where the first and second light receiving elements OPD1 and OPD2 receive the light to sense from the red and/or blue light emitting elements ED_R and/or ED_B, the first to fourth disconnected spacers S_SP21 to S_SP24 may be located between the first and second light receiving elements OPD1 and OPD2 and the red and/or blue light emitting elements ED_R and/or ED_B. Accordingly, as the common layer CML is partially disconnected by the first to fourth disconnected spacers S_SP21 to S_SP24, the leakage current to the red and/or blue light emitting elements ED_R and/or ED_B may be effectively blocked.

Figure 13A:
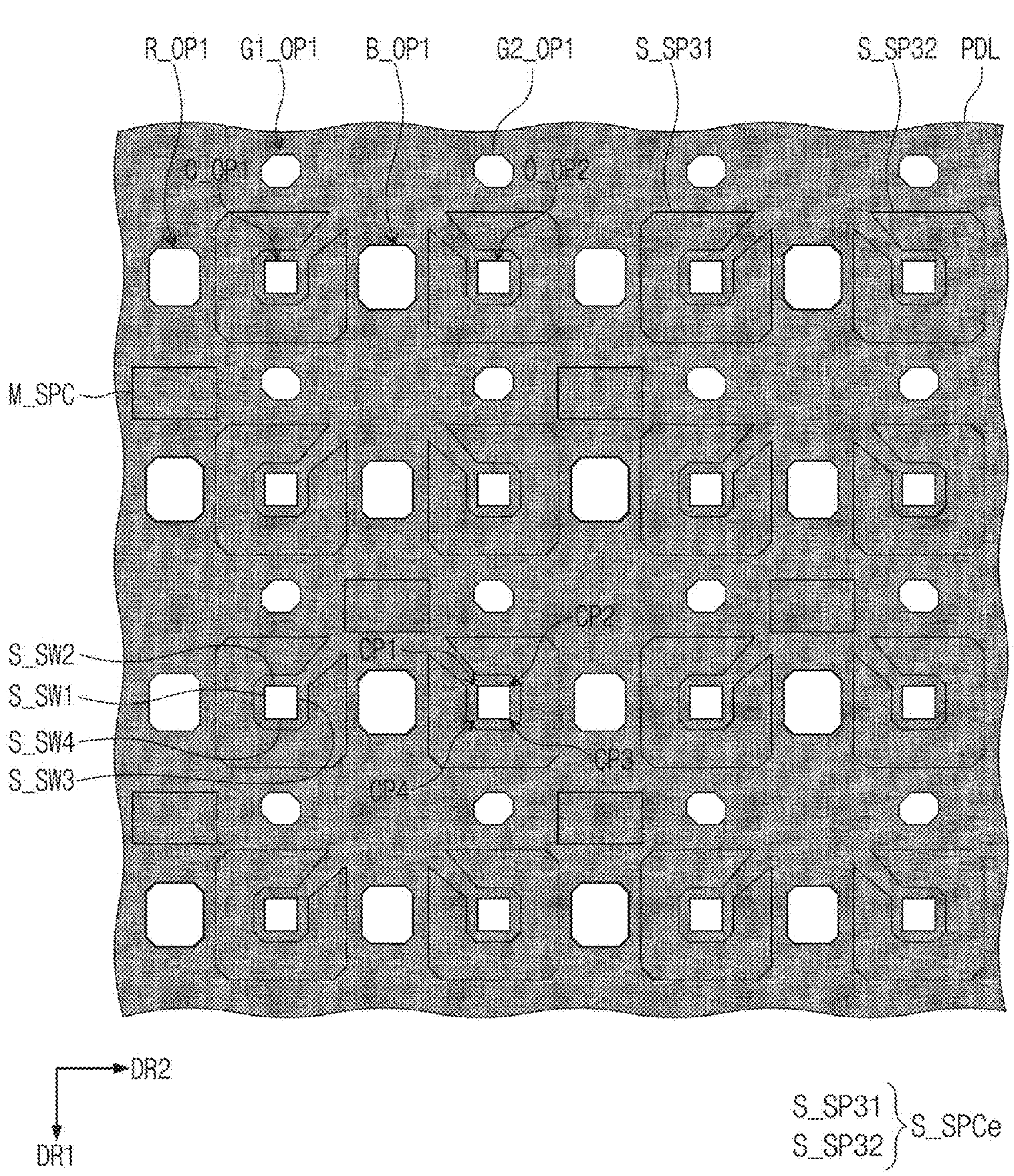
FIG. 13A is a plan view of a pixel definition layer, a main spacer layer, and a disconnected spacer layer according to some embodiments of the present disclosure.
Figure 13B:
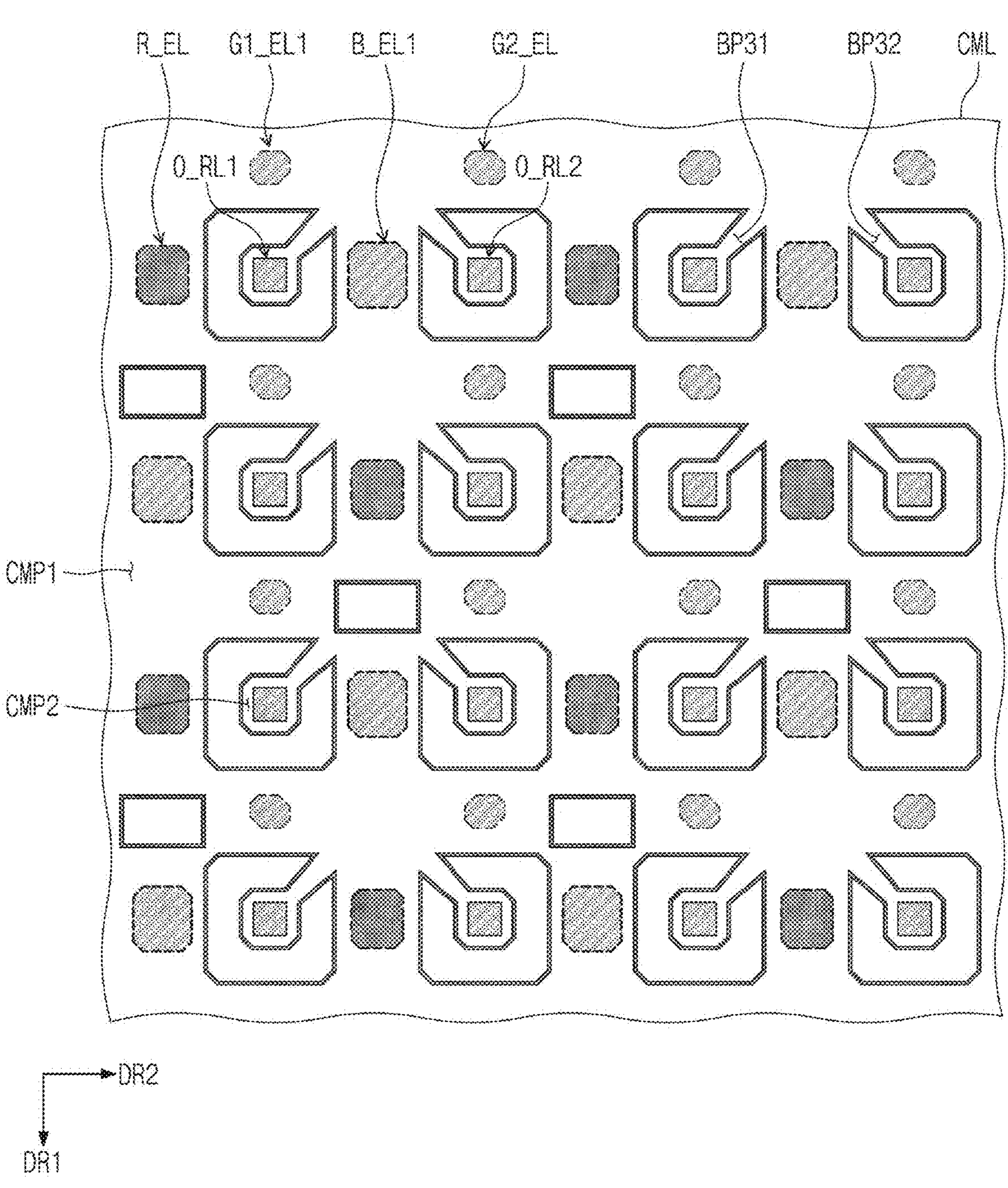
FIG. 13B is a plan view of a common layer, a light emitting layer, and a photoelectric conversion layer according to some embodiments of the present disclosure.

FIG. 13A is a plan view of a pixel definition layer PDL, a main spacer layer M_SPC, and a disconnected spacer layer S_SPCe according to some embodiments of the present disclosure, and FIG. 13B is a plan view of a common layer CML, a light emitting layer, and a photoelectric conversion layer according to some embodiments of the present disclosure.

Referring to FIG. 13A, the main spacer layer M_SPC and the disconnected spacer layer S_SPCe may be located on the pixel definition layer PDL. The disconnected spacer layer S_SPCe may include two disconnected spacers, e.g., first and second disconnected spacers S_SP31 and S_SP32.

The first disconnected spacer S_SP31 may be arranged to surround a first light receiving opening O_OP1, and the second disconnected spacer S_SP32 may be arranged to surround a second light receiving opening O_OP2. Both ends of the first disconnected spacer S_SP31 may be spaced apart from each other in an area adjacent to one of corner portions CP1 to CP4 of the first light receiving opening O_OP1. As an example, both ends of the first disconnected spacer S_SP31 may be spaced apart from each other in an area adjacent to a second corner portion CP2. Both ends of the second disconnected spacer S_SP32 may be spaced apart from each other in an area adjacent to one of corner portions CP1 to CP4 of the second light receiving opening O_OP2. As an example, both ends of the second disconnected spacer S_SP32 may be spaced apart from each other in an area adjacent to a first corner portion CP1. FIG. 13A shows a structure in which a corner portion where both ends of the first disconnected spacer S_SP31 are spaced apart from each other is different from a corner portion where both ends of the second disconnected spacer S_SP32 are spaced apart from each other, however, the present disclosure should not be limited thereto or thereby. Alternatively, both ends of the first disconnected spacer S_SP31 may be spaced apart from each other at a first corner portion CP1 of the first light receiving opening O_OP1, and both ends of the second disconnected spacer S_SP32 may be spaced apart from each other at the first corner portion CP1 of the second light receiving opening O_OP2.

Referring to FIGS. 13A and 13B, the common layer CML may be located on the pixel definition layer PDL, the main spacer layer M_SPC, and the disconnected spacer layer S_SPCe.

The common layer CML may be partially disconnected around first and second light receiving elements OPD1 and OPD2 (refer to FIG. 4A) by the disconnected spacer layer S_SPCe. The common layer CML may be disconnected along a sidewall of the first and second disconnected spacers S_SP31 and S_SP32.

The common layer CML may include a first connection portion BP31 and a second connection portion BP32. When viewed in the plane, the first connection portion BP31 may be located adjacent to the second corner portion CP2 of the first light receiving opening O_OP1 and may be located between both ends of the first disconnected spacer S_SP31, and the second connection portion BP32 may be located adjacent to the first corner portion CP1 of the second light receiving opening O_OP2 and may be located between both ends of the second disconnected spacer S_SP32.

The common layer CML may include a first common portion CMP1 commonly located on light emitting elements R_ED, G1_ED, G2_ED, and B_ED (refer to FIG. 4A) and second common portions CMP2 arranged to respectively correspond to the light receiving elements OPD1 and OPD2 (refer to FIG. 4A). The second common portion CMP2 may be electrically connected to the first common portion CMP1 via connection portions BP31 and BP32.

In FIG. 10B, the two connection portions BPa and BPb, i.e., the leakage current path, are formed in one light receiving element, however, one connection portion BP31 or BP32, i.e., a leakage current path, may be formed in one light receiving element in FIG. 13B. As described above, in a case where the number of the leakage current paths decreases, the leakage of current charged in the first and second light receiving elements OPD1 and OPD2 through the common layer CML may be effectively prevented. However, an effective area of a common cathode electrode C_CE may decrease, and a voltage drop may occur due to the decrease of the effective area. Accordingly, the number of the connection portions BP31 or BP32 formed on the common layer CML may be determined by taking into account the leakage current and the voltage drop.

Figure 14A:
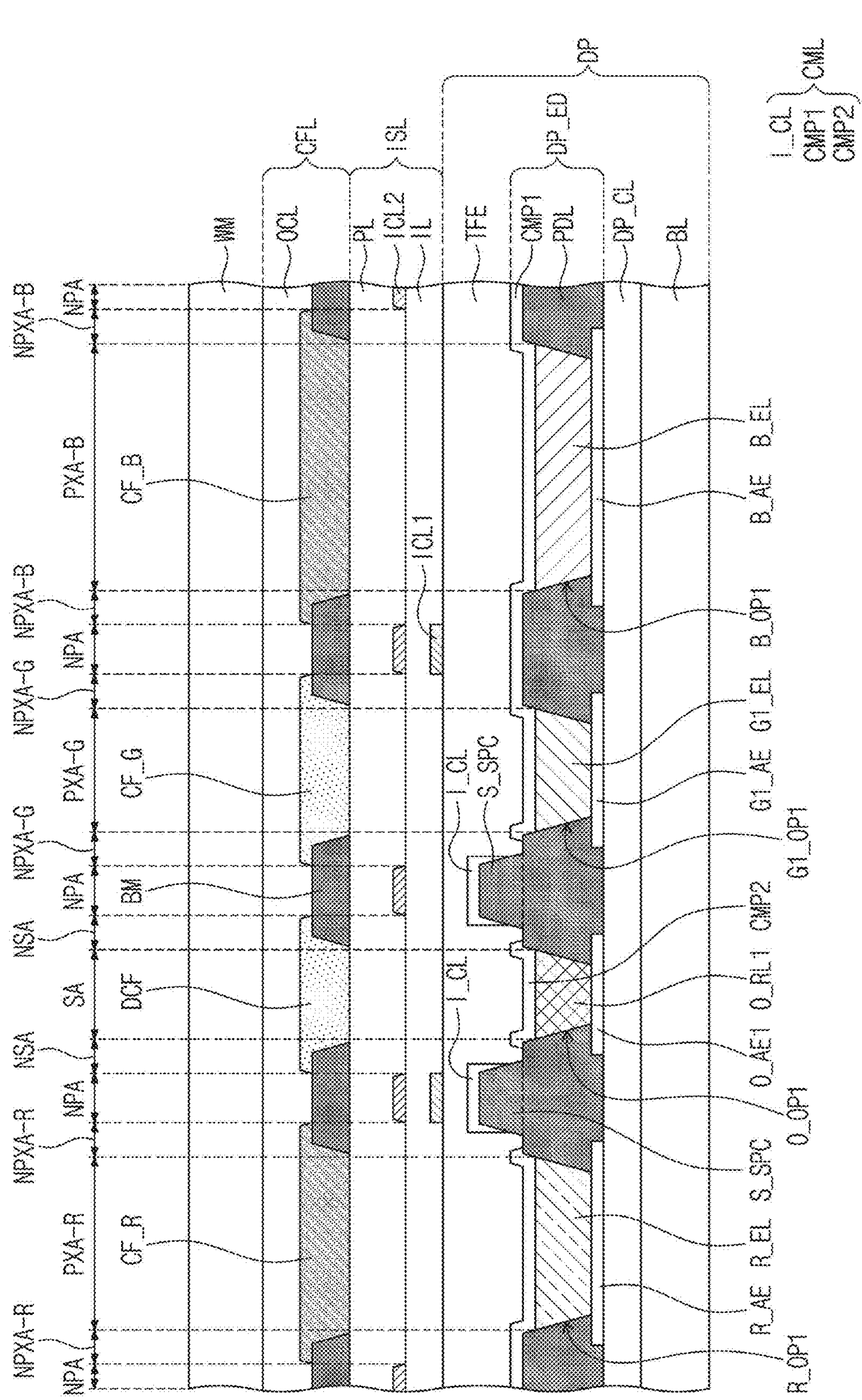
FIGS. 14A and 14B are cross-sectional views of a light emitting element and a light receiving element of a display panel according to some embodiments of the present disclosure.
Figure 14B:
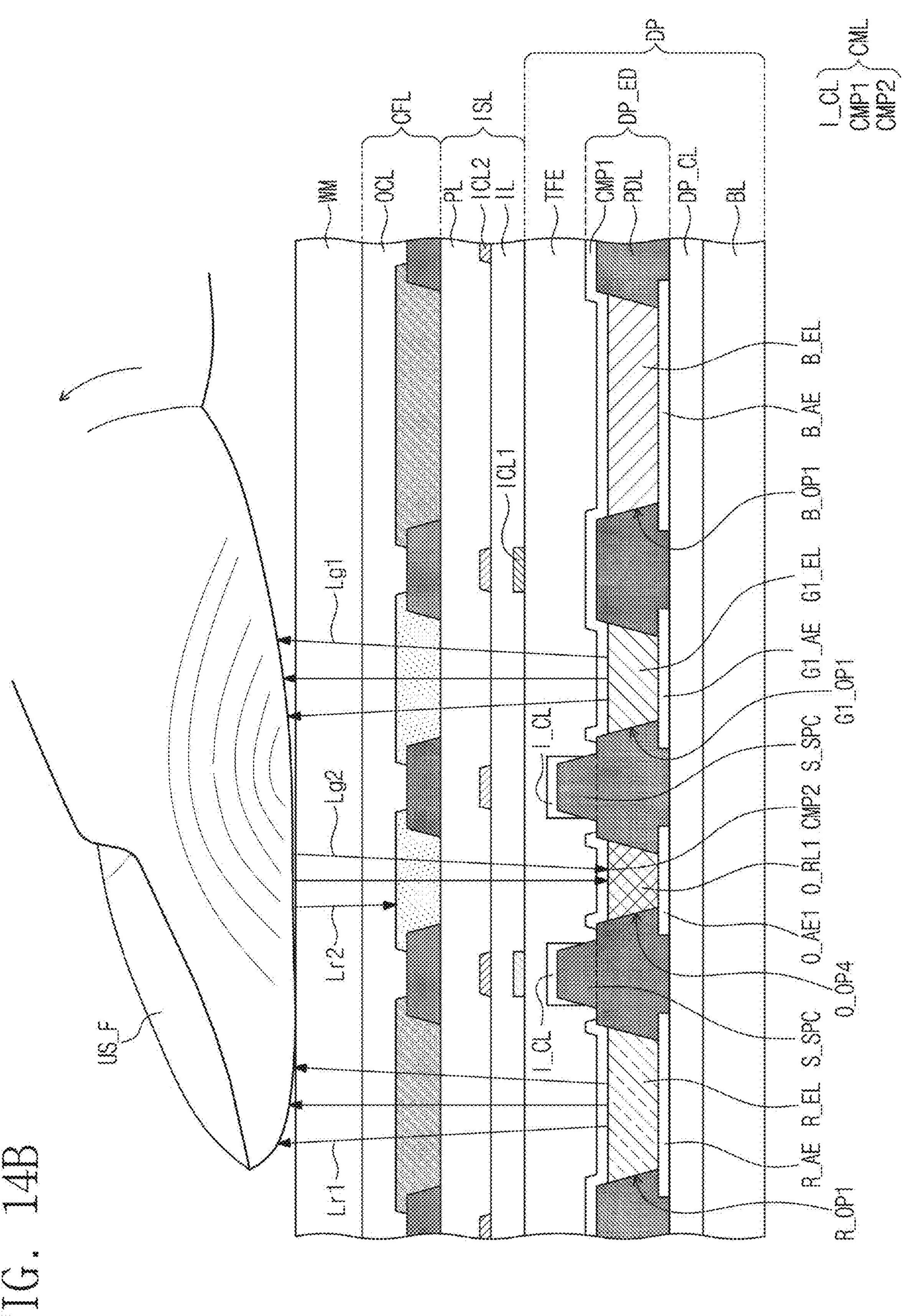

FIGS. 14A and 14B are cross-sectional views of a light emitting element and a light receiving element of a display panel according to some embodiments of the present disclosure.

Referring to FIGS. 14A and 14B, a first electrode layer may be located on an element layer DP_CL. A pixel definition layer PDL may be located on the first electrode layer. The first electrode layer may include red, first green, and blue anode electrodes R_AE, G_AE1, and B_AE. At least portions of the red, first green, and blue anode electrodes R_AE, G_AE1, and B_AE may be exposed through light emitting openings R_OP1, G1_OP1, and B_OP1 of the pixel definition layer PDL, respectively. According to some embodiments, the pixel definition layer PDL may further include a black material. The pixel definition layer PDL may further include a black organic dye/pigment, such as a carbon black or an aniline black. The pixel definition layer PDL may be formed by mixing a blue organic material with a black organic material. The pixel definition layer PDL may further include a liquid-repellent organic material.

Referring to FIG. 14A, the display panel DP may include first, second, and third light emitting areas PXA-R, PXA-G, and PXA-B and first, second, and third non-light-emmitting areas NPXA-R, NPXA-G, and NPXA-B adjacent to the first, second, and third light emitting areas PXA-R, PXA-G, and PXA-B. Each of the non-light-emitting areas NPXA-R, NPXA-G, and NPXA-B may surround a corresponding light emitting area among the light emitting areas PXA-R, PXA-G, and PXA-B. According to some embodiments, the first light emitting area PXA-R may be defined to correspond to a portion of the red anode electrode R_AE exposed through a red opening R_OP1. The second light emitting area PXA-G may be defined to correspond to a portion of the first green anode electrode G1_AE exposed through a first green opening G1_OP1. The third light emitting area PXA-B may be defined to correspond to a portion of the blue anode electrode B_AE exposed through a blue opening B_OP1. A non-pixel area NPA may be defined between the first, second, and third non-light-emitting areas NPXA-R, NPXA-G, and NPXA-B.

A light emitting layer may be located on the first electrode layer. The light emitting layer may include red, first green, and blue light emitting layers R_EL, G1_EL, and B_EL. The red, first green, and blue light emitting layers R_EL, G1_EL, and B_EL may be located in areas respectively corresponding to the red, first green, and blue openings R_OP1, G1_OP1, and B_OP1. The red, first green, and blue light emitting layers R_EL, G1_EL, and B_EL may be separated from each other and respectively formed in red, first green, and blue pixels PXR, PXG1, and PXB (refer to FIG. 4A). Each of the red, first green, and blue light emitting layers R_EL, G1_EL, and B_EL may include an organic material and/or an inorganic material. The red, first green, and blue light emitting layers R_EL, G1_EL, and B_EL may generate a color light (e.g., a set or predetermined color light). As an example, the red light emitting layer R_EL may generate a red light, the first green light emitting layer G1_EL may generate a green light, and the blue light emitting layer B_EL may generate a blue light.

According to some embodiments, the patterned red, first green, and blue light emitting layers R_EL, G1_EL, and B_EL are shown as a representative example, however, one light emitting layer may be commonly located in the first, second, and third light emitting areas PXA-R, PXA-G, and PXA-B. In this case, the light emitting layer may generate a white light or a blue light. In addition, the light emitting layer may have a multi-layer structure that is called a tandem.

Each of the red, first green, and blue light emitting layers R_EL, G1_EL, and B_EL may include a low molecular weight organic material or a high molecular weight organic material as the light emitting material. According to some embodiments, each of the red, first green, and blue light emitting layers R_EL, G1_EL, and B_EL may include a quantum dot as the light emitting material. A core of the quantum dot may be selected from a group II-VI compound, a group III-V compound, a group IV-VI compound, a group IV element, a group IV compound, and combinations thereof.

The common layer CML may be located on the light emitting layer. The common layer CML may include a common cathode electrode C_CE (referred to FIG. 7A), a hole control layer HCL (referred to FIG. 7A), and an electron control layer ECL (referred to FIG. 7A). The common layer CML may be commonly located in the third light emitting areas PXA-R, PXA-G, and PXA-B, the first, second, and third non-light-emitting areas NPXA-R, NPXA-G, and NPXA-B, and the non-pixel area NPA.

The element layer DP_ED may further include light receiving elements OPD1 and OPD2 (refer to FIG. 4A). Each of the light receiving elements OPD1 and OPD2 may be a photodiode. The pixel definition layer PDL may further include first and second light receiving openings O_OP1 and O_OP2 corresponding to the light receiving elements OPD1 and OPD2.

As an example, the first light receiving element OPD1 may include a first sensing anode electrode O_AE1 and a first photoelectric conversion layer O_RL1. The first sensing anode electrode O_AE1 may be located on the same layer as a layer on which the first electrode layer is located. That is, the first sensing anode electrode O_AE1 may be located on a circuit layer DP_CL and may be formed through the same process as the red, first green, and blue anode electrodes R_AE, G1_AE, and B_AE.

A least a portion of the first sensing anode electrode O_AE1 may be exposed through the first light receiving opening O_OP1 of the pixel definition layer PDL. The first photoelectric conversion layer O_RL1 may be located on the first sensing anode electrode O_AE1 exposed through the first light receiving opening O_OP1. The first photoelectric conversion layer O_RL1 may include an organic photosensitive material. The first photoelectric conversion layer O_RL1 may generate an electrical signal corresponding to a light incident into a sensor. The first photoelectric conversion layer O_RL1 may absorb an energy of the light incident thereto and may generate electric charges. As an example, the first photoelectric conversion layer O_RL1 may include a photosensitive semiconductor material.

The common layer CML may be partially disconnected by a disconnected spacer layer S_SPC and may be divided into two portions, e.g., a first common portion CMP1 commonly located on the light emitting elements R_ED, G1_ED, G2_ED, and B_ED (refer to FIG. 4A) and second common portions CMP2 arranged to respectively correspond to the light receiving elements OPD1 and OPD2 (refer to FIG. 4A). However, the first common portion CMP1 and the second common portion CMP2 may not be electrically separated from each other and may be electrically connected to each other via first to fourth connection portions BP1 to BP4 (refer to FIG. 6D).

An encapsulation layer TFE may be located on the element layer DP_ED. The encapsulation layer TFE may include at least an inorganic layer or an organic layer. According to some embodiments, the encapsulation layer TFE may include two inorganic layers and the organic layer located between the inorganic layers. According to some embodiments, a thin film encapsulation layer may include a plurality of inorganic layers and a plurality of organic layers alternately stacked with the inorganic layers.

The encapsulation inorganic layer may protect the red, first green, and blue light emitting elements ED_R, ED_G1, and ED_B and the first light receiving element OPD1 from moisture and oxygen, and the encapsulation organic layer may protect the red, first green, and blue light emitting elements ED_R, ED_G1, and ED_B and the first light receiving element OPD1 from a foreign substance such as dust particles. The encapsulation inorganic layer may include a silicon nitride layer, a silicon oxynitride layer, a silicon oxide layer, a titanium oxide layer, or an aluminum oxide layer, however, it should not be particularly limited. The encapsulation organic layer may include an acrylic-based organic layer, however, it should not be particularly limited.

The display device DD (refer to FIG. 1) may include an input sensing layer ISL located on the display panel DP and a color filter layer CFL located on the input sensing layer ISL.

The input sensing layer ISL may be located directly on the encapsulation layer TFE. The input sensing layer ISL may include a first conductive layer ICL1, an insulating layer IL, a second conductive layer ICL2, and a protective layer PL. The first conductive layer ICL1 may be located on the encapsulation layer TFE. FIGS. 14A and 14B show a structure in which the first conductive layer ICL1 is directly located on the encapsulation layer TFE, however, the present disclosure should not be limited thereto or thereby. The input sensing layer ISL may further include a base insulating layer located between the first conductive layer ICL1 and the encapsulation layer TFE. In this case, the encapsulation layer TFE may be covered by the base insulating layer, and the first conductive layer ICL1 may be located on the base insulating layer. As an example, the base insulating layer may include an inorganic insulating material.

The insulating layer IL may cover the first conductive layer ICL1. The second conductive layer ICL2 may be located on the insulating layer IL. According to some embodiments, a structure in which the input sensing layer ISL includes the first and second conductive layers ICL1 and ICL2 is shown, however, the present disclosure should not be limited thereto or thereby. As an example, the input sensing layer ISL may include only one of the first and second conductive layers ICL1 and ICL2.

The protective layer PL may be located on the second conductive layer ICL2. The protective layer PL may include an organic insulating material. The protective layer PL may protect the first and second conductive layers ICL1 and ICL2 from moisture and oxygen and may protect the first and second conductive layers ICL1 and ICL2 from a foreign substance.

The color filter layer CFL may be located on the input sensing layer ISL. The color filter layer CFL may be located directly on the protective layer PL. The color filter layer CFL may include a first color filter CF_R, a second color filter CF_G, and a third color filter CF_B. The first color filter CF_R may have a first color, the second color filter CF_G may have a second color, and the third color filter CF_B may have a third color. As an example, the first color may be a red color, the second color may be a green color, and the third color may be a blue color.

The color filter layer CFL may further include a dummy color filter DCF. As an example, when an area in which the first photoelectric conversion layer O_RL1 is located is defined as a sensing area SA and a peripheral area of the sensing area SA is defined as a non-sensing area NSA, the dummy color filter DCF may be arranged to correspond to the sensing area SA. The dummy color filter DCF may overlap the sensing area SA and the non-sensing area NSA. As an example, the dummy color filter DCF may have the same color as one of the first, second, and third color filters CF_R, CF_G, and CF_B. As an example, the dummy color filter DCF may have the same color, e.g., the green color, as that of the second color filter CF_G.

The color filter layer CFL may further include a black matrix BM. The black matrix BM may be arranged to correspond to the non-pixel area NPA. The black matrix BM may be located in the non-pixel area NPA and may overlap the first and second conductive layers ICL1 and ICL2. As an example, the black matrix BM may overlap the non-pixel area NPA and the first, second, and third non-light-emitting areas NPXA-G, NPXA-B, and NPXA-R. The black matrix BM may not overlap the first, second, and third light emitting areas PXA-R, PXR-G, and PXA-B.

The color filter layer CFL may further include an overcoating layer OCL. The overcoating layer OCL may include an organic insulating material. The overcoating layer OCL may have a thickness enough to compensate for a step difference between the first, second, and third color filters CF_R, CF_G, and CF_B. A material for the overcoating layer OCL should not be particularly limited as long as the overcoating layer OCL may have a thickness (e.g., a set or predetermined thickness) and may planarize an upper surface of the color filter layer CFL. As an example, the overcoating layer OCL may include an acrylic-based organic material.

Referring to FIG. 14B, when the display device DD (refer to FIG. 1) operates, each of the red, first green, and blue light emitting elements ED_R, ED_G1, and ED_B may emit the light. The red light emitting elements ED_R may emit red light Lr1 in a red wavelength band, the first green light emitting elements ED_G1 may emit green light Lg1 in a green wavelength band, and the blue light emitting elements ED_B may emit blue light in a blue wavelength band.

As an example, the first light receiving element OPD1 may receive the light from specific light emitting elements, e.g., the first green light emitting elements ED_G1, among the red, first green, and blue light emitting elements ED_R, ED_G1, and ED_B. That is, the first light receiving element OPD1 may receive a reflected green light Lg2 generated by reflecting the green light Lg1 emitted from the first green light emitting elements ED_G1 by a user's fingerprint. The second light Lg1 and the second reflected light Lg2 may be the green light in the green wavelength band. The dummy color filter DCF may be located above the first light receiving element OPD1. The dummy color filter DCF may have the green color. Accordingly, the reflected green light Lg2 may be incident into the first light receiving element OPD1 after passing through the dummy color filter DCF.

Meanwhile, the red light and the blue light emitted from the red and blue light emitting elements ED_R and ED_B may also be reflected by the user's hand US_F. As an example, when light generated by reflecting the red light Lr1 emitted from the red light emitting elements ED_R by the user's hand US_F is defined as a reflected red light Lr2, the reflected red light Lr2 may not pass through the dummy color filter DCF and may be absorbed by the dummy color filter DCF. Accordingly, the reflected red light Lr2 may not pass through the dummy color filter DCF and may not be incident into the first light receiving element OPD1. Similarly, even though the blue light is reflected by the user's hand US_F, the blue light may be absorbed by the dummy color filter DCF. Accordingly, only the reflected green light Lg2 may be provided to the first light receiving element OPD1.

FIGS. 15A to 15D are process views of a manufacturing method of the display device according to some embodiments of the present disclosure.

Figure 15A:
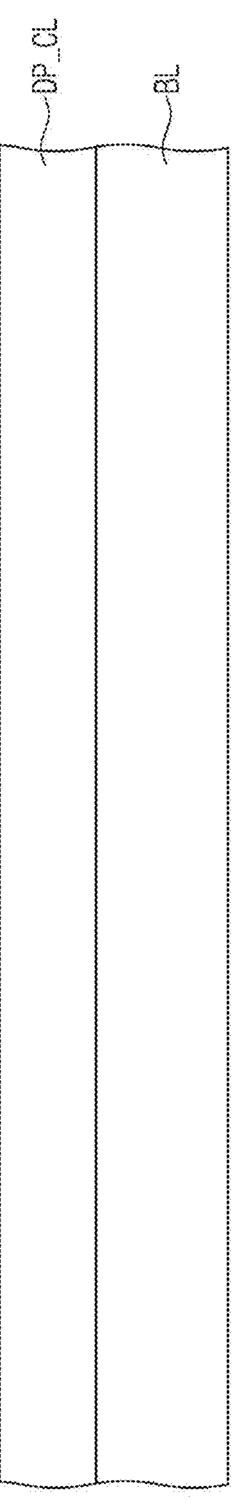
FIGS. 15A to 15D are process views of a manufacturing method of a display device according to some embodiments of the present disclosure.

Referring to FIG. 15A, the circuit layer DP_CL may be formed on the base layer BL. The circuit layer DP_CL may include the pixel driving circuits R_PD, G1_PD, G2_PD, and B_PD and the sensor driving circuit O_SD shown in FIG. 4A.

Figure 15B:
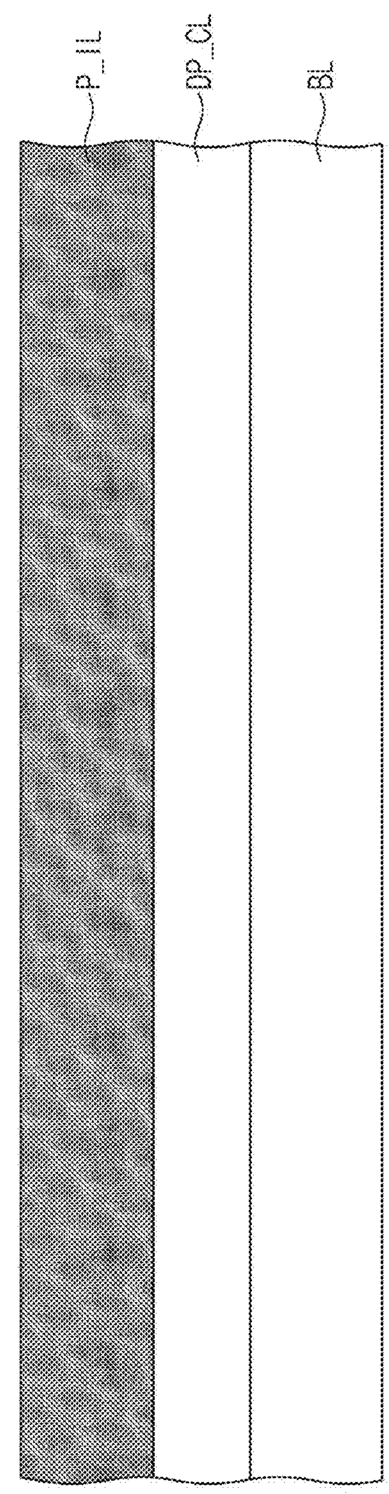

The element layer DP_ED (referred to FIG. 7A) may be formed on the circuit layer DP_CL. A process of forming the element layer DP_ED may include a process of forming a preliminary insulating layer P_IL as shown in FIG. 15B. The preliminary insulating layer P_IL may include an organic insulating material. The preliminary insulating layer P_IL may further include a black material. The preliminary insulating layer P_IL may further include a black organic dye/pigment, such as a carbon black or an aniline black. The preliminary insulating layer P_IL may be formed by mixing a blue organic material with a black organic material. The preliminary insulating layer P_IL may further include a liquid-repellent organic material.

Figure 15C:
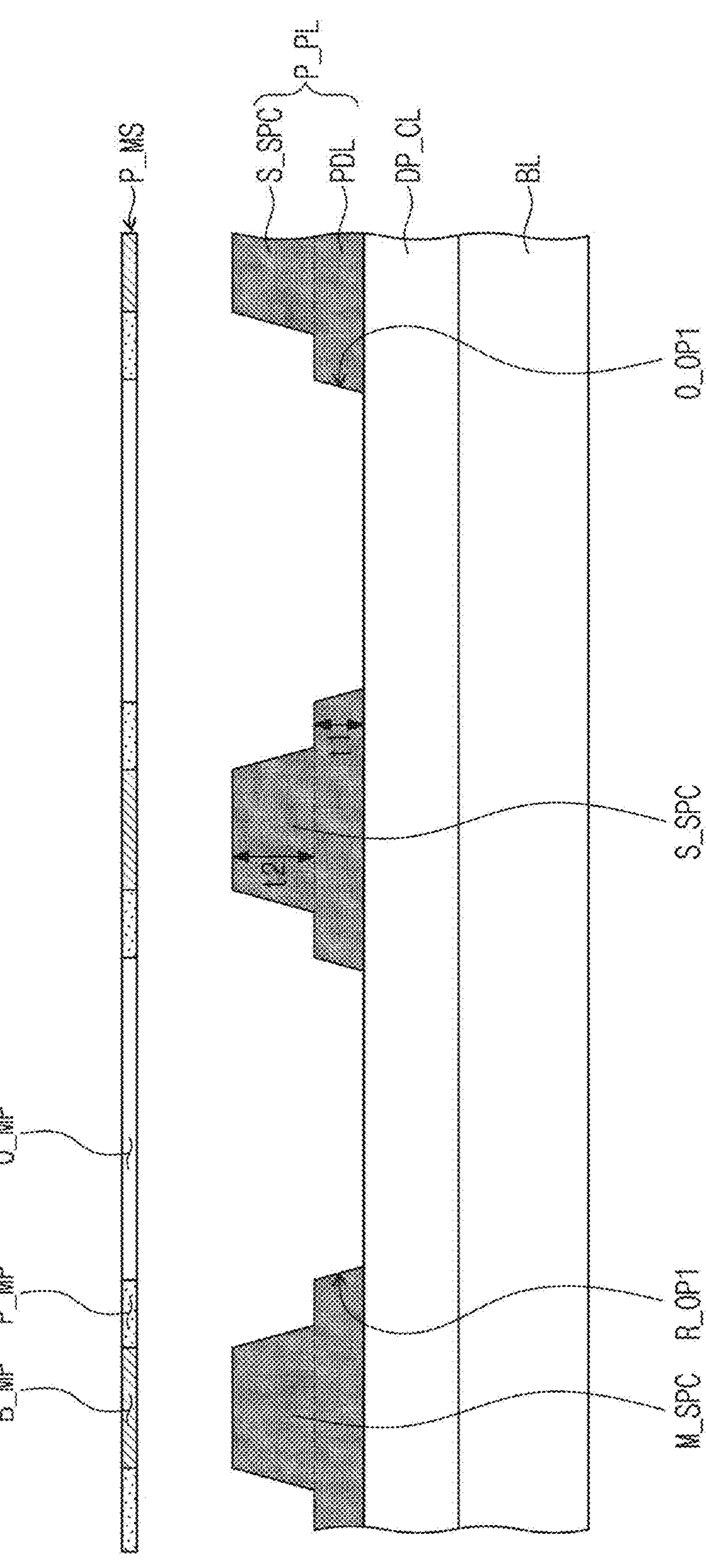

Referring to FIG. 15C, the preliminary insulating layer P_IL may be patterned to form a pattern insulating layer P_PL including the light emitting opening, e.g., the red opening R_OP1, and the light receiving opening, e.g., the first light receiving opening O_OP1. The pattern insulating layer P_PL may include the pixel definition layer PDL, the main spacer layer M_SPC, and the disconnected spacer layer S_SPC. The red opening R_OP1 and the first light receiving opening O_OP1 may be defined through the pixel definition layer PDL. The pixel definition layer PDL may be referred to as a first portion having a first thickness t1 in the pattern insulating layer P_PL. The main spacer layer M_SPC and the disconnected spacer layer S_SPC may be referred to as a second portion having a second thickness t2 greater than the first thickness t1 in the pattern insulating layer P_PL. As an example, the main spacer layer M_SPC and the disconnected spacer layer S_SPC may have the same thickness, however, the present disclosure should not be limited thereto or thereby. The main spacer layer M_SPC and the disconnected spacer layer S_SPC may have different thicknesses from each other. As an example, the disconnected spacer layer S_SPC may have a thickness greater than a thickness of the main spacer layer M_SPC.

A pattern mask P_MS may be located on the preliminary insulating layer P_IL to form the pattern insulating layer P_PL. The pattern mask P_MS may include an open pattern portion O_MP, a half pattern portion P_MP, and a light blocking pattern portion B_MP. The open pattern portion O_MP may be located at portions respectively corresponding to the red opening R_OP1 and the first light receiving opening O_OP1, and the half pattern portion P_MP may be located at a position that overlaps the first portion and does not overlap the second portion. The light blocking pattern portion B_MP may be located at a position overlapping the second portion.

Then, when the preliminary insulating layer P_IL is patterned by a photolithography process using the pattern mask P_MS, the pattern insulating layer P_PL may be formed. The red opening R_OP1 and the first light receiving opening O_OP1 may be formed to correspond to the open pattern portion O_MP, and the pixel definition layer PDL having the first thickness t1 may be formed to correspond to the half pattern portion P_MP. The pixel definition layer having the first thickness t1 and the main and disconnected spacer layers M_SPC and S_SPC having the second thickness t2 may be formed to correspond to the light blocking pattern portion B_MP.

Figure 15D:
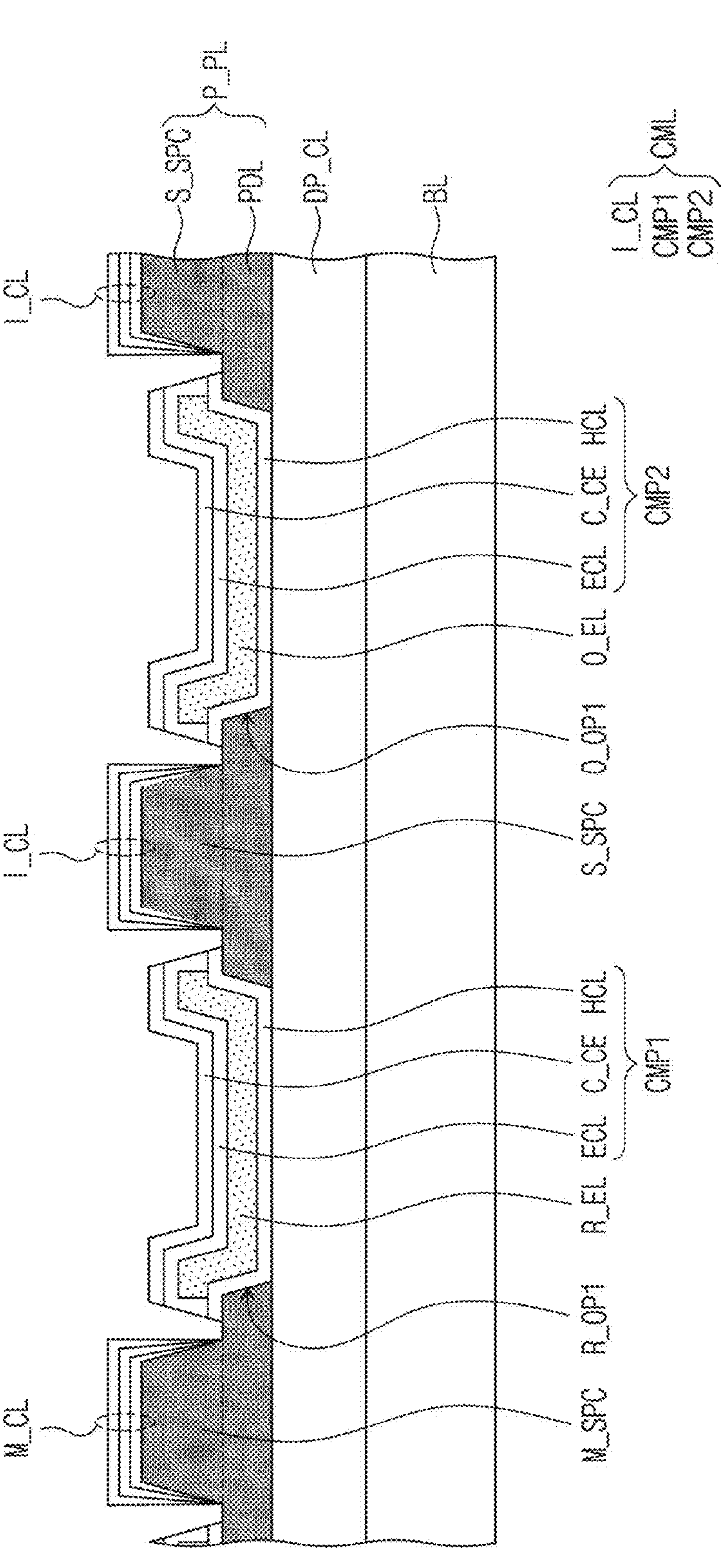

Referring to FIG. 15D, the common layer CML may be formed on the pattern insulating layer P_PL. The common layer CML may be partially disconnected by the disconnected spacer layer S_SPC and the main spacer layer M_SPC and may be divided into the two portions, i.e., the first common portion CMP1 commonly located on the light emitting elements R_ED, G1_ED, G2_ED, and B_ED (refer to FIG. 4A) and the second common portions CMP2 arranged to respectively correspond to the light receiving elements OPD1 and OPD2 (refer to FIG. 4A). Each of the first and second common portions CMP1 and CMP2 may include the common cathode electrode C_CE, the hole control layer HCL, and the electron control layer ECL. The island portion I_CL may be located on the disconnected spacer layer S_SPC and the main spacer layer M_SPC and may be electrically insulated from the first and second common portions CMP1 and CMP2. The first and second common portions CMP1 and CMP2 may be electrically connected to each other via the first to fourth connection portions BP1 to BP4 (refer to FIG. 6D). Descriptions of the common layer CML are the same as those described with reference to FIGS. 6A to 14B, and thus, details thereof will be omitted.

FIGS. 16A to 16F are process views of a manufacturing method of the display device according to some embodiments of the present disclosure.

Figure 16A:
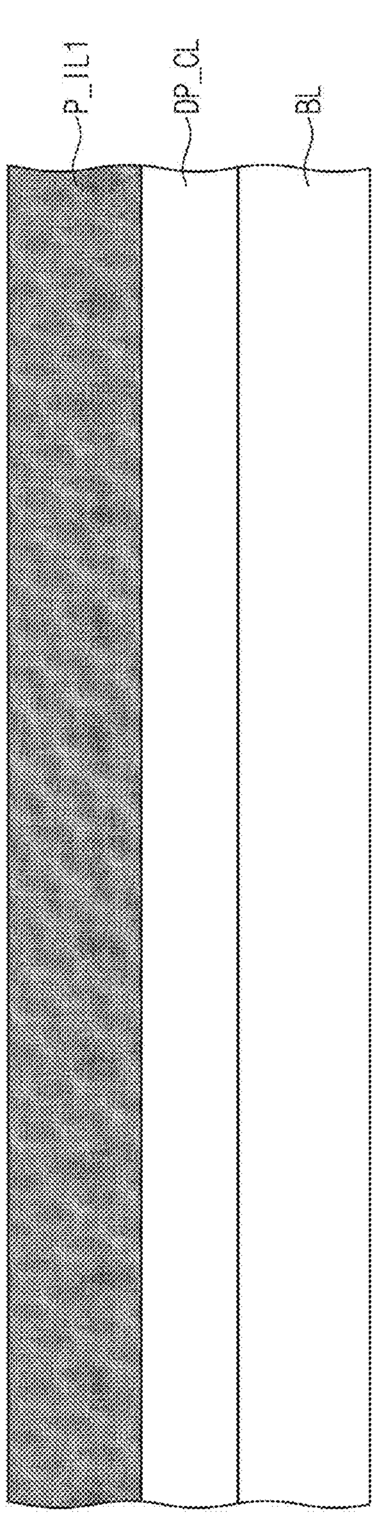
FIGS. 16A to 16F are process views of a manufacturing method of a display device according to some embodiments of the present disclosure.

Referring to FIG. 16A, the circuit layer DP_CL may be formed on the base layer BL, and the element layer DP_ED (referred to FIG. 7A) may be formed on the circuit layer DP_CL. The process of forming the element layer DP_ED may include a process of forming a first preliminary insulating layer P_IL1 as shown in FIG. 16A. The first preliminary insulating layer P_IL1 may include an organic insulating material. The first preliminary insulating layer P_IL1 may further include a black material. The first preliminary insulating layer P_IL1 may further include a black organic dye/pigment, such as a carbon black or an aniline black. The first preliminary insulating layer P_IL1 may be formed by mixing a blue organic material with a black organic material. The first preliminary insulating layer P_IL1 may further include a liquid-repellent organic material.

Figure 16B:
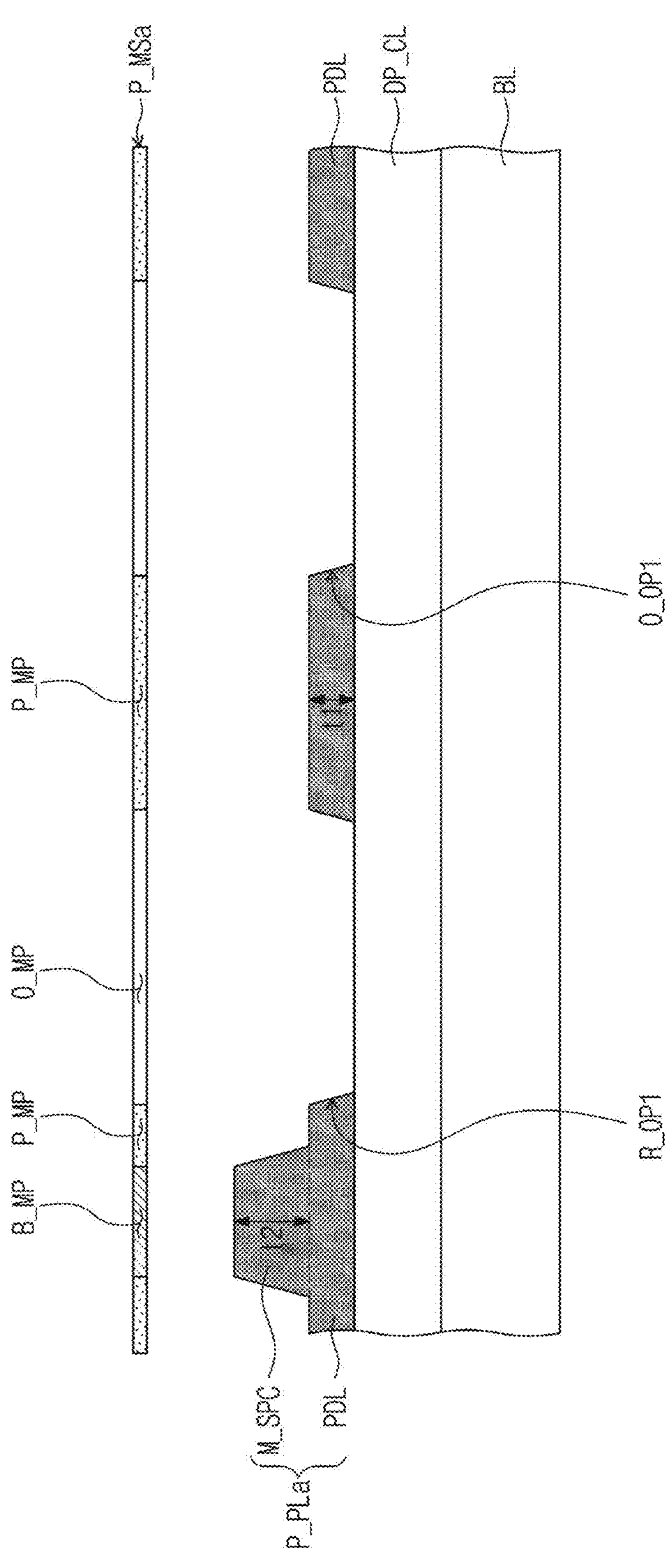

Referring to FIG. 16B, the first preliminary insulating layer P_IL1 may be patterned to form a pattern insulating layer P_PLa including the light emitting opening, e.g., the red opening R_OP1, and the light receiving opening, e.g., the first light receiving opening O_OP1. The pattern insulating layer P_PLa may include the pixel definition layer PDL and the main spacer layer M_SPC. Alternatively, the main spacer layer M_SPC may be omitted from the pattern insulating layer P_PLa.

The red opening R_OP1 and the first light receiving opening O_OP1 may be defined through the pixel definition layer PDL. The pixel definition layer PDL may be referred to as a first portion having a first thickness t1 in the pattern insulating layer P_PLa. The main spacer layer M_SPC may be referred to as a second portion having a second thickness t2 greater than the first thickness t1 in the pattern insulating layer P_PLa.

A pattern mask P_MSa may be located on the first preliminary insulating layer P_IL1 to form the pattern insulating layer P_PLa. The pattern mask P_MSa may include an open pattern portion O_MP, a half pattern portion P_MP, and a light blocking pattern portion B_MP. The open pattern portion O_MP may be located at positions respectively corresponding to the red opening R_OP1 and the first light receiving opening O_OP1, and the half pattern portion P_MP may be located at a position that overlaps the first portion and does not overlap the second portion. The light blocking pattern portion B_MP may be located at a position overlapping the second portion.

Then, when the first preliminary insulating layer P_IL1 is patterned by a photolithography process using the pattern mask P_MS, the pattern insulating layer P_PLa may be formed. The red opening R_OP1 and the first light receiving opening O_OP1 may be formed to correspond to the open pattern portion O_MP, and the pixel definition layer PDL having the first thickness t1 may be formed to correspond to the half pattern portion P_MP. The pixel definition layer having the first thickness t1 and the main spacer layer M_SPC having the second thickness t2 may be formed to correspond to the light blocking pattern portion B_MP.

Figure 16C:
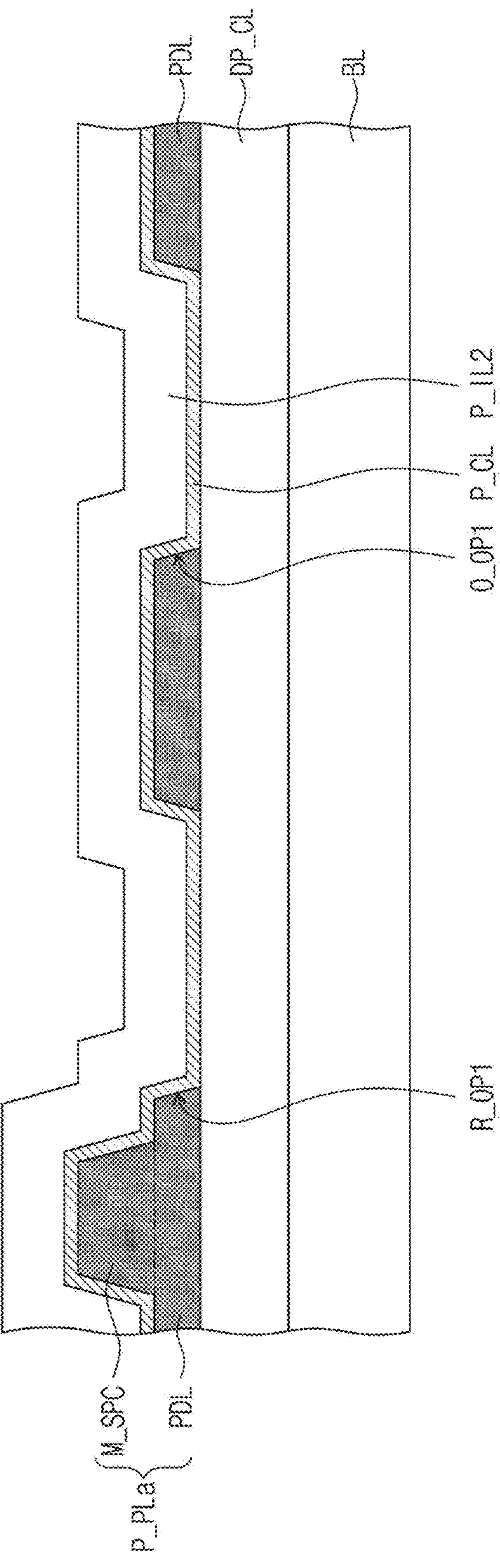

Referring to FIG. 16C, a preliminary conductive layer P_CL and a second preliminary insulating layer P_IL2 may be sequentially formed on the pattern insulating layer P_PLa. The preliminary conductive layer P_CL may include one of the metal material and a transparent conductive material. The second preliminary insulating layer P_IL2 may include the same material as that of the first preliminary insulating layer P_IL1, however, the present disclosure should not be limited thereto or thereby. As an example, the first preliminary insulating layer P_IL1 may further include a black material in addition to the organic insulating material, and the second preliminary insulating layer P_IL2 may not include the black material.

Figure 16D:
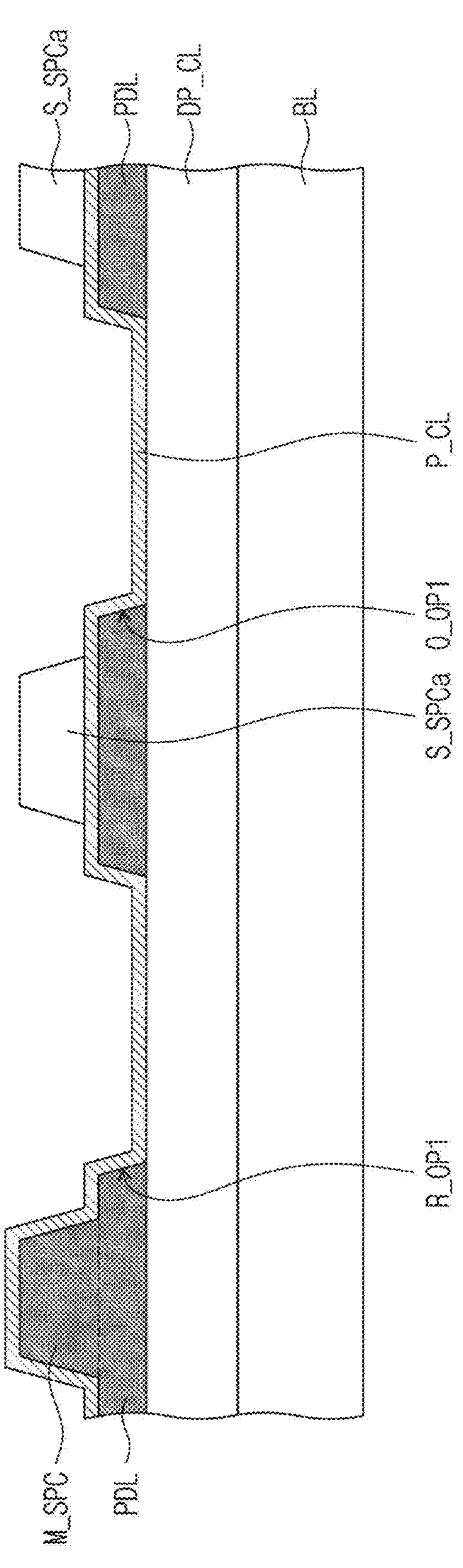

Then, the second preliminary insulating layer P_IL2 may be patterned, and thus, the disconnected spacer layer S_SPCa may be formed on the preliminary conductive layer P_CL as shown in FIG. 16D. The disconnected spacer layer S_SPCa may be arranged around the first light receiving opening O_OP1.

Figure 16E:
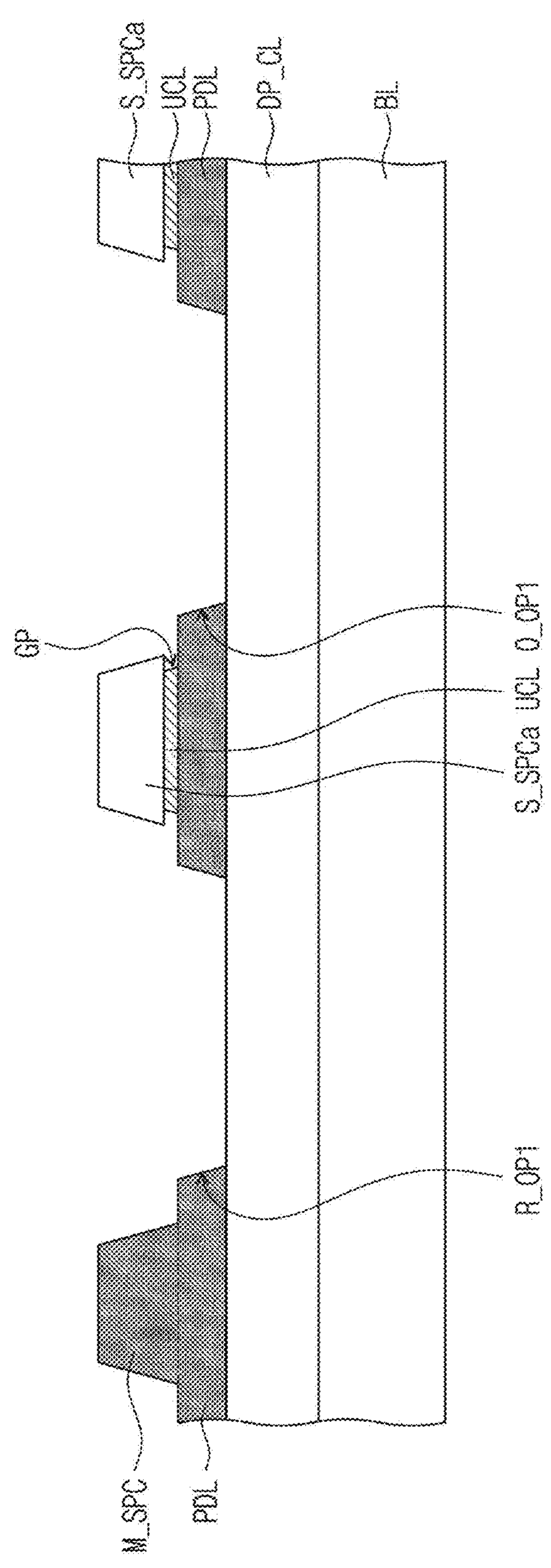
Figure 16F:
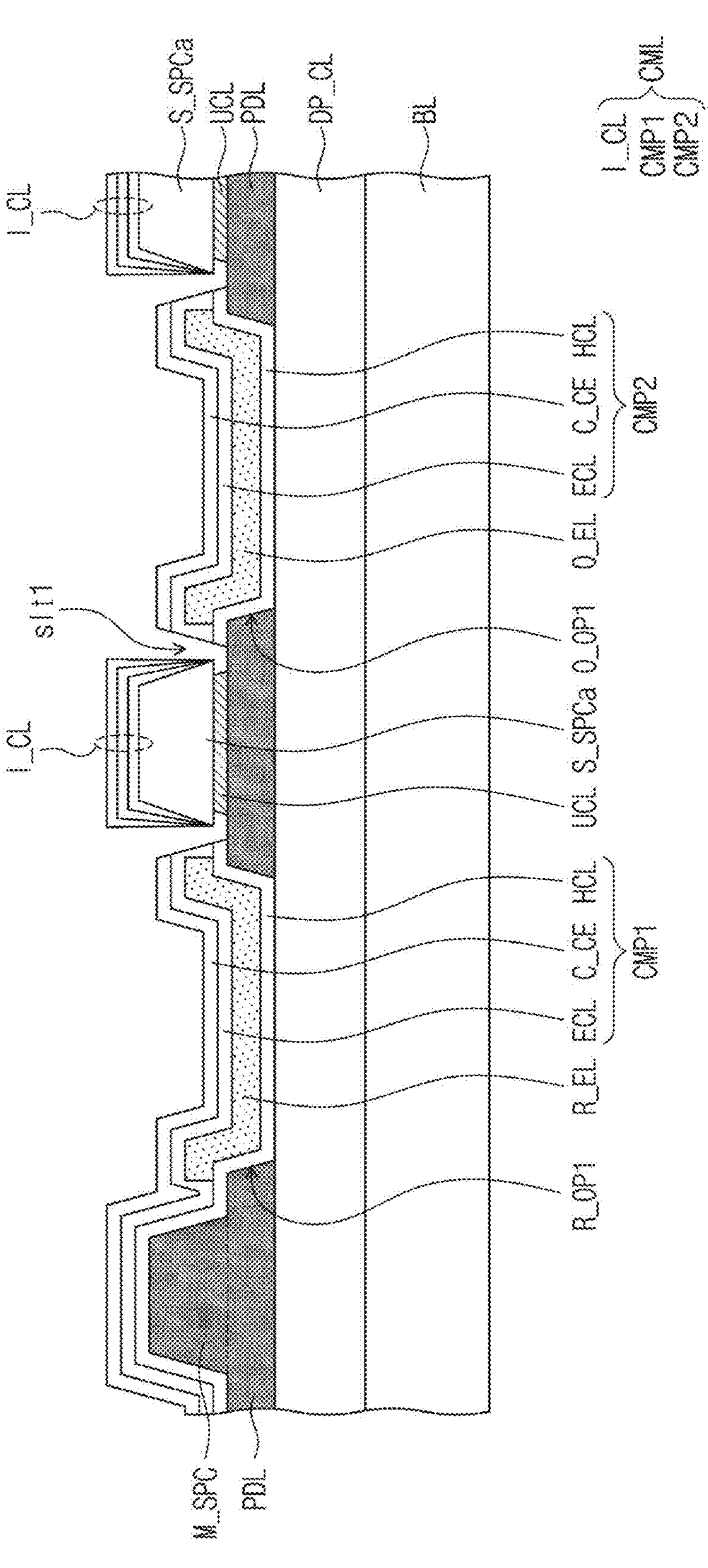

Then, when the preliminary conductive layer P_CL is etched using the disconnected spacer layer S_SPCa as a mask, the undercut layer UCL may be formed under the disconnected spacer layer S_SPCa as shown in FIG. 16E. The process of etching the preliminary conductive layer P_CL may be a wet etching process. The edge of the undercut layer UCL may be located inside the edge of the disconnected spacer layer S_SPCa. Accordingly, the gap GP may be defined between the disconnected spacer layer S_SPCa and the pixel definition layer PDL to surround the undercut layer UCL.

The common layer CML may be formed on the pixel definition layer PDL, the main spacer layer M_SPC, and the disconnected spacer layer S_SPCa. The common layer CML may be partially disconnected by the disconnected spacer layer S_SPCa and the undercut layer UCL and may be divided into two portions, i.e., the first common portion CMP1 commonly arranged on the light emitting elements R_ED, G1_ED, G2_ED, and B_ED (refer to FIG. 4A) and the second common portions CMP2 arranged to respectively correspond to the light receiving elements OPD1 and OPD2 (refer to FIG. 4A). Each of the first and second common portions CMP1 and CMP2 may include the common cathode electrode C_CE, the hole control layer HCL, and the electron control layer ECL. The island portion I_CL electrically insulated from the first and second common portions CMP1 and CMP2 may be located on the disconnected spacer layer S_SPCa. The first and second common portions CMP1 and CMP2 may be electrically connected to each other via the first to fourth connection portions BP1 to BP4 (refer to FIG. 6D). Descriptions of the common layer CML are the same as those described with reference to FIGS. 6A to 14B, and thus, details thereof will be omitted.

As described above, as the disconnected spacer layers S_SPC and S_SPCa are formed on the pixel definition layer PDL adjacent to the first and second light receiving elements OPD1 and OPD2, the common layer CML may be partially disconnected around the first and second light receiving elements OPD1 and OPD2. Accordingly, even though the first and second light receiving elements OPD1 and OPD2 may be electrically connected to the light emitting elements R_ED, G1_ED, G2_ED, and B_ED via the common layer CML, the current charged in the first and second light receiving elements OPD1 and OPD2 may be prevented from leaking through the common layer CML or may be reduced.

As the leakage current is blocked by partially disconnecting the common layer CML using the disconnected spacer layers S_SPC and S_SPCa, the electric potential of the first sensing node SN1 (refer to FIG. 5A) may be stably maintained, and thus, the sensing performance of the sensor FX may be improved.

Although aspects of some embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims, and their equivalents.

What is claimed is:

1. A display device comprising:
- a base layer;
- a circuit layer on the base layer; and
- an element layer on the circuit layer and comprising light-emitting elements and light-receiving elements, the element layer comprising:
- a pixel definition layer having light-emitting opening defined therethrough to correspond to the light-emitting elements and a light-receiving opening defined therethrough to correspond to the light-receiving elements;
- a disconnected spacer layer adjacent to the light-receiving opening on the pixel definition layer, and comprising disconnected spacers spaced apart from each other and at least partially surrounding the light-receiving opening in plan view; and
- a common layer commonly in the light-emitting elements and the light-receiving elements and partially disconnected around the light-receiving elements due to the disconnected spacers and not disconnected in an area between the disconnected spacers.

2. The display device of claim 1, wherein the common layer comprises a common cathode electrode commonly connected to the light-emitting elements and the light-receiving elements, and partially disconnected due to the disconnected spacer layer around the light-receiving elements.

3. The display device of claim 2, wherein the common layer further comprises a hole control layer and an electron control layer, which are between the pixel definition layer and the common cathode electrode.

4. The display device of claim 1, wherein the light-emitting elements comprise red light-emitting elements, green light-emitting elements, and blue light-emitting elements, each of the light-receiving elements being between two green light-emitting elements adjacent to each other in a first direction and between one red light-emitting element and one blue light-emitting element that is adjacent to one red light-emitting element in a second direction perpendicular to the first direction.

5. The display device of claim 4, wherein the disconnected spacer layer comprises:

a first disconnected spacer between a first side of each one of the light-receiving elements and one of the two green light-emitting elements; and a second disconnected spacer between a second side of the one of the light-receiving elements and another of the two green light-emitting elements, and wherein the first disconnected spacer is spaced apart from the second disconnected spacer in the first direction.

6. The display device of claim 5, wherein the common layer comprises a connection portion that electrically connects first common portions respectively corresponding to the light-emitting elements to second common portions respectively corresponding to the light-receiving elements, and wherein the connection portion comprises:

a first connection portion adjacent to one of the red light-emitting elements and between the first and second disconnected spacers; and a second connection portion adjacent to one of the blue light-emitting elements and between the first and second disconnected spacers.

7. The display device of claim 4, wherein the disconnected spacer layer comprises:

a first disconnected spacer between a first side of one of the light-receiving elements and the one of the red light-emitting elements; and a second disconnected spacer between a second side of the one of the light-receiving elements and the one of the blue light emitting element light-emitting elements, and wherein the first disconnected spacer is spaced apart from the second disconnected spacer in the second direction.

8. The display device of claim 7, wherein the common layer comprises a connection portion that electrically connects first common portions respectively corresponding to the light-emitting elements to second common portions respectively corresponding to the light-receiving elements, and wherein the connection portion comprises:

a first connection portion adjacent to one of the two green light-emitting elements and between the first and second disconnected spacers; and a second connection portion adjacent to the other of the two green light-emitting elements and between the first and second disconnected spacers.

9. The display device of claim 1, wherein the element layer further comprises an undercut layer between the pixel definition layer and the disconnected spacer layer, and having an edge inside an edge of the disconnected spacer layer such that a gap is defined between the disconnected spacer layer and the pixel definition layer to surround the undercut layer.

10. The display device of claim 9, wherein the undercut layer comprises a metal material or a transparent conductive material.

11. The display device of claim 1, wherein the element layer further comprises a main spacer layer on the pixel definition layer and spaced apart from the disconnected spacer layer.

12. The display device of claim 11, wherein the disconnected spacer layer has a height that is greater than a height of the main spacer layer.

13. The display device of claim 12, wherein the common layer is partially disconnected by the disconnected spacer layer without being disconnected by the main spacer layer.

14. The display device of claim 1, wherein the disconnected spacer layer is integral with the pixel definition layer.

15. A display device comprising:

a base layer;

a circuit layer on the base layer; and an element layer on the circuit layer and comprising light-emitting elements and light-receiving elements, the element layer comprising:

a pixel definition layer defining a light-emitting opening defined therethrough to correspond to the light-emitting elements, and a light-receiving opening defined therethrough to correspond to the light-receiving elements;

a disconnected spacer layer adjacent to the light-receiving opening on the pixel definition layer; and a common layer commonly in the light-emitting elements and the light-receiving elements, and partially disconnected around the light-receiving elements due to the disconnected spacer layer, wherein the pixel definition layer comprises:

sub-sidewalls defining the light-receiving opening; and corner portions defined by two sub-sidewalls connected to each other and adjacent to each other among the sub-sidewalls, and wherein the disconnected spacer layer comprises disconnected spacers respectively adjacent to the sub-sidewalls.

16. The display device of claim 15, wherein the disconnected spacers are spaced apart from each other in an area adjacent to the corner portions, and wherein the common layer comprises connection portions between the disconnected spacers and electrically connecting a first common portion corresponding to the light-emitting elements to second common portions respectively corresponding to the light-receiving elements.

17. The display device of claim 15, wherein the light-receiving opening has a quadrangular shape, wherein the sub-sidewalls comprise first, second, third, and fourth sub-sidewalls, and wherein the disconnected spacer layer comprises first, second, third, and fourth disconnected spacers respectively adjacent to the first, second, third, and fourth sub-sidewalls.

18. The display device of claim 17, wherein the pixel definition layer further comprises main sidewalls defining the light-emitting opening, and wherein lengths of the sub-sidewalls are different from lengths of the main sidewalls.

19. The display device of claim 18, wherein the first, second, third, and fourth disconnected spacers comprise:

a first disconnected sidewall adjacent to the sub-sidewalls; and a second disconnected sidewall adjacent to the main sidewalls, and wherein the first disconnected sidewall has a length that is different from a length of the second disconnected sidewall.

20. The display device of claim 18, wherein the first, second, third, and fourth disconnected spacers comprise a trapezoidal shape in a plan view.

21. The display device of claim 15, wherein the light-receiving opening has a quadrangular shape, wherein the sub-sidewalls comprise first, second, third, and fourth sub-sidewalls, and wherein the disconnected spacer layer comprises:

a first disconnected spacer adjacent to the first and second sub-sidewalls connected to each other via a first corner portion; and a second disconnected spacer adjacent to the third and fourth sub-sidewalls connected to each other via a second corner portion.

22. The display device of claim 21, wherein the first disconnected spacer and the second disconnected spacer are spaced apart from each other.

23. The display device of claim 22, wherein the common layer comprises a connection portion that electrically connects first common portions respectively corresponding to the light-emitting elements to second common portions respectively corresponding to the light-receiving elements, and wherein the connection portion comprises:

a first connection portion adjacent to a third corner portion where the first and fourth sub-sidewalls are connected to each other and between the first and second disconnected spacers; and a second connection portion adjacent to a fourth corner portion where the second and third sub-sidewalls are connected to each other and between the first and second disconnected spacers.

24. A display device comprising:

a base layer;

a circuit layer on the base layer; and an element layer on the circuit layer and comprising light-emitting elements and light-receiving elements, the element layer comprising:

a pixel definition layer defining a light-emitting opening defined therethrough to correspond to the light-emitting elements, and a light-receiving opening defined therethrough to correspond to the light-receiving elements;

a disconnected spacer layer adjacent to the light-receiving opening on the pixel definition layer; and a common layer commonly in the light-emitting elements and the light-receiving elements, and partially disconnected around the light-receiving elements due to the disconnected spacer layer, wherein the disconnected spacer layer comprises a disconnected spacer adjacent to the light-receiving elements, wherein the common layer comprises a connection portion that electrically connects first common portions respectively corresponding to the light-emitting elements to second common portions respectively corresponding to the light-receiving elements, wherein one end and another end of the disconnected spacer are spaced apart from each other by a predetermined distance and face each other, and wherein the connection portion is at the one end and the other end of the disconnected spacer.

* * * * *